United States Patent
Zhao et al.

(10) Patent No.: US 12,176,343 B2
(45) Date of Patent: *Dec. 24, 2024

(54) NITRIDE-BASED SEMICONDUCTOR BIDIRECTIONAL SWITCHING DEVICE AND METHOD FOR MANUFACTURING THE SAME

(71) Applicant: INNOSCIENCE (SUZHOU) TECHNOLOGY CO., LTD., Suzhou (CN)

(72) Inventors: Qiyue Zhao, Suzhou (CN); Chunhua Zhou, Suzhou (CN); Maolin Li, Suzhou (CN); Wuhao Gao, Suzhou (CN); Chao Yang, Suzhou (CN); Guanshen Yang, Suzhou (CN); Shaopeng Cheng, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 145 days.

This patent is subject to a terminal disclaimer.

(21) Appl. No.: 17/560,175

(22) Filed: Dec. 22, 2021

(65) Prior Publication Data

US 2022/0384425 A1    Dec. 1, 2022

Related U.S. Application Data

(63) Continuation of application No. 17/436,073, filed as application No. PCT/CN2021/095865 on May 25, 2021.

(51) Int. Cl.
*H01L 27/06* (2006.01)
*H01L 21/768* (2006.01)
(Continued)

(52) U.S. Cl.
CPC .... *H01L 27/0605* (2013.01); *H01L 21/76898* (2013.01); *H01L 21/8252* (2013.01);
(Continued)

(58) Field of Classification Search
CPC ........... H01L 29/7786; H01L 29/66462; H01L 29/205; H01L 29/2003; H01L 27/0629;
(Continued)

(56) References Cited

U.S. PATENT DOCUMENTS 8,295,784 B2    10/2012    Seshita
9,356,017 B1    5/2016    Siemieniec et al.
(Continued)

FOREIGN PATENT DOCUMENTS

CN    101258600 A    9/2008
CN    102612753 A    7/2012
(Continued)

OTHER PUBLICATIONS

First Office Action of corresponding Taiwan patent application No. 111104170 mailed on Sep. 2, 2022.
(Continued)

*Primary Examiner* — Rafael O Leon De Domenech
(74) *Attorney, Agent, or Firm* — McCoy Russell LLP

(57) ABSTRACT

The present disclosure provides a nitride-based bidirectional switching device with substrate potential management capability. The device has a control node, a first power/load node, a second power/load node and a main substrate, and comprises: a nitride-based bilateral transistor and a substrate potential management circuit configured for managing a potential of the main substrate. By implementing the substrate potential management circuit, the substrate potential can be stabilized to a lower one of the potentials of the first source/drain and the second source/drain of the bilateral transistor no matter in which directions the bidirectional (Continued)

switching device is operated. Therefore, the bilateral transistor can be operated with a stable substrate potential for conducting current in both directions.

20 Claims, 54 Drawing Sheets

(51) Int. Cl.

| | |
|---|---|
| *H01L 21/8252* | (2006.01) |
| *H01L 23/48* | (2006.01) |
| *H01L 23/528* | (2006.01) |
| *H01L 27/02* | (2006.01) |
| *H01L 29/20* | (2006.01) |
| *H01L 29/205* | (2006.01) |
| *H01L 29/66* | (2006.01) |
| *H01L 29/778* | (2006.01) |
| *H02M 7/155* | (2006.01) |
| *H03K 17/687* | (2006.01) |
| *H02M 1/00* | (2006.01) |

(52) U.S. Cl.
CPC ........ *H01L 23/481* (2013.01); *H01L 23/5286* (2013.01); *H01L 27/0222* (2013.01); *H01L 27/0629* (2013.01); *H01L 29/2003* (2013.01); *H01L 29/205* (2013.01); *H01L 29/66462* (2013.01); *H01L 29/7786* (2013.01); *H02M 7/155* (2013.01); *H03K 17/6871* (2013.01); *H02M 1/0054* (2021.05)

(58) Field of Classification Search
CPC ............. H01L 27/0222; H01L 23/5286; H01L 23/481; H01L 21/8252; H01L 21/76898; H01L 27/0605; H02M 7/155; H02M 1/0054; H03K 17/6871
See application file for complete search history.

(56) References Cited

U.S. PATENT DOCUMENTS

| | | | |
|---|---|---|---|
| 10,833,159 | B1 | 11/2020 | Hao et al. |
| 2008/0135905 | A1 | 6/2008 | Burr et al. |
| 2008/0143421 | A1 | 6/2008 | Yanagihara et al. |
| 2009/0014798 | A1* | 1/2009 | Zhu .................. H01L 21/84 |
| | | | 438/154 |
| 2009/0023415 | A1 | 1/2009 | Seshita |
| 2009/0159925 | A1 | 6/2009 | Machida |
| 2011/0215746 | A1* | 9/2011 | Ikoshi ................ H03K 3/021 |
| | | | 327/333 |
| 2011/0305054 | A1 | 12/2011 | Yamagiwa et al. |
| 2012/0217542 | A1* | 8/2012 | Morita ............... H01L 27/0705 |
| | | | 257/140 |
| 2014/0374766 | A1 | 12/2014 | Bahl et al. |
| 2015/0060873 | A1 | 3/2015 | Chiu et al. |
| 2015/0263100 | A1 | 9/2015 | Deboy |
| 2015/0318387 | A1 | 11/2015 | Chiu et al. |
| 2017/0103978 | A1 | 4/2017 | Prechtl et al. |
| 2017/0125562 | A1 | 5/2017 | Prechtl et al. |
| 2019/0006499 | A1* | 1/2019 | Kinoshita ............ H01L 29/778 |
| 2019/0326280 | A1 | 10/2019 | Imam et al. |
| 2019/0355844 | A1 | 11/2019 | Sheridan |
| 2020/0357907 | A1 | 11/2020 | Udrea et al. |
| 2021/0082911 | A1 | 3/2021 | Chiu et al. |
| 2021/0118988 | A1 | 4/2021 | Gan et al. |
| 2022/0375926 | A1 | 11/2022 | Liao et al. |
| 2022/0375927 | A1 | 11/2022 | Mao et al. |
| 2022/0384424 | A1* | 12/2022 | Zhao .................. H01L 29/7786 |
| 2022/0384425 | A1 | 12/2022 | Zhao et al. |
| 2022/0392925 | A1* | 12/2022 | Ishizu .................. H10B 12/00 |
| 2023/0100524 | A1* | 3/2023 | Ikeda ................ H01M 50/574 |
| | | | 429/7 |
| 2023/0369479 | A1 | 11/2023 | Zhao et al. |

FOREIGN PATENT DOCUMENTS

| | | |
|---|---|---|
| CN | 104241282 A | 12/2014 |
| CN | 105047707 A | 11/2015 |
| CN | 109427772 A | 3/2019 |
| CN | 110391224 A | 10/2019 |
| CN | 111883589 A | 11/2020 |
| CN | 112154542 A | 12/2020 |
| CN | 112640127 A | 4/2021 |
| CN | 112750898 A | 5/2021 |
| CN | 112771677 A | 5/2021 |
| CN | 112789732 A | 5/2021 |
| EP | 3343763 A1 | 7/2018 |
| EP | 3447917 A1 | 2/2019 |
| JP | 2000339047 A | 12/2000 |
| JP | 2008235625 A | 10/2008 |
| TW | 202004199 A | 1/2020 |
| TW | 202101717 A | 1/2021 |
| TW | 202312430 A | 3/2023 |
| TW | 202312431 A | 3/2023 |
| WO | 2020135770 A1 | 7/2020 |

OTHER PUBLICATIONS

First Office Action of corresponding Taiwan patent application No. 111104155 mailed on Oct. 6, 2022.
International Search Report and Written Opinion of the corresponding PCT application No. PCT/CN2021/095865 mailed on Feb. 23, 2022.
TW Patent Office, Office Action Issued in Application No. 111104140, Jun. 15, 2023, 13 pages. (Submitted with Partial Translation).
European Patent Office, Extended European Search Report Issued in Application No. 21859334.1, Jul. 5, 2023, Germany, 19 pages.
TW Patent Office, Office Action Issued in Application No. 111104165, Dec. 23, 2022, 7 pages. (Submitted with Machine Translation).
TW Patent Office, Office Action Issued in Application No. 111104140, Feb. 24, 2023, 7 pages. (Submitted with Machine Translation).
TW Patent Office, Office Action Issued in Application No. 111104159, Mar. 14, 2023, 7 pages. (Submitted with Machine Translation).
TW Patent Office, Office Action Issued in Application No. 111104153, Mar. 30, 2023, 14 pages. (Submitted with Machine Translation).
European Patent Office, Partial Supplementary European Search Report in Application No. 21859334.1, Apr. 14, 2023, Germany, 13 pages.
United States Patent and Trademark Office, Non-Final Office Action Issued in U.S. Appl. No. 17/558,615, filed Jan. 2, 2024, 49 pages.
United States Patent and Trademark Office, Non-Final Office Action Issued in Application No. 17/560,165, Jan. 2, 2024, 46 pages.

* cited by examiner

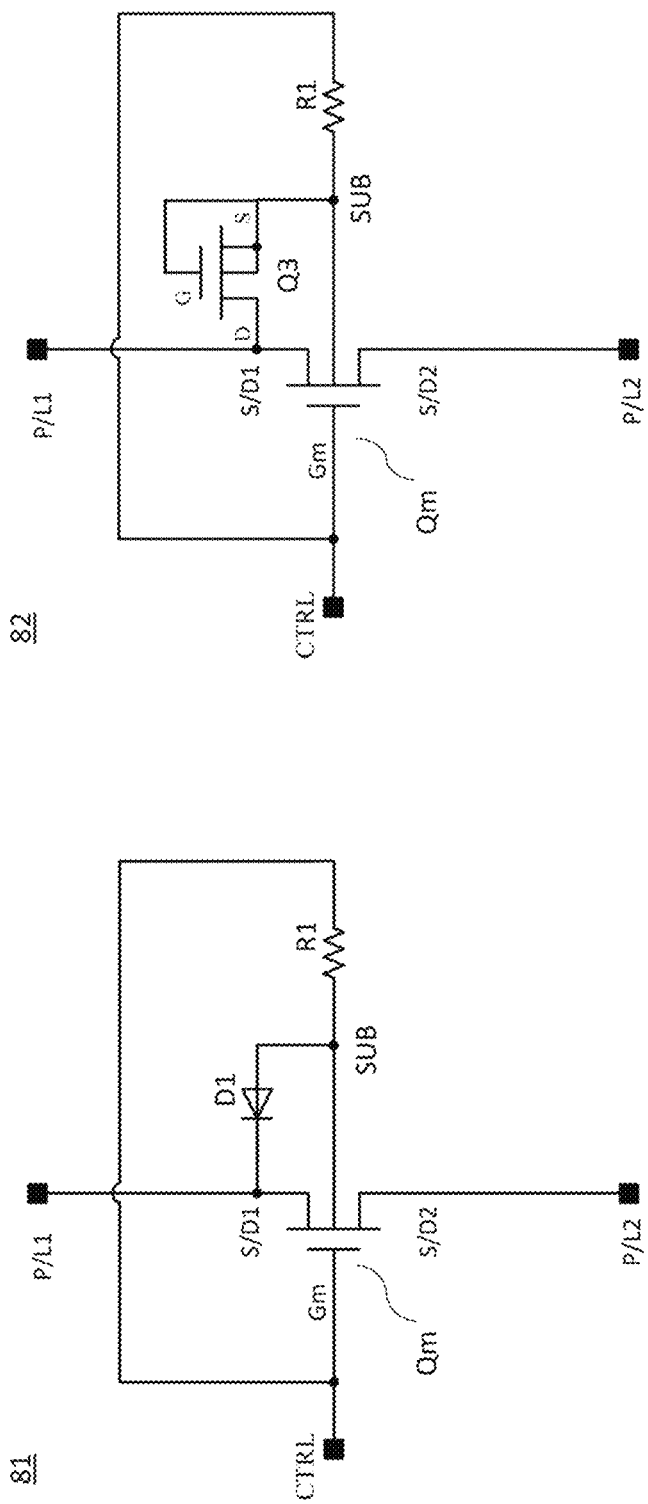

NITRIDE-BASED SEMICONDUCTOR BIDIRECTIONAL SWITCHING DEVICE AND METHOD FOR MANUFACTURING THE SAME

CROSS-REFERENCE TO RELATED APPLICATIONS

The present application is a continuation application of U.S. Non-Provisional patent application Ser. No. 17/436,073 filed Sep. 3, 2021, and the disclosure of which is incorporated herein by reference in its entirety.

FIELD OF THE INVENTION

The present invention generally relates to a nitride-based semiconductor bidirectional switching device. More specifically, the present invention relates to a nitride-based semiconductor bidirectional switching device with substrate potential management capability.

BACKGROUND OF THE INVENTION

GaN-based devices have been widely used for high frequency electrical energy conversion systems because of low power losses and fast switching transition. In comparison with silicon metal oxide semiconductor field effect transistor (MOSFET), GaN high-electron-mobility transistor (HEMT) has a much better figure of merit and more promising performance for high-power and high-frequency applications.

With proper gate structure design, a GaN HEMT device can be configured as equivalent to two transistors coupled in series in opposition directions such that it can be used for bilateral transistor Qm. In comparison with the conventional silicon-based configuration in which two Si-based transistors are required, GaN-based bilateral transistor Qm can have a simpler driving circuitry, lower power consumption and more compact size.

If the substrate of a GaN HEMT device is floated, the substrate will accumulate charges during the switching process of the device, which will affect the switching performance of the device and deteriorate the long-term reliability of the device. In a unidirectional GaN HEMT device, in order to avoid the impact of substrate floating on the performance and reliability of the device, it is generally necessary to keep the substrate and the source of the device at the same potential. In a bidirectional GaN HEMT device, since the source and drain of the device switch according to the working state of the circuit, it is impossible to directly electrically connect the substrate with the source or drain terminal. Therefore, for a bidirectional GaN HEMT device, it is necessary to independently control the substrate potential according to the working state of the device, so that the substrate potential of the device is always maintained at the lowest potential of the device. In low side applications, the lowest potential of the bidirectional device is the system ground, and the substrate potential of the bidirectional GaN HEMT device can be directly grounded. However, in high side applications, the lowest potential for bidirectional device applications may not be the system ground, so the substrate potential of a bidirectional GaN HEMT device should be controlled independently to be at the lowest potential of the device.

SUMMARY OF THE INVENTION

In accordance with one aspect of the present disclosure, a nitride-based bidirectional switching device with substrate potential management capability is provided. The device has a control node, a first power/load node, a second power/load node and a main substrate, and comprises: a nitride-based bilateral transistor and a substrate potential management circuit configured for managing a potential of the main substrate.

The bidirectional switching device may be operated in a first direction under a first operation mode where the first power/load node is biased at a voltage higher than a voltage applied to the second power/load node; and a second direction under a second operation mode where the first power/load node is biased at a voltage lower than a voltage applied to the second power/load node.

By implementing the substrate potential management circuit, the substrate potential Vsub is substantially equal to lower one of potentials of the first and second power/load nodes under both the first and second operation modes. Therefore, the potential of the main substrate can be stabilized to a lower one of the potentials of the first source/drain and the second source/drain of the bilateral transistor no matter in which directions the bidirectional switching device is operated. Therefore, the bilateral transistor can be operated with a stable substrate potential for conducting current in both directions.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 1 is a partial layout of the bidirectional switching device. FIGS. 2A-2D are cross-sectional views taken along lines A-A', B-B', C-C' and D-D' in FIG. 1 respectively.

FIGS. 5A and 5B depict circuit diagrams of a bidirectional switching device according to some embodiments based on the circuit block diagram of FIG. 4.

FIG. 7 is a partial layout of the bidirectional switching device. FIGS. 8A-8E are cross-sectional views taken along lines A-A', B-B', C-C', D-D' and E-E' in FIG. 7 respectively.

FIG. 9 is a partial layout of the bidirectional switching device. FIG. 10 is cross-section view taken along line E-E' in FIG. 9.

FIG. 11 is a partial layout of the bidirectional switching device. FIG. 12 is cross-section view taken along line E-E' in FIG. 11.

FIG. 13 is a partial layout of the bidirectional switching device. FIG. 14 is cross-section view taken along line E-E' in FIG. 13.

FIG. 15 is a partial layout of the bidirectional switching device. FIG. 16 is cross-section view taken along line E-E' in FIG. 15.

FIG. 17 is a partial layout of the bidirectional switching device. FIG. 18 is cross-section view taken along line E-E' in FIG. 17.

FIG. 21 is a partial layout of the bidirectional switching device. FIGS. 22A-22D are cross-sectional views taken along lines A-A', B-B', C-C' and D-D' in FIG. 21 respectively.

FIG. 23 is a partial layout of the bidirectional switching device. FIG. 24 is cross-section view taken along line D-D' in FIG. 23.

FIG. 25 is a partial layout of the bidirectional switching device. FIG. 26 is cross-section view taken along line D-D' in FIG. 25.

FIG. 27 is a partial layout of the bidirectional switching device. FIG. 28 is cross-section view taken along line D-D' in FIG. 27.

FIG. 29 is a partial layout of the bidirectional switching device. FIG. 30 is cross-section view taken along line D-D' in FIG. 29.

FIG. 31 is a partial layout of the bidirectional switching device. FIG. 32 is cross-section view taken along line D-D' in FIG. 31.

DETAILED DESCRIPTION

Figure 1:
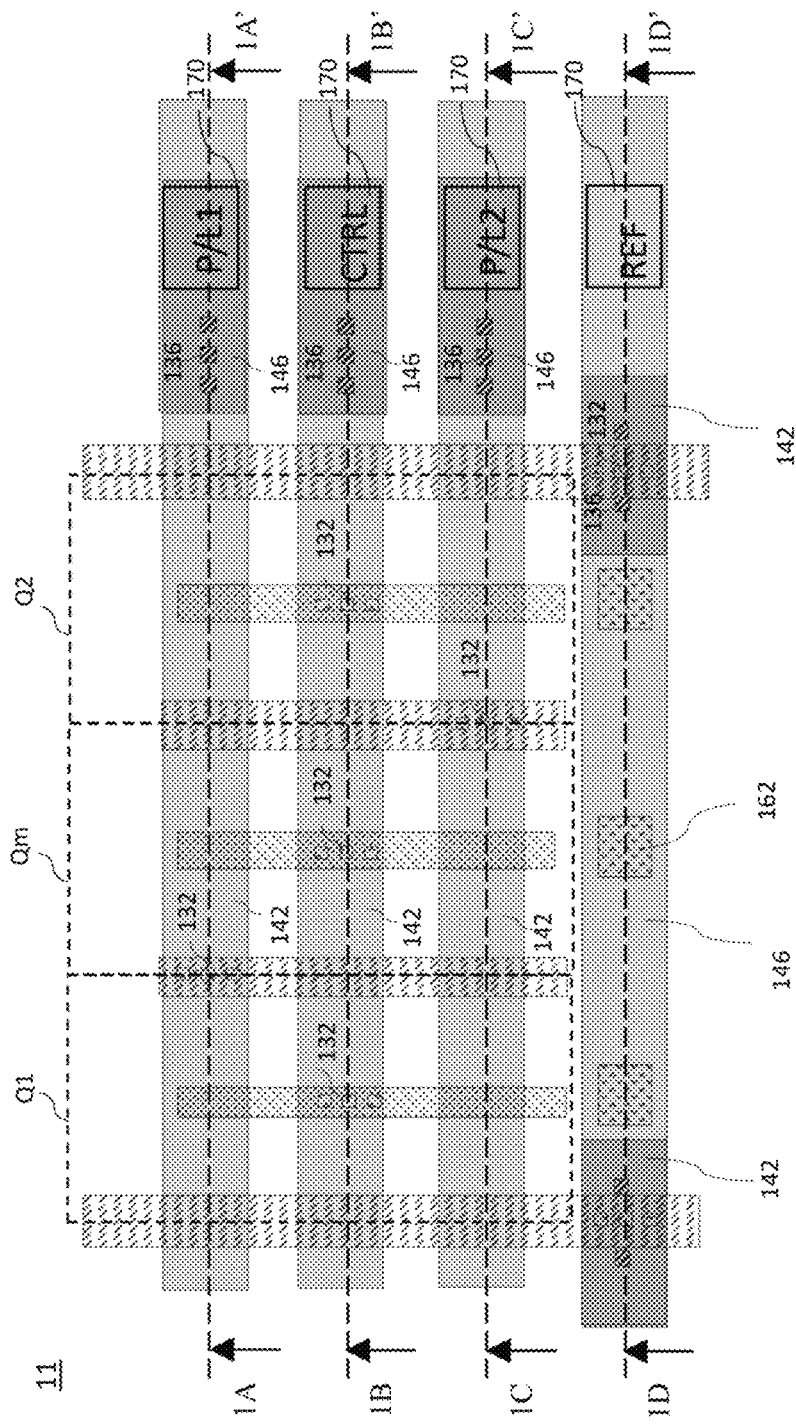
FIG. 1 and FIGS. 2A-2D illustrate structure of a bidirectional switching device according to some embodiments of the present invention.
Figure 2A:
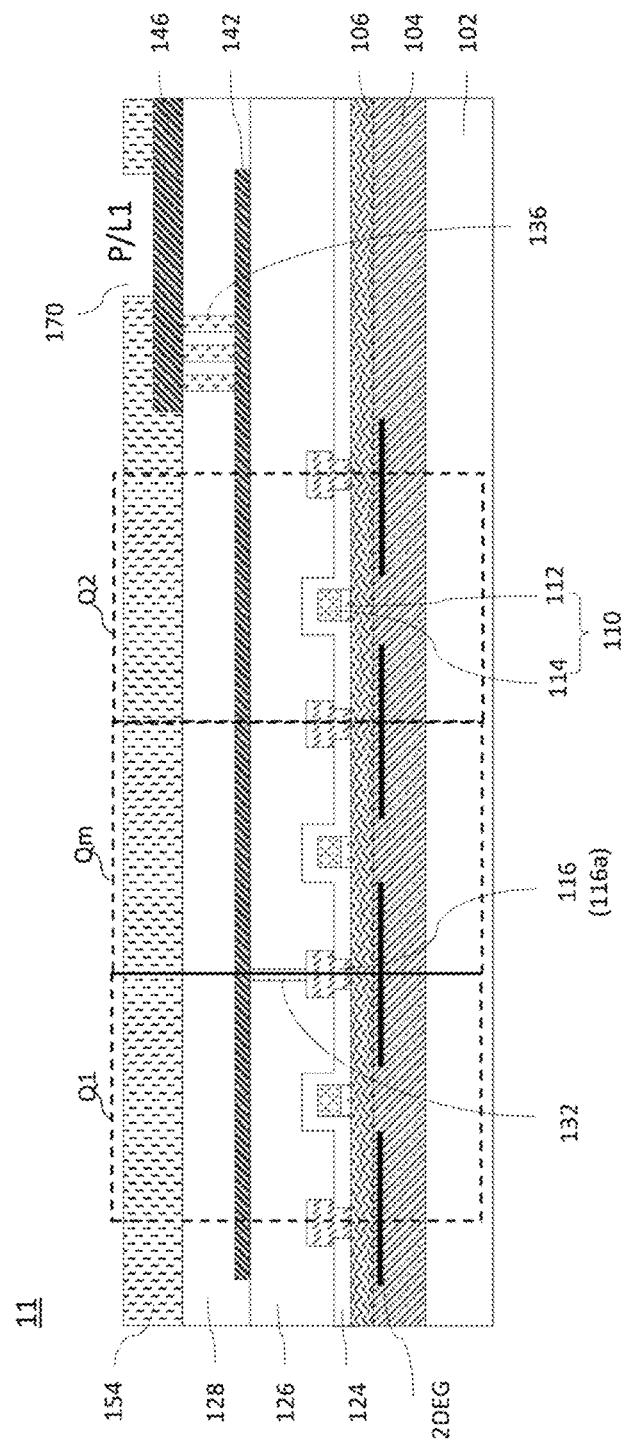
Figure 2B:
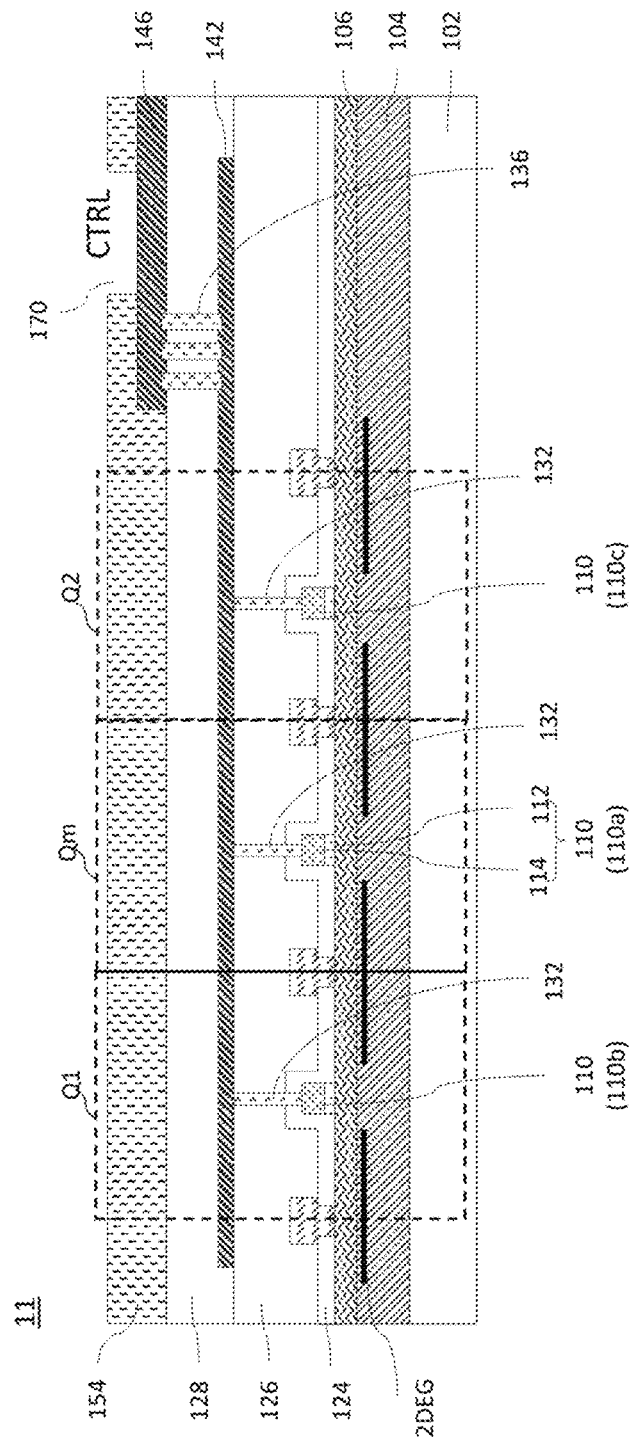
Figure 2C:
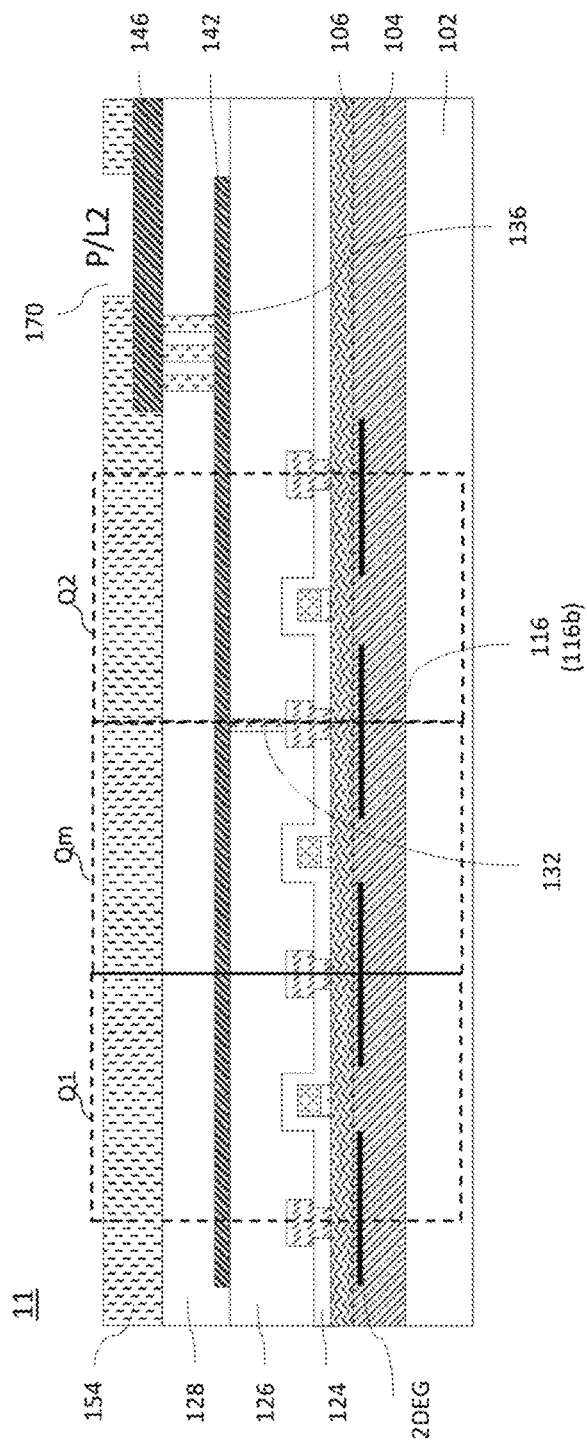
Figure 2D:
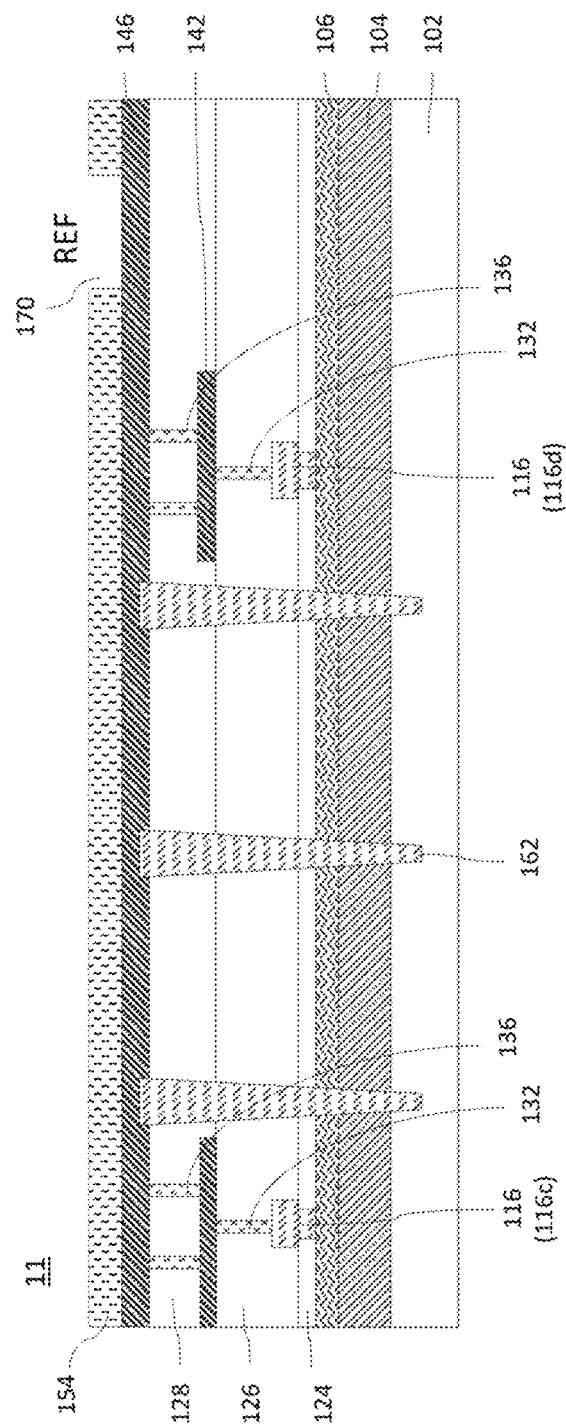

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIGS. 1 and 2A-2D illustrate structure of a bidirectional switching device 11 according to some embodiments of the present invention. FIG. 1 is a partial layout of the bidirectional switching device 11 showing a relationship among some elements that can constitute parts of transistors in the bidirectional switching device 11. FIGS. 2A-2D are cross-sectional views taken along lines A-A', B-B', C-C' and D-D' in FIG. 1 respectively. More structural details of the bidirectional switching device 11 are provided as follows.

Referring to FIGS. 1 and 2A-2D, the bidirectional switching device 11 may include a substrate 102, a first nitride-based semiconductor layer 104, a second nitride-based semiconductor layer 106, gate structures 110, S/D electrodes 116, a first passivation layer 124, a second passivation layer 126, a third passivation layer 128, one or more first conductive vias 132, one or more second conductive vias 136, one or more first conductive traces 142, one or more second conductive traces 146, a protection layer 154 and one or more through gallium vias (TGV) 162 and conductive pads 170.

The substrate 102 may be a semiconductor substrate. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable semiconductor materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof.

The nitride-based semiconductor layer 104 is disposed over the substrate 102. The exemplary materials of the nitride-based semiconductor layer 104 can include, for example but are not limited to, nitrides or group III-V compounds, such as GaN, AlN, InN, $InxAl_yGa_{(1-x-y)}N$ where $x+y\leq1$, $Al_yGa_{(1-y)}N$ where $y\leq1$. The exemplary structures of the nitride-based semiconductor layer 104 can include, for example but are not limited to, multilayered structure, superlattice structure and composition-gradient structures.

The nitride-based semiconductor layer 106 is disposed on the nitride-based semiconductor layer 104. The exemplary materials of the nitride-based semiconductor layer 106 can include, for example but are not limited to, nitrides or group III-V compounds, such as GaN, AlN, InN, $InxAl_yGa_{(1-x-y)}N$ where $x+y\leq1$, $Al_yGa_{(1-y)}N$ where $y\leq1$.

The exemplary materials of the nitride-based semiconductor layers 104 and 106 are selected such that the nitride-based semiconductor layer 106 has a bandgap (i.e., forbidden band width) greater than a bandgap of the nitride-based semiconductor layer 104, which causes electron affinities thereof different from each other and forms a heterojunction therebetween. For example, when the nitride-based semiconductor layer 104 is an undoped GaN layer having a bandgap of approximately 3.4 eV, the nitride-based semiconductor layer 106 can be selected as an AlGaN layer having bandgap of approximately 4.0 eV. As such, the nitride-based semiconductor layers 104 and 106 can serve as a channel layer and a barrier layer, respectively. A triangular well potential is generated at a bonded interface between the channel and barrier layers, so that electrons accumulate in the triangular well potential, thereby generating a two-dimensional electron gas (2DEG) region adjacent to the heterojunction. Accordingly, the bidirectional switching device is available to include one or more GaN-based high-electron-mobility transistors (HEMT).

In some embodiments, the bidirectional switching device 11 may further include a buffer layer, a nucleation layer, or a combination thereof (not illustrated). The buffer layer can be disposed between the substrate 102 and the nitride-based semiconductor layer 104. The buffer layer can be configured to reduce lattice and thermal mismatches between the substrate 102 and the nitride-based semiconductor layer 104, thereby curing defects due to the mismatches/difference. The buffer layer may include a III-V compound. The III-V compound can include, for example but are not limited to, aluminum, gallium, indium, nitrogen, or combinations thereof. Accordingly, the exemplary materials of the buffer layer can further include, for example but are not limited to, GaN, AlN, AlGaN, InAlGaN, or combinations thereof.

The nucleation layer may be formed between the substrate 102 and the buffer layer. The nucleation layer can be configured to provide a transition to accommodate a mismatch/difference between the substrate 102 and a III-nitride layer of the buffer layer. The exemplary material of the nucleation layer can include, for example but is not limited to AlN or any of its alloys.

The gate structures 110 are disposed on/over/above the second nitride-based semiconductor layer. Each of the gate structures 110 may include an optional gate semiconductor layer 112 and a gate metal layer 114. The gate semiconductor layer 112 and the gate metal layer 114 are stacked on the nitride-based semiconductor layer 106. The gate semiconductor layer 112 are between the nitride-based semiconductor layer 106 and the gate metal layer 114. The gate semiconductor layer 112 and the gate metal layer 144 may form a Schottky barrier. In some embodiments, the bidirectional switching device 11 may further include an optional dielectric layer (not illustrated) between the p-type doped III-V compound semiconductor layer 112 and the gate metal layer 114.

The nitride-based bilateral transistor Qm, the first substrate-coupling transistor Q1 and the second substrate-coupling transistor Q2 may be enhancement mode devices, which are in a normally-off state when their gate electrodes 114 are at approximately zero bias. Specifically, the gate semiconductor layer 112 may be a p-type doped III-V compound semiconductor layer. The p-type doped III-V compound semiconductor layer 112 may create at least one p-n junction with the nitride-based semiconductor layer 106 to deplete the 2DEG region, such that at least one zone of the 2DEG region corresponding to a position below the corresponding gate structure 110 has different characteristics (e.g., different electron concentrations) than the rest of the 2DEG region and thus is blocked. Due to such mechanism, the bidirectional switching device 11 has a normally-off characteristic. In other words, when no voltage is applied to the gate electrodes 114 or a voltage applied to the gate electrodes 114 is less than a threshold voltage (i.e., a minimum voltage required to form an inversion layer below the gate structures 110), the zone of the 2DEG region below the gate structures 110 is kept blocked, and thus no current flows therethrough. Moreover, by providing the p-type doped III-V compound semiconductor layers 112, gate leakage current is reduced and an increase in the threshold voltage during the off-state is achieved.

In some embodiments, the p-type doped III-V compound semiconductor layers 112 can be omitted, such that the bidirectional switching device 11 is a depletion-mode device, which means the transistors are in a normally-on state at zero gate-source voltage.

The exemplary materials of the p-type doped III-V compound semiconductor layers 112 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd, and Mg.

In some embodiments, the nitride-based semiconductor layer 104 includes undoped GaN and the nitride-based semiconductor layer 106 includes AlGaN, and the p-type doped III-V compound semiconductor layers 112 are p-type GaN layers which can bend the underlying band structure upwards and to deplete the corresponding zone of the 2DEG region, so as to place the bidirectional switching device 11 into an off-state condition.

In some embodiments, the gate electrodes 114 may include metals or metal compounds. The gate electrodes 114 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, Si, metal alloys or compounds thereof, or other metallic compounds. In some embodiments, the exemplary materials of the gate electrodes 114 may include, for example but are not limited to, nitrides, oxides, silicides, doped semiconductors, or combinations thereof.

In some embodiments, the optional dielectric layer can be formed by a single layer or more layers of dielectric materials. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, $HfZrO$, $Ta_2O_3$, $HfSiO_4$, $ZrO_2$, $ZrSiO_2$, etc), or combinations thereof.

The S/D electrodes 116 are disposed on the nitride-based semiconductor layer 106. The "S/D" electrode means each of the S/D electrodes 116 can serve as a source electrode or a drain electrode, depending on the device design. The S/D electrodes 116 can be located at two opposite sides of the corresponding gate structure 110 although other configurations may be used, particularly when plural source, drain, or gate electrodes are employed in the device. Each of the gate structure 110 can be arranged such that each of the gate structure 110 is located between the at least two of the S/D electrodes 116. The gate structures 110 and the S/D electrodes 116 can collectively act as at least one nitride-based/GaN-based HEMT with the 2DEG region.

In the exemplary illustration, the adjacent S/D electrodes 116 are symmetrical about the gate structure 110 therebetween. In some embodiments, the adjacent S/D electrodes 116 can be optionally asymmetrical about the gate structure 110 therebetween. That is, one of the S/D electrodes 116 may be closer to the gate structure 110 than another one of the S/D electrodes 116.

In some embodiments, the S/D electrodes 116 can include, for example but are not limited to, metals, alloys, doped semiconductor materials (such as doped crystalline silicon), compounds such as silicides and nitrides, other conductor materials, or combinations thereof. The exemplary materials of the S/D electrodes 116 can include, for example but are not limited to, Ti, AlSi, TiN, or combinations thereof. The S/D electrodes 116 may be a single layer, or plural layers of the same or different composition. In some embodiments, the S/D electrodes 116 may form ohmic contacts with the nitride-based semiconductor layer 106. The ohmic contact can be achieved by applying Ti, Al, or other suitable materials to the S/D electrodes 116. In some embodiments, each of the S/D electrodes 116 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The passivation layer 20 is disposed over the nitride-based semiconductor layer 106. The passivation layer 20 can be formed for a protection purpose or for enhancing the electrical properties of the device (e.g., by providing an electrically isolation effect between/among different layers/elements). The passivation layer 20 covers a top surface of the nitride-based semiconductor layer 106. The passivation layer 20 may cover the gate structures 110. The passivation layer 20 can at least cover opposite two sidewalls of the gate structures 110. The S/D electrodes 116 can penetrate/pass through the passivation layer 20 to contact the nitride-based semiconductor layer 106. The exemplary materials of the passivation layer 20 can include, for example but are not limited to, $SiN_x$, $SiO_x$, $Si_3N_4$, SiON, SiC, SiBN, SiCBN, oxides, nitrides, poly(2-ethyl-2-oxazoline) (PEOX), or combinations thereof. In some embodiments, the passivation layer 20 can be a multi-layered structure, such as a composite dielectric layer of $Al_2O_3$/SiN, $Al_2O_3$/$SiO_2$, AlN/SiN, AlN/$SiO_2$, or combinations thereof.

The passivation layer 126 is disposed above the passivation layer 20 and the S/D electrodes 116. The passivation layer 126 covers the passivation layer 20 and the S/D electrodes 116. The passivation layer 126 can serve as a planarization layer which has a level top surface to support other layers/elements. The exemplary materials of the passivation layer 126 can include, for example but are not limited to, $SiN_x$, $SiO_x$, $Si_3N_4$, SiON, SiC, SiBN, SiCBN, oxides, PEOX, or combinations thereof. In some embodiments, the passivation layer 126 is a multi-layered structure, such as a composite dielectric layer of $Al_2O_3$/SiN, $Al_2O_3$/$SiO_2$, AlN/SiN, AlN/$SiO_2$, or combinations thereof.

The conductive vias 132 are disposed within the passivation layer 126 and passivation layer 20. The conductive vias 132 penetrate the passivation layer 126 and passivation layer 20. The conductive vias 132 extend longitudinally to electrically couple with the gate structure 110 and the S/D electrodes 116, respectively. The upper surfaces of the conductive vias 132 are free from coverage of the passivation layer 126. The exemplary materials of the conductive vias 132 can include, for example but are not limited to, conductive materials, such as metals or alloys.

The conductive traces 142 are disposed on the passivation layer 126 and the conductive vias 132. The conductive traces 142 are in contact with the conductive vias 132. The conductive traces 142 may be formed by patterning a conductive layer disposed on the disposed on the passivation layer 126 and the conductive vias 132. The exemplary materials of the conductive traces 142 can include, for example but are not limited to, conductive materials. The conductive traces 142 may include a single film or multilayered film having Ag, Al, Cu, Mo, Ni, alloys thereof, oxides thereof, nitrides thereof, or combinations thereof.

The passivation layer 128 is disposed above the passivation layer 126 and the conductive traces 142. The passivation layer 128 covers the passivation layer 126 and the conductive traces 142. The passivation layer 128 can serve as a planarization layer which has a level top surface to support other layers/elements. The exemplary materials of the passivation layer 128 can include, for example but are not limited to, $SiN_x$, $SiO_x$, $Si_3N_4$, SiON, SiC, SiBN, SiCBN, oxides, PEOX, or combinations thereof. In some embodiments, the passivation layer 128 is a multi-layered structure, such as a composite dielectric layer of $Al_2O_3$/SiN, $Al_2O_3$/$SiO_2$, AlN/SiN, AlN/$SiO_2$, or combinations thereof.

The conductive vias 136 are disposed within the passivation layer 128. The conductive vias 136 penetrate the passivation layer 128. The conductive vias 136 extend longitudinally to electrically couple with the conductive traces 142. The upper surfaces of the conductive vias 136 are free from coverage of the passivation layer 136. The exemplary materials of the conductive vias 136 can include, for example, but are not limited to, conductive materials, such as metals or alloys.

The conductive traces 146 are disposed on the passivation layer 128 and the conductive vias 136. The conductive traces 146 are is in contact with the conductive vias 136. The conductive traces 146 are may be formed by patterning a conductive layer disposed on the passivation layer 128 and the conductive vias 136. The exemplary materials of the conductive layer 146 can include, for example but are not limited to, conductive materials. The conductive layer 146 may include a single film or multilayered film having Ag, Al, Cu, Mo, Ni, alloys thereof, oxides thereof, nitrides thereof, or combinations thereof.

The TGVs 162 are formed to extend longitudinally from the second conductive layer 146 and penetrate into the substrate 102. The upper surfaces of the TGVs 162 are free from coverage of the third passivation layer 128. In some embodiments, the TGVs 162 may be formed to extend longitudinally from the first conductive layer 142 and penetrate into the substrate 102. The upper surfaces of the TGVs 162 are free from coverage of the second passivation layer 126. The exemplary materials of the TGVs 162 can include, for example, but are not limited to, conductive materials, such as metals or alloys.

The protection layer 154 is disposed above the passivation layer 128 and the conductive layer 146. The protection layer 154 covers the passivation layer 128 and the conductive layer 146. The protection layer 154 can prevent the conductive layer 146 from oxidizing. Some portions of the conductive layer 146 can be exposed through openings in the protection layer 154 to form the conductive pads 170, which are configured to electrically connect to external elements (e.g., an external circuit).

The conductive pads 170 may include a control pad CTRL configured to act as the control node, a first power/load pad P/L1 configured to act as the first power/load node, a second power/load pad P/L2 configured to act as the second power/load node and a reference pad REF configured to act as the reference node.

Conductive traces 142 or 146, conductive vias 132 or 136, and TGVs 162 can be configured to electrically connect different layers/elements to form the nitride-based bilateral transistor Qm, the first substrate-coupling transistor Q1 and the second substrate-coupling transistor Q2.

Different stages of a method for manufacturing the bidirectional switching device 11 are shown in FIGS. 3A-3K and described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes. The process for forming the passivation layers serving as a planarization layer generally includes a chemical mechanical polish (CMP) process. The process for forming the conductive vias generally includes forming vias in a passivation layer and filling the vias with conductive materials. The process for forming the conductive traces generally includes photolithography, exposure and development, etching, other suitable processes, or combinations thereof.

Figure 3A:
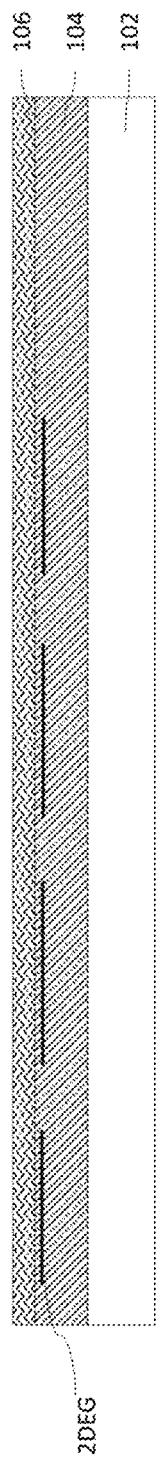
FIGS. 3A-3K illustrate different stages of a method for manufacturing a bidirectional switching device according to some embodiments of the present invention.

Referring to FIG. 3A, a substrate 102 is provided. Nitride-based semiconductor layers 104 and 106 can be formed over the substrate 102 in sequence by using the above-mentioned deposition techniques. A 2DEG region is formed adjacent to a heterojunction interface between the first nitride-based semiconductor layer 104 and the second nitride-based semiconductor layer 106.

Figure 3B:
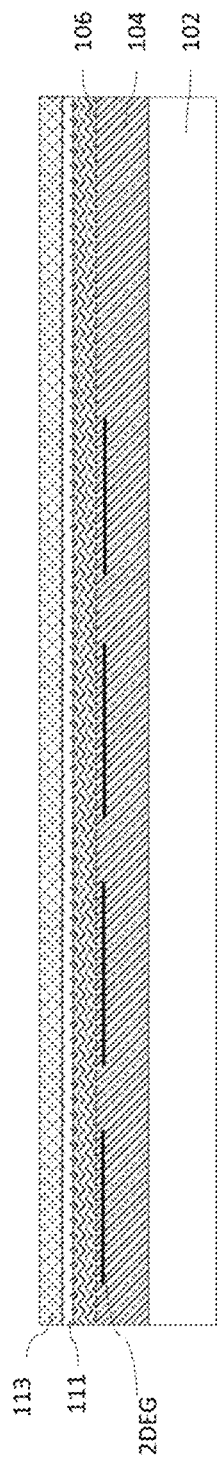

Referring to FIG. 3B, A blanket p-type doped III-V compound semiconductor layer 111 and a blanket gate electrode layer 113 can be formed above the nitride-based semiconductor layer 106 in sequence by using the above-mentioned deposition techniques.

Figure 3C:
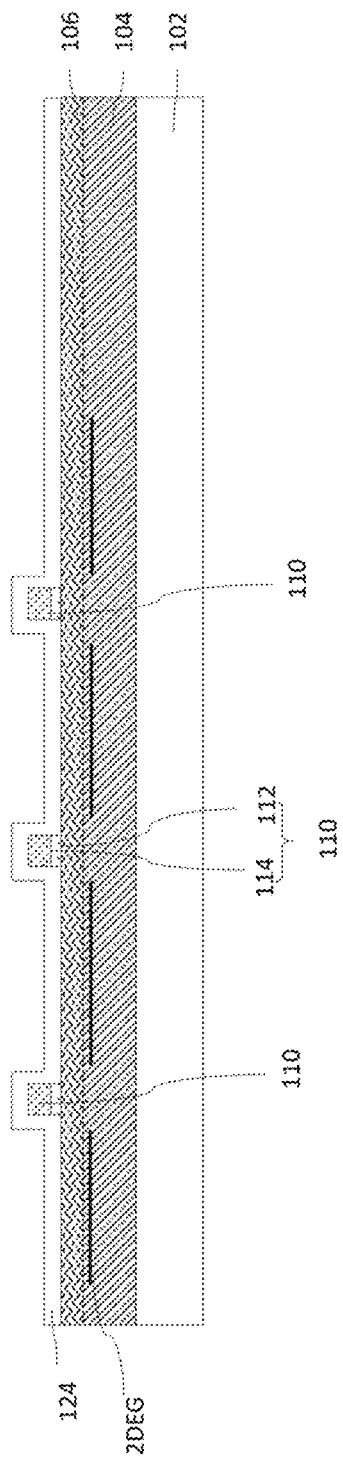

Referring to FIG. 3C, the blanket p-type doped III-V compound semiconductor layer 111 and the blanket gate electrode layer 113 are patterned to form a plurality of gate structures 110 over the nitride-based semiconductor layer 106. Each of the gate structures 110 includes a p-type doped III-V compound semiconductor layer 112 and a gate metal layer 114. A passivation layer 20 can then be formed to cover the of the gate structures 110 by using the above-mentioned deposition techniques.

Figure 3D:
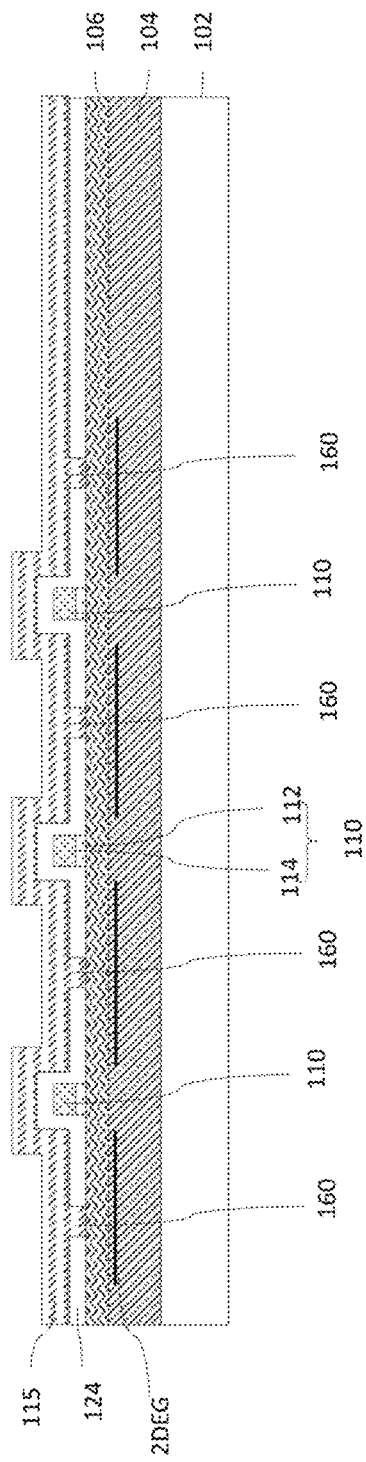

Referring to FIG. 3D, some S/D regions 160 are formed by removing some portions of the passivation layer 20. At least one portion of the nitride-based semiconductor layer 106 is exposed from the S/D regions 160. A blanket conductive layer 115 is formed to cover the nitride-based semiconductor layer 106 and the passivation layer 20, and fill the S/D regions 160, thereby contacting with the nitride-based semiconductor layer 106.

Figure 3E:
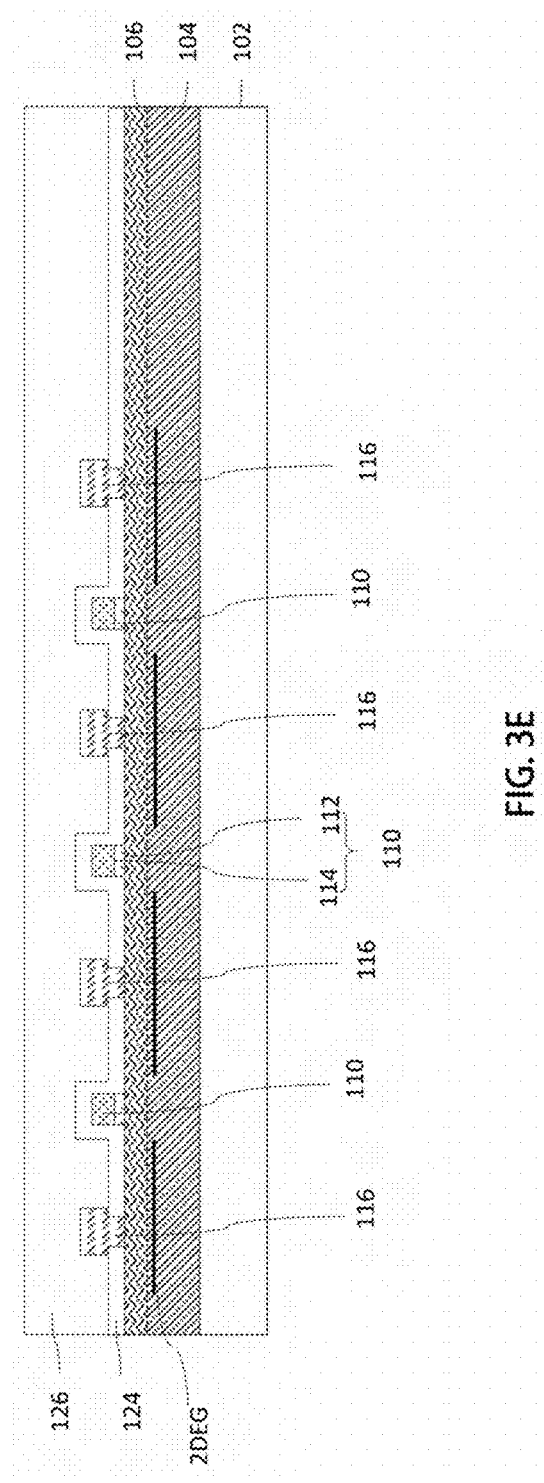

Referring to FIG. 3E, S/D electrodes 116 are formed by patterning the blanket conductive layer 115. Some portions of the blanket conductive layer 115 are removed, and rest of the blanket conductive layer 115 within the S/D regions 160 remains to serve as the S/D electrodes 116. A passivation layer 126 can then be formed on the passivation layer 20 to cover the S/D electrodes 116 by using the above-mentioned deposition techniques.

Figure 3F:
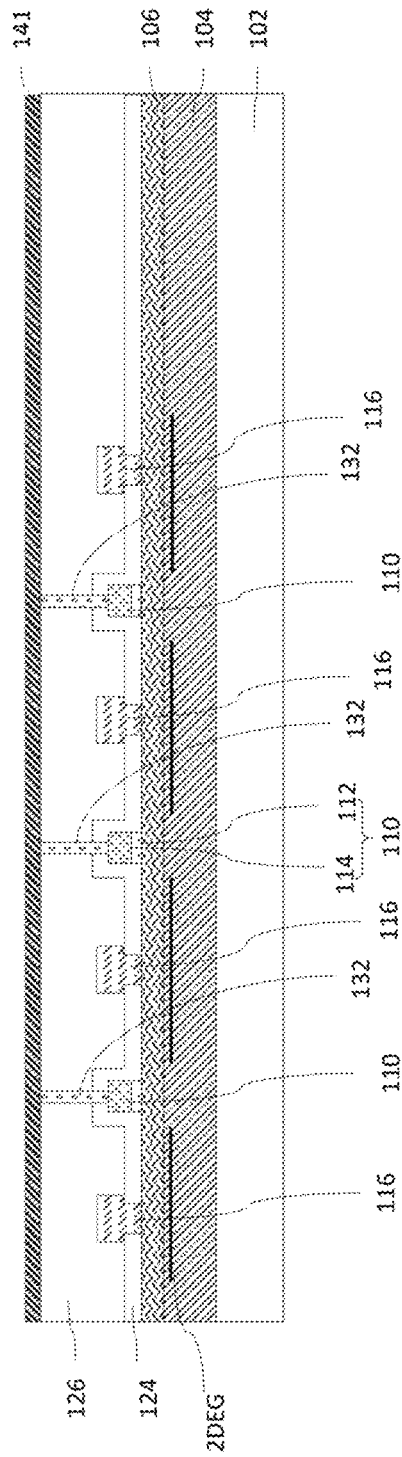

Referring to FIG. 3F, conductive vias 132 are formed to penetrate the passivation layers 126 and 20. A blanket conductive layer 141 is deposited on the passivation layer 126 by using the above-mentioned deposition techniques.

Figure 3G:
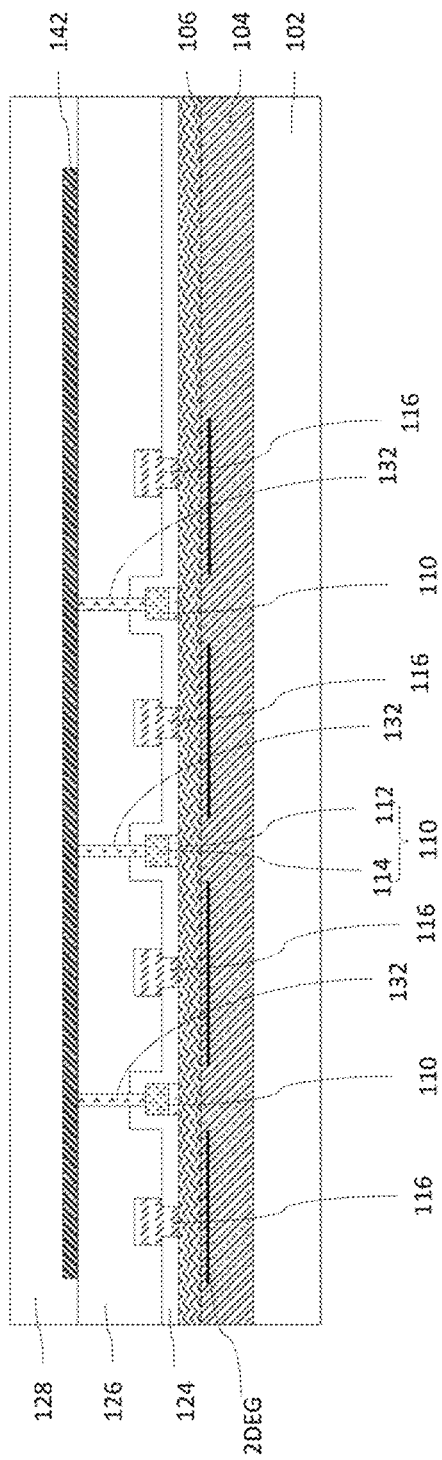

Referring to FIG. 3G, the blanket conductive layer 141 is patterned form conductive traces 142 over the passivation layer 126 and electrically coupled with the conductive vias 132. A passivation layer 128 can then be formed on the passivation layer 126 to cover the conductive traces 142 by using the above-mentioned deposition techniques.

Figure 3H:
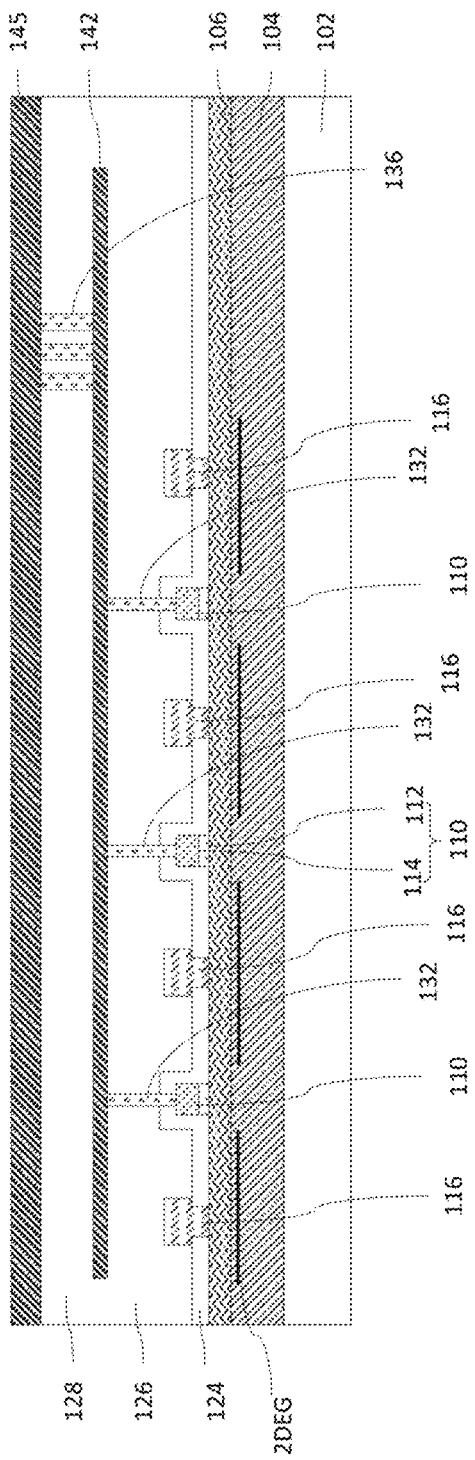

Referring to FIG. 3H, conductive vias 136 are formed in the passivation layer 128. A blanket conductive layer 145 is deposited on the passivation layer 128 by using the above-mentioned deposition techniques.

Figure 3I:
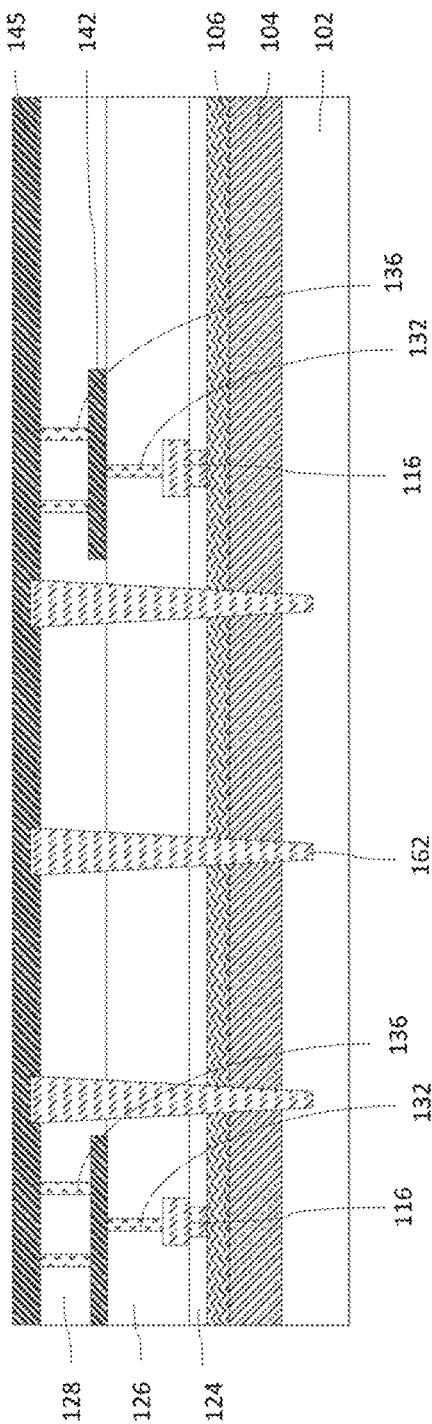

Referring to FIG. 3I, a plurality of TGV 162 may also be formed to extending from the passivation layer 128 and penetrating into the substrate before depositing the blanket conductive layer 145.

Figure 3J:
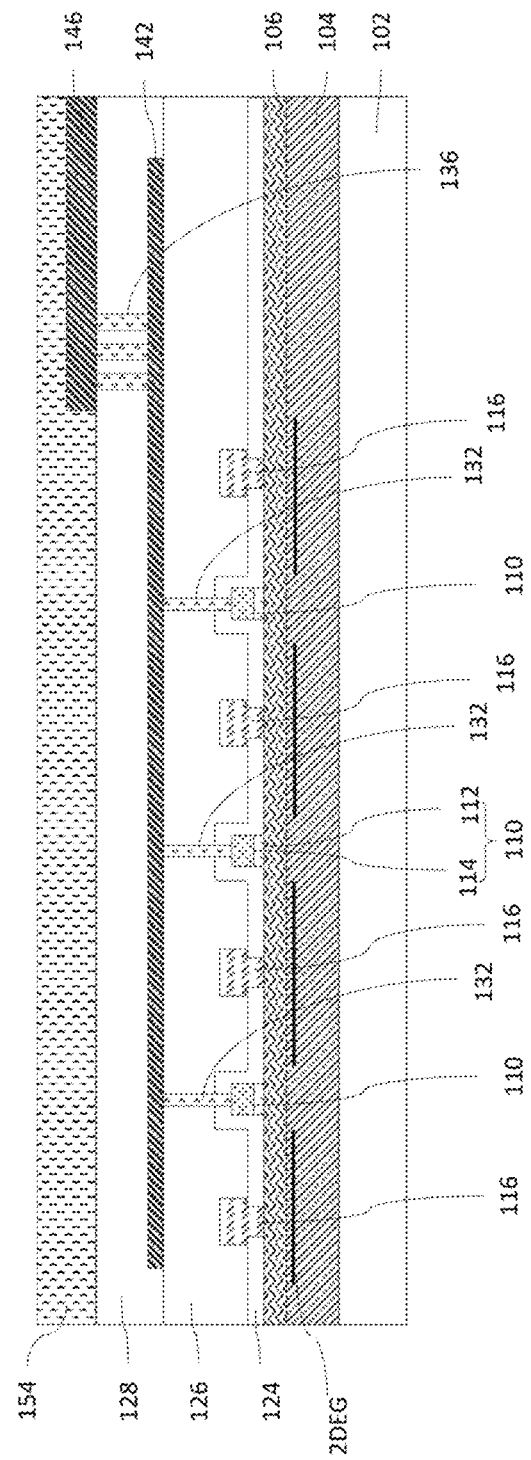

Referring to FIG. 3J, the blanket conductive layer 145 is patterned to form conductive traces 146 over the passivation layer 128 and electrically coupled with the conductive vias 136. A protection layer 154 can then be formed on the passivation layer 128 to cover the conductive traces 146 by using the above-mentioned deposition techniques.

Figure 3K:
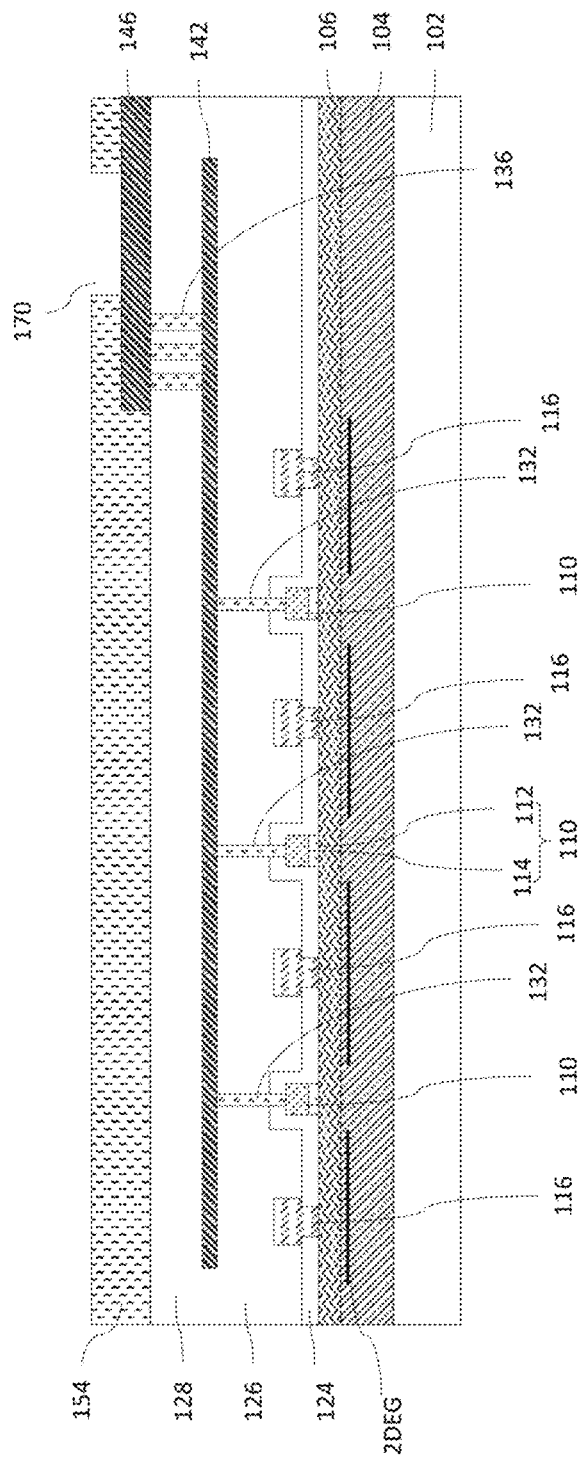

Referring to FIG. 3K. the protection layer 154 can then be patterned to form one or more openings to expose one or more conductive pads 170.

Figure 4:
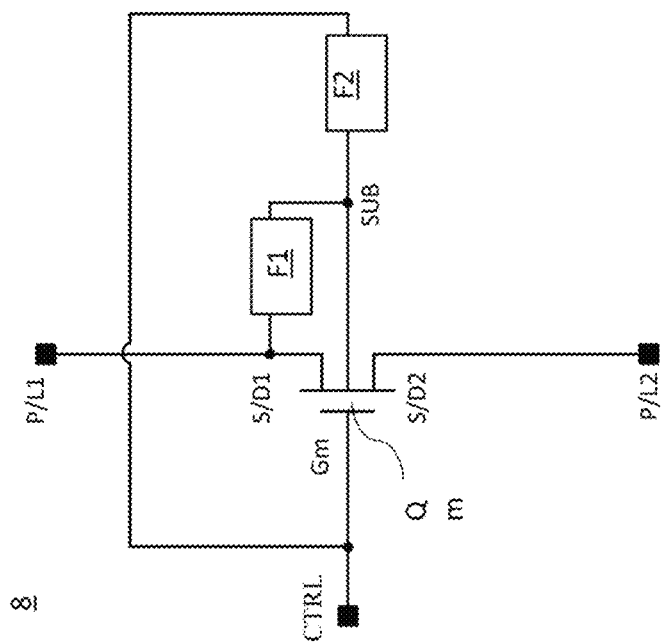
FIG. 4 is a circuit block diagram for a bidirectional switching device with substrate potential management capability according to some embodiments of the present invention.

FIG. 4 is a circuit block diagram for a bidirectional switching device 8 with substrate potential management capability according to some embodiments of the present invention.

As shown in FIG. 4, the bidirectional switching device 8 has a control node CTRL, a first power/load node P/L1 and a second power/load node P/2 and a main substrate.

The bidirectional switching device 8 comprises a nitride-based bilateral transistor Qm and a substrate potential management circuit configured for managing a potential of the main substrate of the bidirectional switching device 8.

The bilateral transistor Qm may have a main gate terminal Gm electrically connected to the control node, a first source/drain terminal S/D1 electrically connected to the first power/load node, a second source/drain terminal S/D2 electrically connected to the second power/load node; and a main substrate terminal SUB electrically connected to the main substrate.

The substrate potential management circuit may comprise a first potential stabilizing element F1 having a first conduction terminal electrically connected to the first power/load node and a second conduction terminal electrically connected to the main substrate.

The substrate potential management circuit may further comprise a second potential stabilizing element F2 having a first conduction terminal connected to the main substrate and a second conduction terminal connected to the control node.

When a high-level voltage is applied to the control node, the first potential stabilizing element F1 may have a first resistance lower than a second resistance of the second potential stabilizing element F2 such that a potential of the main substrate is substantially equal to a lower one of potentials of the first and second power/load nodes.

When a low-level voltage is applied to the control node, the first resistance may be higher than the second resistance such that the potential of the main substrate is substantially equal to the low-level voltage.

FIG. 5A depicts a circuit diagram of a bidirectional switching device 81 according to some embodiments based on the circuit block diagram of FIG. 4.

Referring to FIG. 5A. The first potential stabilizing element F1 may comprise a diode D1 having a negative terminal electrically connected to the first power/load node and a positive terminal 51 electrically connected to the main substrate.

Referring to FIG. 5B. The diode D1 may be replaced with a rectifying transistor Q3 to form a bidirectional switching device 82. The rectifying transistor Q3 may have a gate terminal G3 and a source terminal S3 both connected to the main substrate and a drain terminal D3 connected to the first power/load node.

The rectifying transistor Q3 may be constructed with various types of transistors, including but not limited to, GaN HEMT, Si MOSFET, insulated gate bipolar transistor (IGBT), junction gate field-effect transistor (JFET) and static induction transistor (SIT).

Referring to FIGS. 5A and 5B. The second potential stabilizing element F2 may be a non-rectifying element, such as a resistor R1, having a first terminal connected to the main substrate and a second terminal connected to the control node.

Figure 6B:
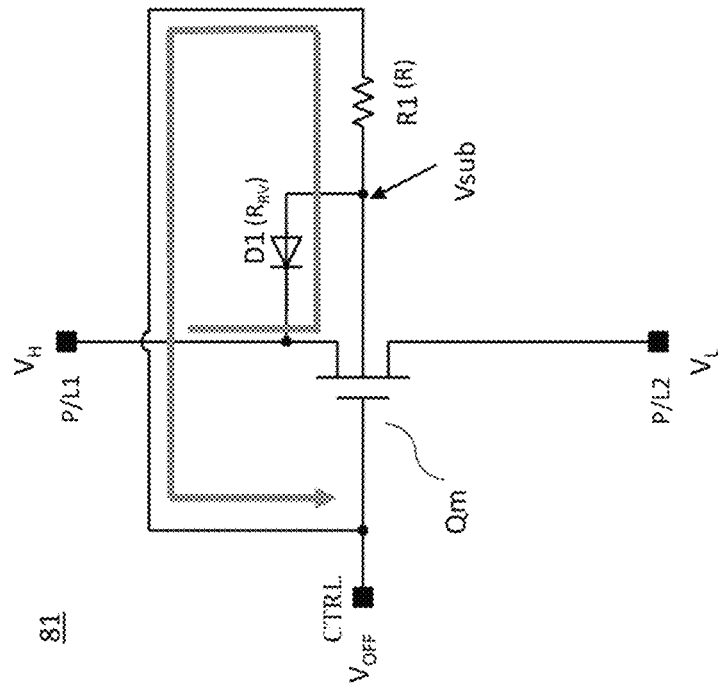
FIGS. 6A-6D depict operation mechanism of the bidirectional switching device in FIG. 5A/5B.
Figure 6A:
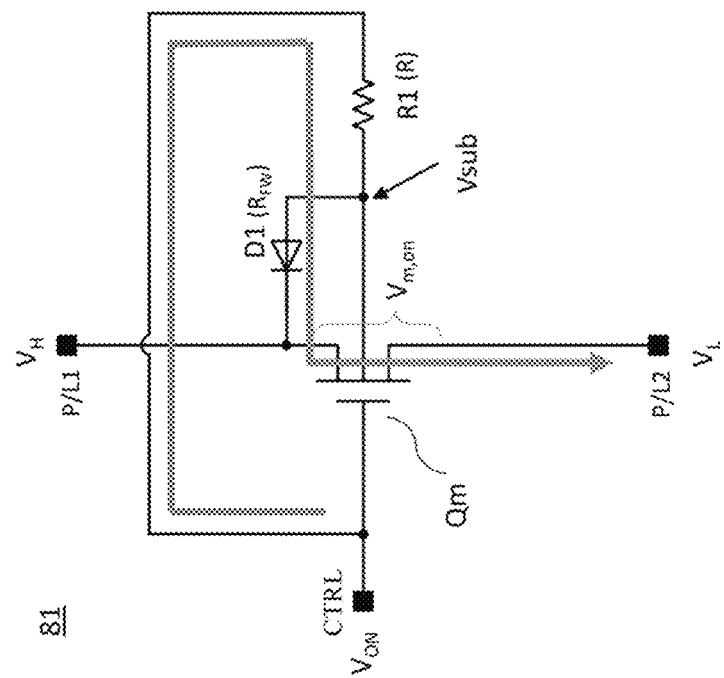

FIGS. 6A and 6B depict the operation mechanism of the bidirectional switching devices 81 under a first operation mode in which the first power/load node is biased at a voltage $V_H$ higher than a voltage $V_L$ applied to the second power/load node.

Referring to FIG. 6A. When a high-level voltage $V_{ON}$ is applied to the control node such that the bilateral transistor Qm is turned on, a current flows through the resistor R1 and the diode D1 from the control node to the second power/load node, the potential of the substrate Vsub is then given by $Vsub=V_L+Vm,on+(V_{ON}-V_L-Vm,on)*R_{FW}/(R_{FW}+R)$, where R is the resistance of the resistor R1, $R_{FW}$ is the forward resistance of the diode D1, Vm,on is a drain-source voltage of the bilateral transistor Qm when it is turned on. As $R_{FW}$ is much smaller than R and Vm,on is very small, Vsub is substantially equal to the voltage $V_L$ applied to the second power/load node.

Referring to FIG. 6B. When a low-level voltage $V_{OFF}$ is applied to the control node such that the bilateral transistor Qm is turned off, a current flows through the diode D1 and the resistor R1 from the first power/load node to the control node, the potential of the substrate Vsub is given by $Vsub=V_{OFF}+(V_H-V_{OFF})*R/(R+R_{RV})$, where $R_{RV}$ is the reverse resistance of the diode D1. As $R_{RV}$ is much larger than R, the potential of the substrate Vsub is substantially equal to the low-level voltage $V_{OFF}$ applied to the control node.

Figure 6D:
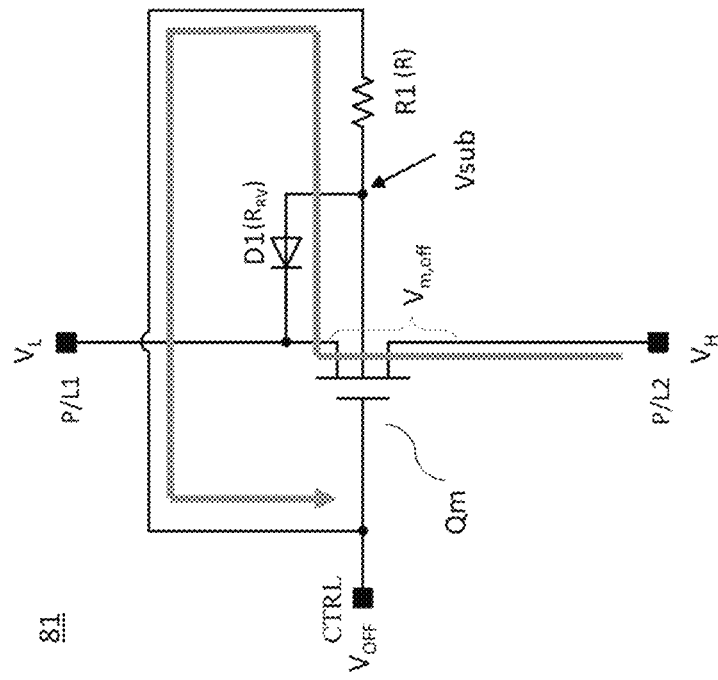
Figure 6C:
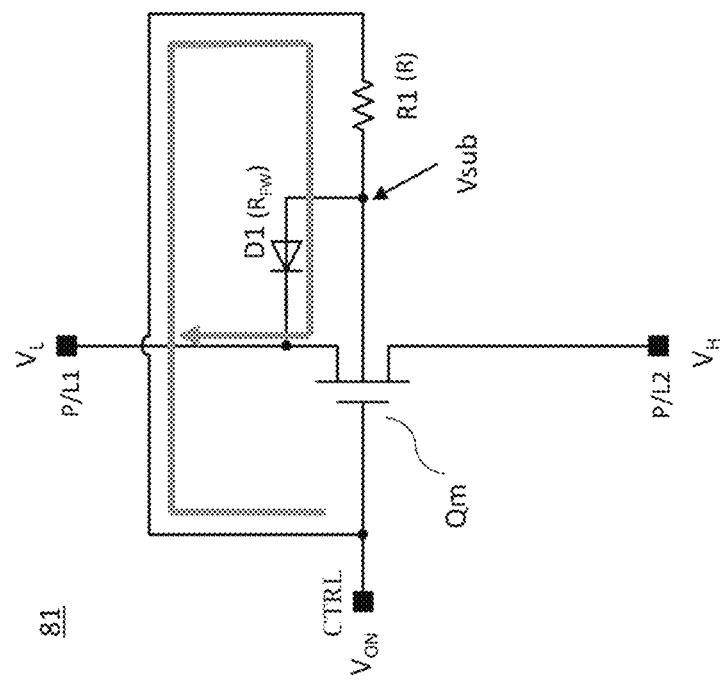

FIGS. 6C and 6D depict the operation mechanism of the bidirectional switching devices 81 under a second operation mode in which the second power/load node is biased at a voltage $V_H$ higher than a voltage $V_L$ applied to the first power/load node.

Referring to FIG. 6C. When a high-level voltage $V_{ON}$ is applied to the control node such that the bilateral transistor Qm is turned on, a current flows through the resistor R1 and the diode D1 from the control node to the first power/load node, the potential of the substrate Vsub is given by $Vsub=V_L+(V_{ON}-V_L)*R_{FW}/(R_{FW}+R)$. As $R_{FW}$ is much smaller than R, the potential of the substrate Vsub is substantially equal to the voltage $V_L$ applied to the first power/load node.

Referring to FIG. 6D. When a low-level voltage $V_{OFF}$ is applied to the control node such that the bilateral transistor Qm is turned off, a current flows through the diode D1 and the resistor R1 from the second power/load node to the control node, the potential of the substrate Vsub is given by $Vsub=V_{OFF}+(V_H-Vm,off-V_{OFF})*R/(R_{RV}+R)$, where Vm,off is a drain-source voltage of the bilateral transistor Qm when it is turned off. As $R_{RV}$ is much larger than R, the potential of the substrate Vsub is substantially equal to the low-level voltage $V_{OFF}$ applied to the control node.

The bidirectional switching device 81/82 may be formed by integrating the nitride-based bilateral transistor Qm, the diode D1/rectifying transistor Q3 and the resistor R1 in an IC chip.

Figure 7:
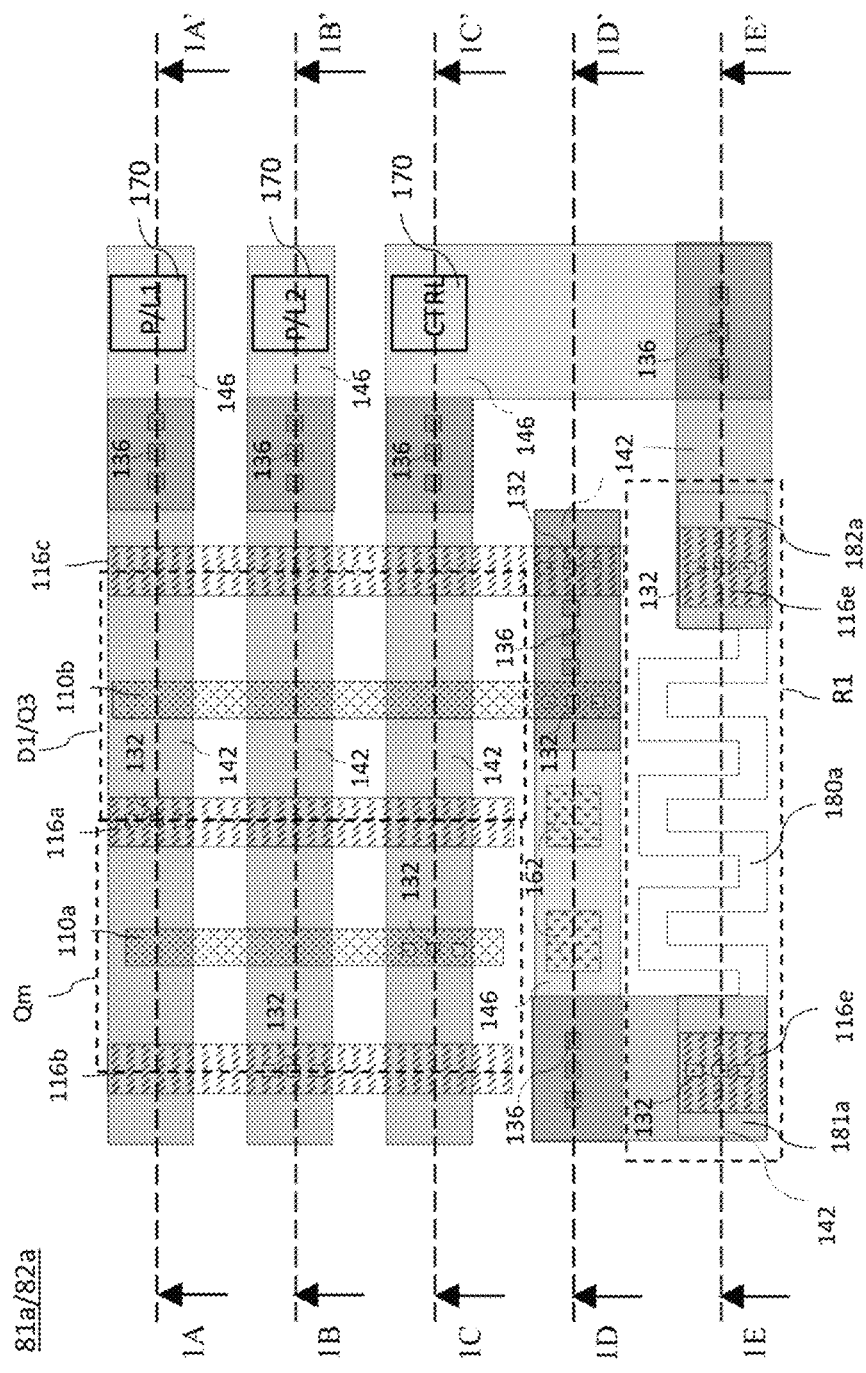
FIG. 7 and FIGS. 8A-8E illustrate structure of a bidirectional switching device based on the circuit diagram in FIG. 5A/5B.

FIGS. 7 and 8A-8E illustrate structure of a bidirectional switching device 81a/82a based on the circuit diagram of FIG. 5A/5B. FIG. 7 is a partial layout of the bidirectional switching device 81a/82a showing a relationship among some elements that can constitute parts of transistors and the resistor in the bidirectional switching device 81a/82a. FIGS. 8A-8E are cross-sectional views taken along lines A-A', B-B', C-C', D-D' and E-E' in FIG. 7 respectively. The bidirectional switching device 81a/82a has a layered structure similar to that of the bidirectional switching device 11. For conciseness, identical elements are given the same reference numerals and symbols and will not be described in details.

Referring to FIGS. 7 and 8A-8E. the bidirectional switching device 81a/82a may include a substrate 102, a first nitride-based semiconductor layer 104, a second nitride-based semiconductor layer 106, gate structures 110, S/D electrodes 116, a first passivation layer 124, a passivation layer 126, a third passivation layer 128, one or more first conductive vias 132, one or more second conductive vias 136, one or more first conductive traces 142, one or more second conductive traces 146, a protection layer 154, one or more through gallium vias (TGV) 162 and one or more conductive pads 170, which are configured to electrically connect to external elements (e.g., an external circuit).

Conductive traces 142 or 146, conductive vias 132 or 136, and TGVs 162 can be configured to electrically connect different layers/elements to form the nitride-based bilateral transistor Qm, the diode D1 and the resistor R1.

The conductive pads 170 may include a control pad CTRL configured to act as the control node, a first power/load pad P/L1 configured to act as the first power/load node and a second power/load pad P/L2 configured to act as the second power/load node.

Figure 8A:
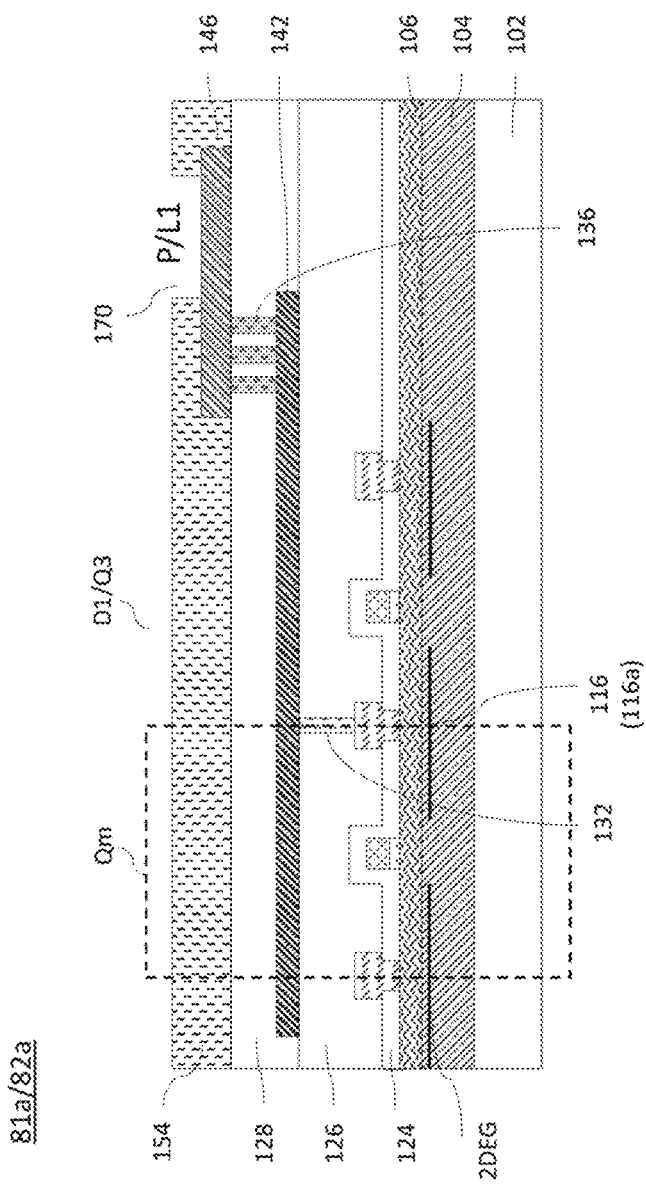

Referring to FIG. 8A. The S/D electrodes 116 may include at least one first S/D electrode 116a electrically connected to the first power/load pad and configured to act as the first source/drain terminal of the nitride-based bilateral transistor Qm and the drain terminal of rectifying transistor Q3 (or the negative terminal of diode D1). The first S/D electrode 116a may be connected to the first power/load pad through at least one conductive via 132, at least one conductive trace 142, at least one conductive via 136 and at least one conductive trace 146.

Figure 8B:
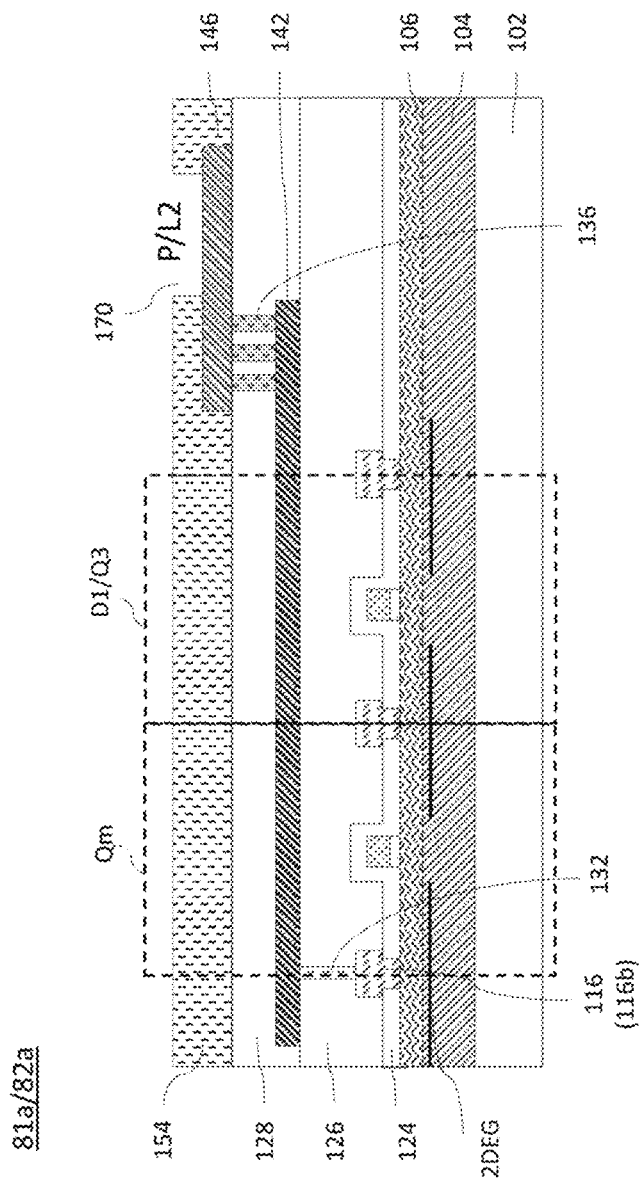

Referring to FIG. 8B. The S/D electrodes 116 may include at least one second S/D electrode 116b electrically connected to the second power/load pad and configured to act as the second source/drain terminal of the nitride-based bilateral transistor Qm. The second S/D electrode 116b may be connected to the second power/load pad through at least one conductive via 132, at least one conductive trace 142, at least one conductive via 136 and at least one conductive trace 146.

Figure 8C:
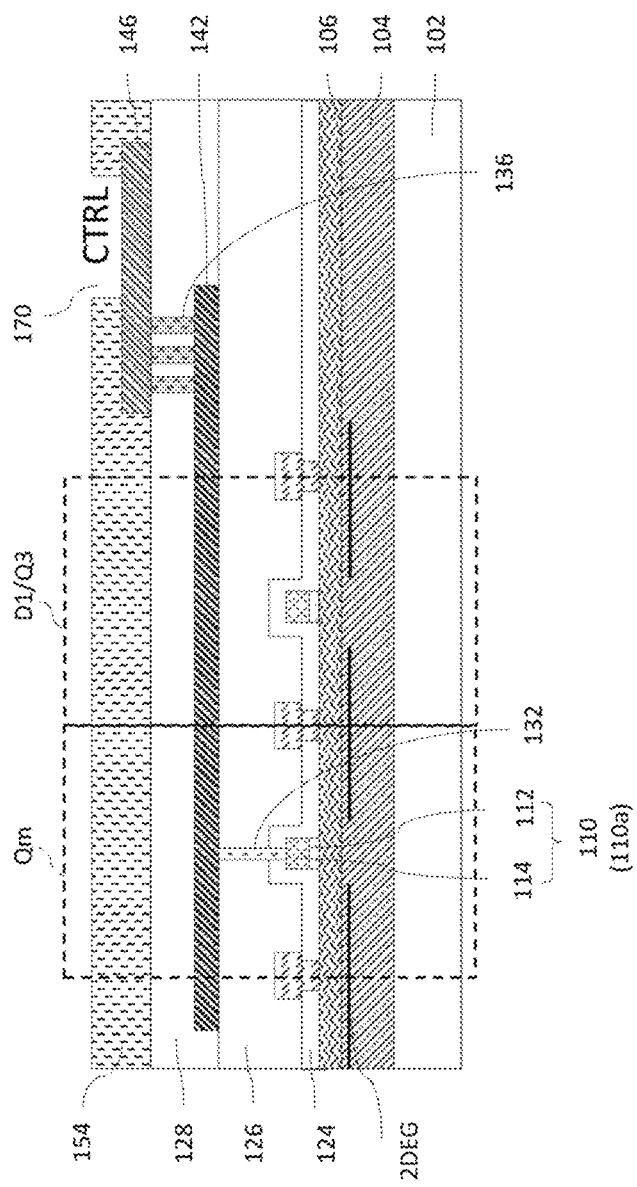

Referring to FIG. 8C. The gate structures 110 may include at least one first gate structure 110a electrically connected to the control pad and configured to act as the main gate terminal of the nitride-based bilateral transistor Qm. The first gate structure 110a may be connected to the control pad through at least one conductive via 132, at least one conductive trace 142, at least one conductive via 136 and at least one conductive trace 146.

Figure 8D:
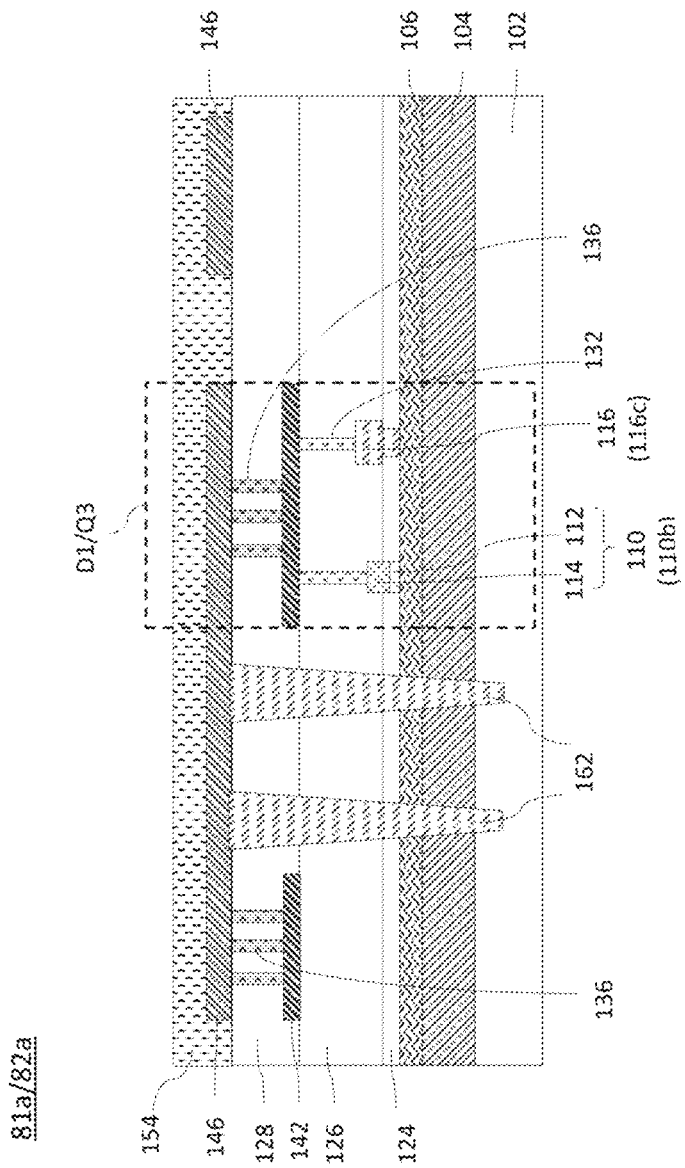

Referring to FIG. 8D. The gate structures 110 may further include at least one second gate structure 110b electrically connected to the substrate 102 and configured to act as the gate terminal of the rectifying transistor Q3. The S/D electrodes 116 may include at least one third S/D electrode 116c electrically connected to the substrate 102 and configured to act as the source terminal of the rectifying transistor Q3. In other words, the second gate structure 110b and the third S/D electrode 116c may be electrically shorted to form the positive terminal of the diode D1.

The second gate structure 110b may be connected to the substrate 102 through at least one conductive via 132, at least one conductive trace 142, at least one conductive via 136, at least one conductive trace 146 and at least one TGV 162.

The third S/D electrode 116c may be electrically connected to the substrate through at least one conductive via 132, at least one conductive trace 142, at least one conductive via 136, at least one conductive trace 146 and at least one TGV 162.

Preferably, the second S/D electrode 116b is adjacent to the first S/D electrode 116a and the first gate structure 110a is between the first S/D electrode 116a and the second S/D electrode 116b.

Preferably, the third S/D electrode 116c is adjacent to the first S/D electrode 116a; and the second gate structure 110b is between the first S/D electrode 116a and the third S/D electrode 116c.

Figure 8E:
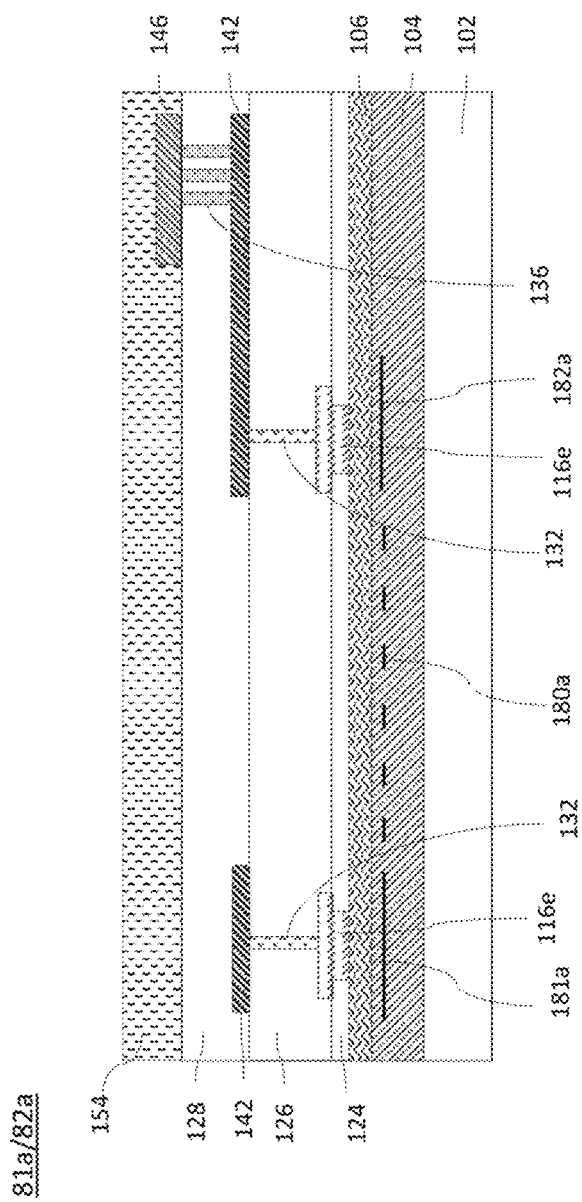

Referring to FIG. 7 and FIG. 8E. The bidirectional switching device 81a/82a may further comprise a resistive element 180a. The resistive element 180a comprises a first end 181a electrically connected to the substrate 102 to act as the first terminal of the resistor R1; and a second end 182a electrically connected to the control pad to act as the second terminal of the resistor R1.

The resistive element 180a may be disposed at the same layer of the 2DEG region adjacent to the heterojunction interface between the first nitride-based semiconductor layer 104 and the second nitride-based semiconductor layer 106. The first end 181a may be electrically coupled to the substrate 102 through at least one ohmic contact 116e, at least one first conductive via 132, at least one first conductive trace 142, at least one conductive via 136, at least one conductive trace 146 and at least one TGV 162. The second end 182a may be electrically connected to the control pad through at least one ohmic contact 116e, at least one first conductive via 132, at least one first conductive trace 142, at least one second conductive via 136 and at least one second conductive trace 146.

The manufacturing method for the bidirectional switching device 81a/82a may include stages illustrated in FIGS. 3A-3K except for that between the stages illustrated in FIG. 3A and FIG. 3B, the 2DEG region adjacent to the heterojunction interface between the first nitride-based semiconductor layer 104 and the second nitride-based semiconductor layer 106 is patterned by ion-implantation to form the resistive element 180a.

Figure 9:
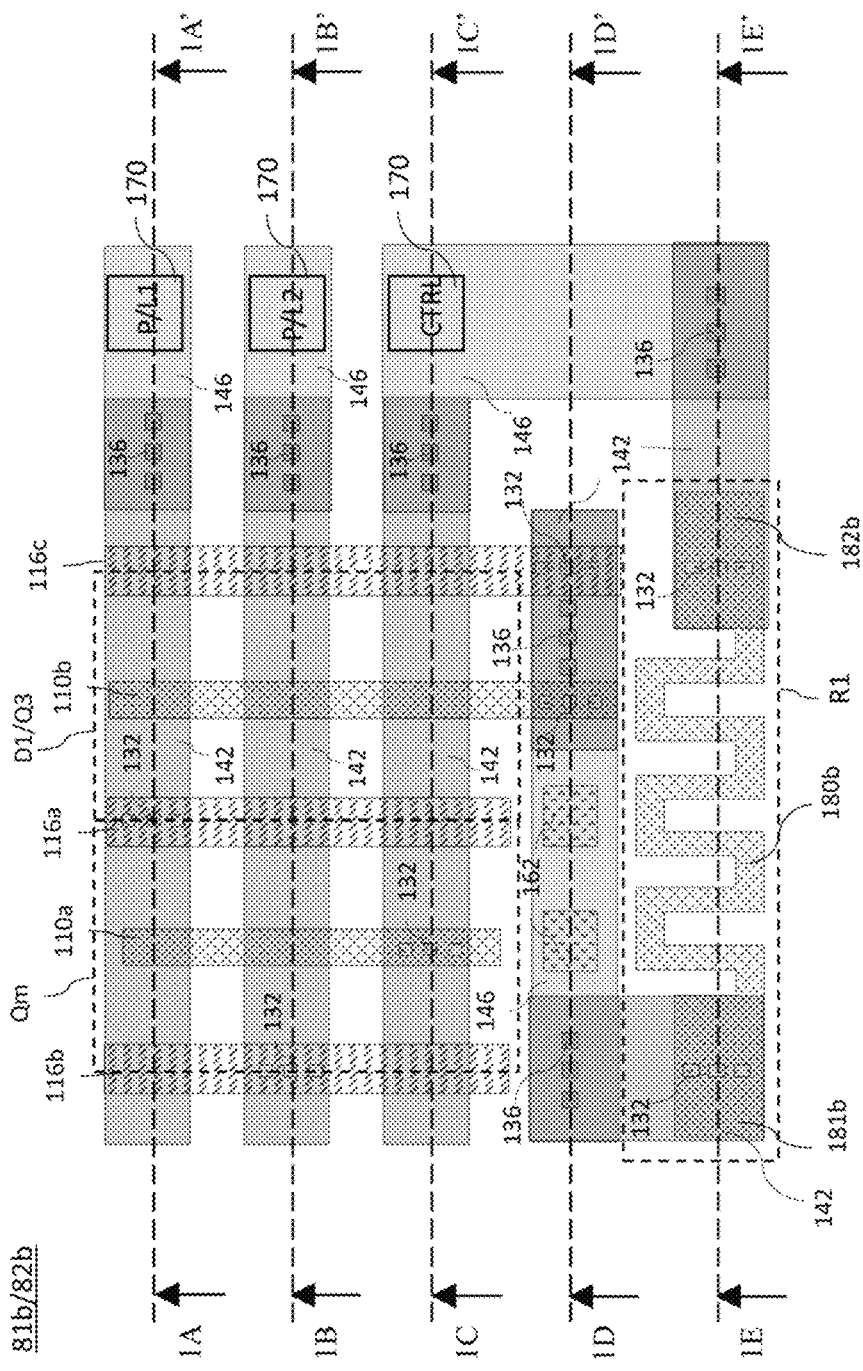
FIG. 9 and FIG. 10 illustrate structure of a bidirectional switching device according to another embodiment based on the circuit diagram of FIG. 5A/5B.
Figure 10:
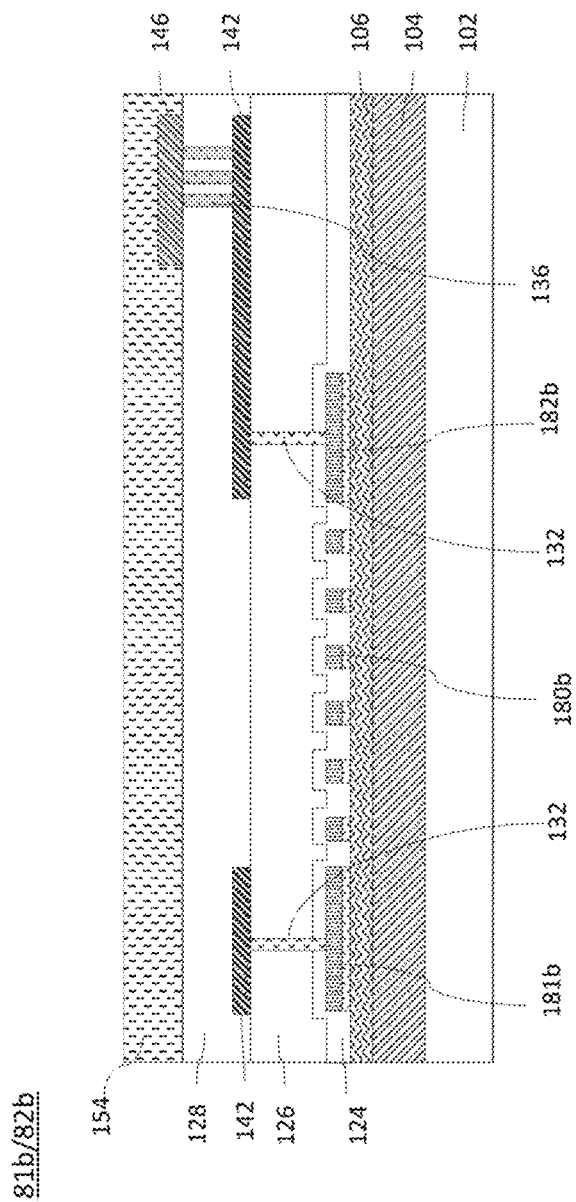

FIG. 9 and FIG. 10 illustrate structure of a bidirectional switching device 81b/82b according to another embodiment based on the circuit diagram of FIG. 5A/5B. FIG. 9 is a partial layout of the bidirectional switching device 81b/82b showing a relationship among some elements that can constitute parts of transistors and the resistor in the bidirectional switching device 81b/82b. The cross-section views taken along lines A-A', B-B', C-C' and D-D' in FIG. 9 are the same as those taken along lines A-A', B-B' and C-C' and D-D' in FIG. 7, thus can be referred to FIGS. 8A-8D. The cross-section view taken along line E-E' in FIG. 9 is illustrated in FIG. 10. For conciseness, identical structural elements in FIGS. 7, 8A-8E, and FIGS. 113, 114 are given the same reference numerals and symbols and will not be further described in details.

Referring to FIG. 9 and FIG. 10. The bidirectional switching device 81b/82b comprises a resistive element 180b. The resistive element 180b comprises a first end 181b electrically connected to the substrate 102 to act as the first terminal of the resistor R1; and a second end 182b electrically connected to the control pad to act as the second terminal of the resistor R1.

The bidirectional switching device 81b/82b is similar to the bidirectional switching device 81a/82a except for that the resistive element 180b is disposed on the second nitride-based semiconductor layer 106 and made of the same materials as the gate structures 110. The first end 181b may be electrically coupled to the substrate 102 through at least one first conductive via 132, at least one first conductive trace 142, at least one conductive via 136, at least one conductive trace 146 and at least one TGV 161. The second end 182b may be electrically connected to the control pad through at least one first conductive via 132, at least one first conductive trace 142, at least one second conductive via 136 and at least one second conductive trace 146.

The manufacturing method for the bidirectional switching device 81b/82b may include stages illustrated in FIGS. 3A-3K except for that at the stage illustrated in FIG. 3C, the blanket semiconductor layer 111 and the blanket gate electrode layer 113 are patterned to form the gate structures 110 and the resistive element 180b simultaneously.

Figure 11:
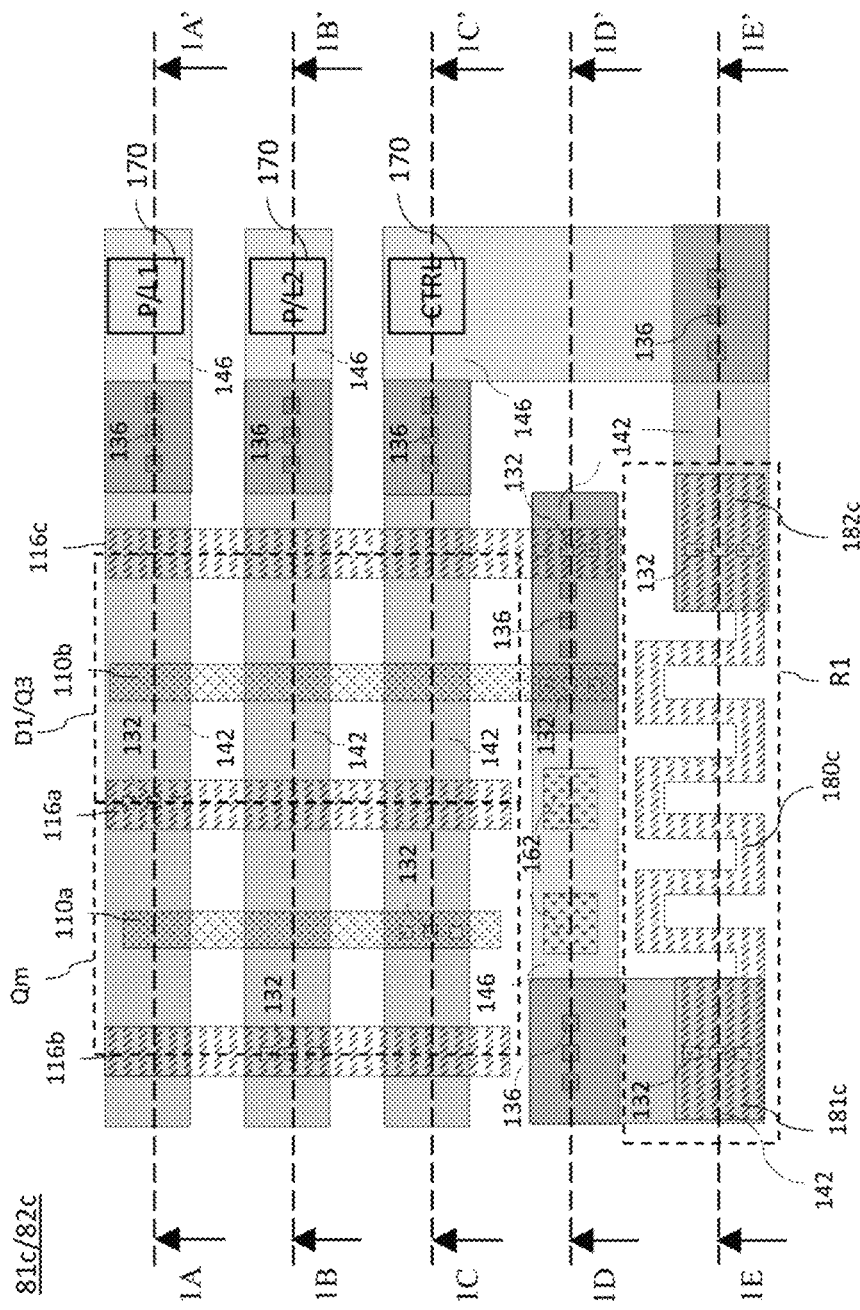
FIG. 11 and FIG. 12 illustrate structure of a bidirectional switching device according to another embodiment based on the circuit diagram of FIG. 5A/5B.
Figure 12:
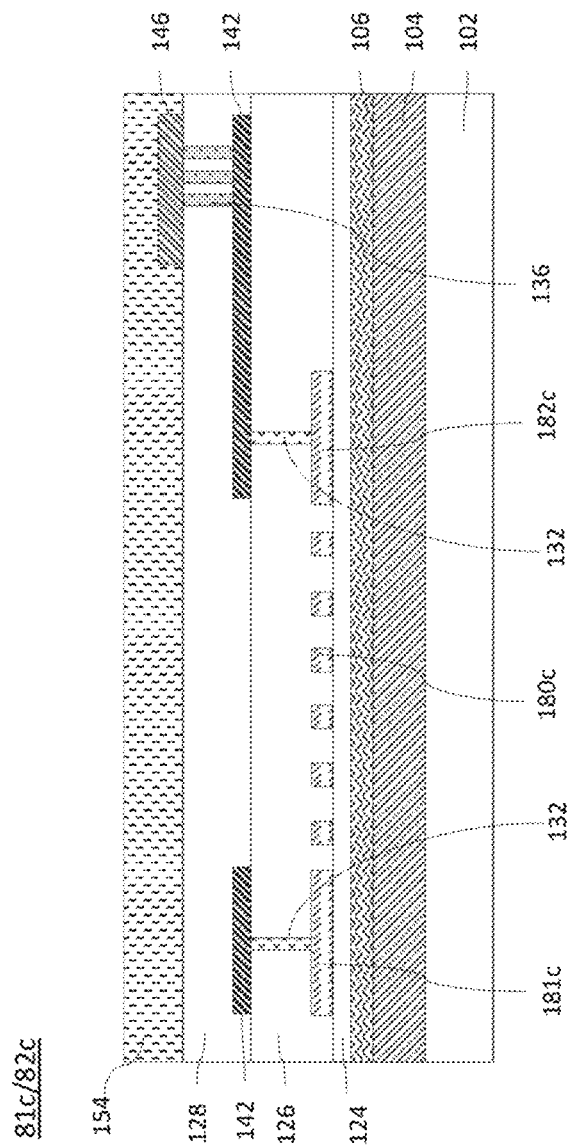

FIG. 11 and FIG. 12 illustrate structure of a bidirectional switching device 81c/82c according to another embodiment based on the circuit diagram of FIG. 5A/5B. FIG. 11 is a partial layout of the bidirectional switching device 81c/82c showing a relationship among some elements that can constitute parts of transistors and the resistor in the bidirectional switching device 81c/82c. The cross-section views taken along lines A-A', B-B', C-C' and D-D' in FIG. 11 are the same as those taken along lines A-A', B-B' and C-C' and D-D' in FIG. 111, thus can be referred to FIGS. 8A-8D. The cross-section view taken along line E-E' in FIG. 11 is illustrated in FIG. 12. For conciseness, identical structural elements in FIGS. 7, 8A-8E, and FIGS. 115, 116 are given the same reference numerals and symbols and will not be further described in details.

Referring to FIG. 11 and FIG. 12. The bidirectional switching device 81c/82c comprises a resistive element 180c. The resistive element 180c comprises a first end 181c electrically connected to the substrate 102 to act as the first terminal of the resistor R1; and a second end 182c electrically connected to the control pad to act as the second terminal of the resistor R1.

The bidirectional switching device 81c/82c is similar to the bidirectional switching device 81a/82a except for that the resistive element 180c may be disposed on the first passivation layer 124 and made of the same materials as the S/D electrodes 116. The first end 181c may be electrically coupled to the substrate 102 through at least one first conductive via 132, at least one first conductive trace 142, at least one conductive via 136, at least one conductive trace 146 and at least one TGV 162. The second end 182c may be electrically connected to the control pad through at least one first conductive via 132, at least one first conductive trace 142, at least one second conductive via 136 and at least one second conductive trace 146.

The manufacturing method for the bidirectional switching device 81c/82c may include stages illustrated in FIGS. 3A-3K except for that at the stage illustrated in FIG. 3E, the blanket conductive layer 115 is patterned to form the S/D electrodes 116 and the resistive element 180c simultaneously.

Figure 13:
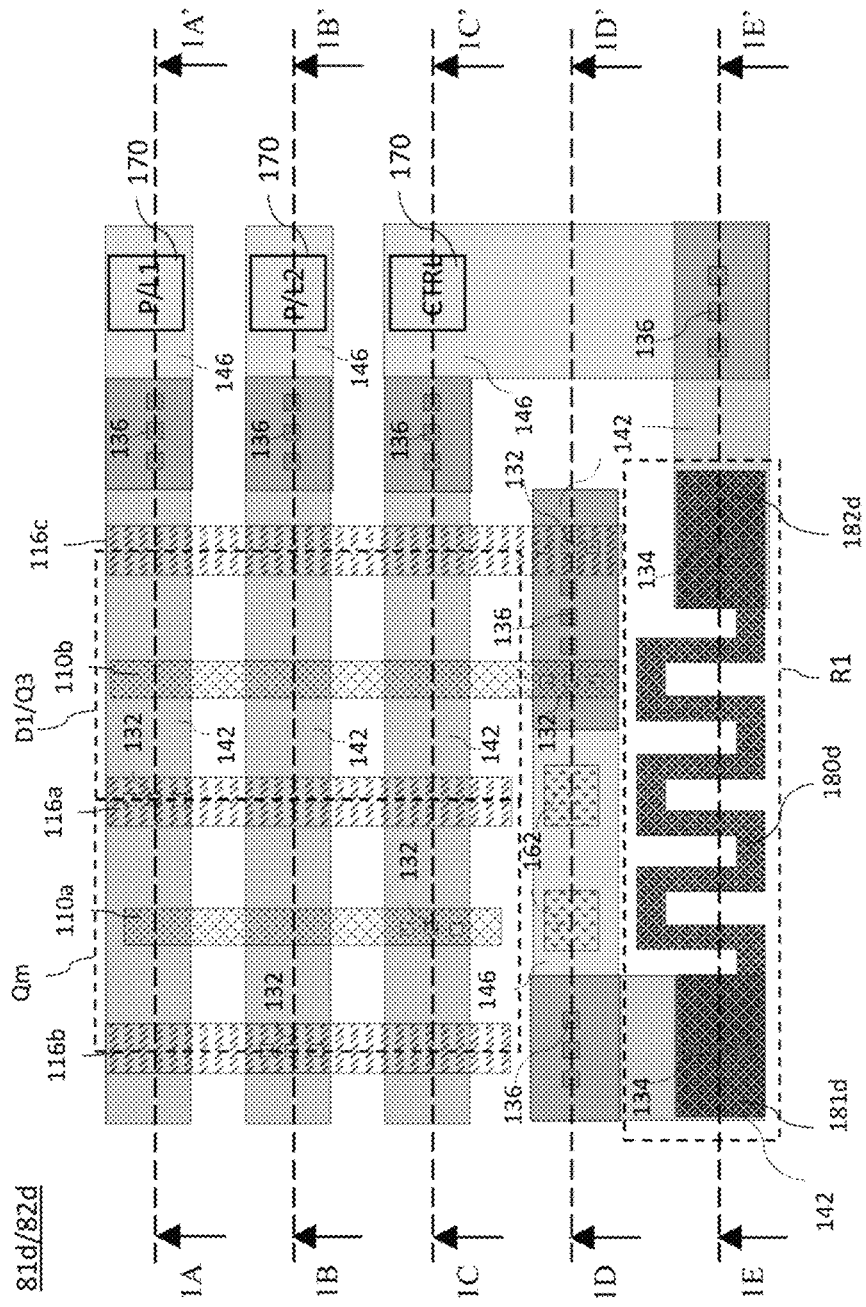
FIG. 13 and FIG. 14 illustrate structure of a bidirectional switching device according to another embodiment based on the circuit diagram of FIG. 5A/5B.
Figure 14:
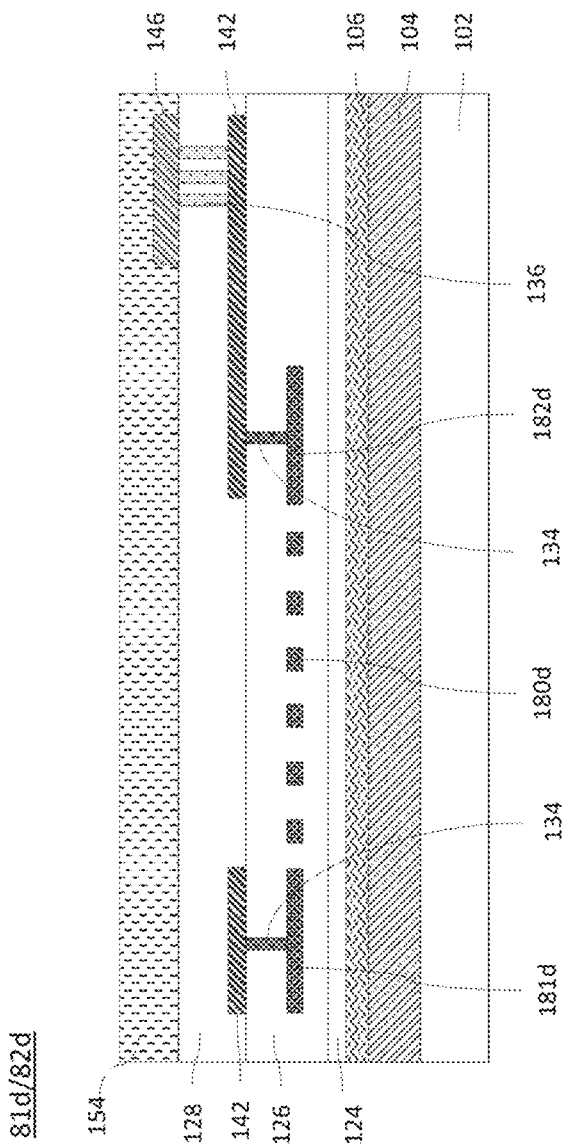

FIG. 13 and FIG. 14 illustrate structure of a bidirectional switching device 81d/82d according to another embodiment based on the circuit diagram of FIG. 5A/5B. FIG. 13 is a partial layout of the bidirectional switching device 81d/82d showing a relationship among some elements that can constitute parts of transistors and the resistor in the bidirectional switching device 81d/82d. The cross-section views taken along lines A-A', B-B', C-C' and D-D' in FIG. 13 are the same as those taken along lines A-A', B-B' and C-C' and D-D' in FIG. 7, thus can be referred to FIGS. 8A-8D. The cross-section view taken along line E-E' in FIG. 117 is illustrated in FIG. 118. For conciseness, identical structural elements in FIGS. 111, 112A-112E, and FIGS. 117, 118 are given the same reference numerals and symbols and will not be further described in details.

Referring to FIG. 13 and FIG. 14. The bidirectional switching device 81d/82d comprises a resistive element 180d. The resistive element 180d comprises a first end 181d electrically connected to the substrate 102 to act as the first terminal of the resistor R1; and a second end 182d electrically connected to the control pad to act as the second terminal of the resistor R1.

The bidirectional switching device 81d/82d is similar to the bidirectional switching device 81a/82a except for that the resistive element 180d is disposed within passivation layer 126. The passivation layer 126 is split into a lower layer 126a below the resistive element 180d and an upper layer 126b above the resistive element 180d. In other words, the resistive element 180d is sandwiched between the first layer 126a and the lower layer 126a and the upper layer 126b. The first end 181d may be electrically coupled to the substrate 102 through at least one third conductive via 134, at least one first conductive trace 142, at least one conductive via 136, at least one conductive trace 146 and at least one TGV 162. The second end 182e may be electrically connected to the control pad through at least one third conductive via 134, at least one first conductive trace 142, at least one second conductive via 136 and at least one second conductive trace 146.

The manufacturing method for the bidirectional switching device 81d/82d may include stages illustrated in FIGS. 3A-3K except for that a lower passivation layer 126a is deposited on the passivation layer 20; a blanket metal/metal compound layer 143 is deposited on the passivation layer 126a and patterned to form the resistive element 180d; an upper passivation layer 126b is deposited over the lower passivation layer 126a to cover the resistive element 180d; one or more third conductive vias 134 are formed in the upper passivation layer 126b to electrically couple the resistive element 180d.

Figure 15:
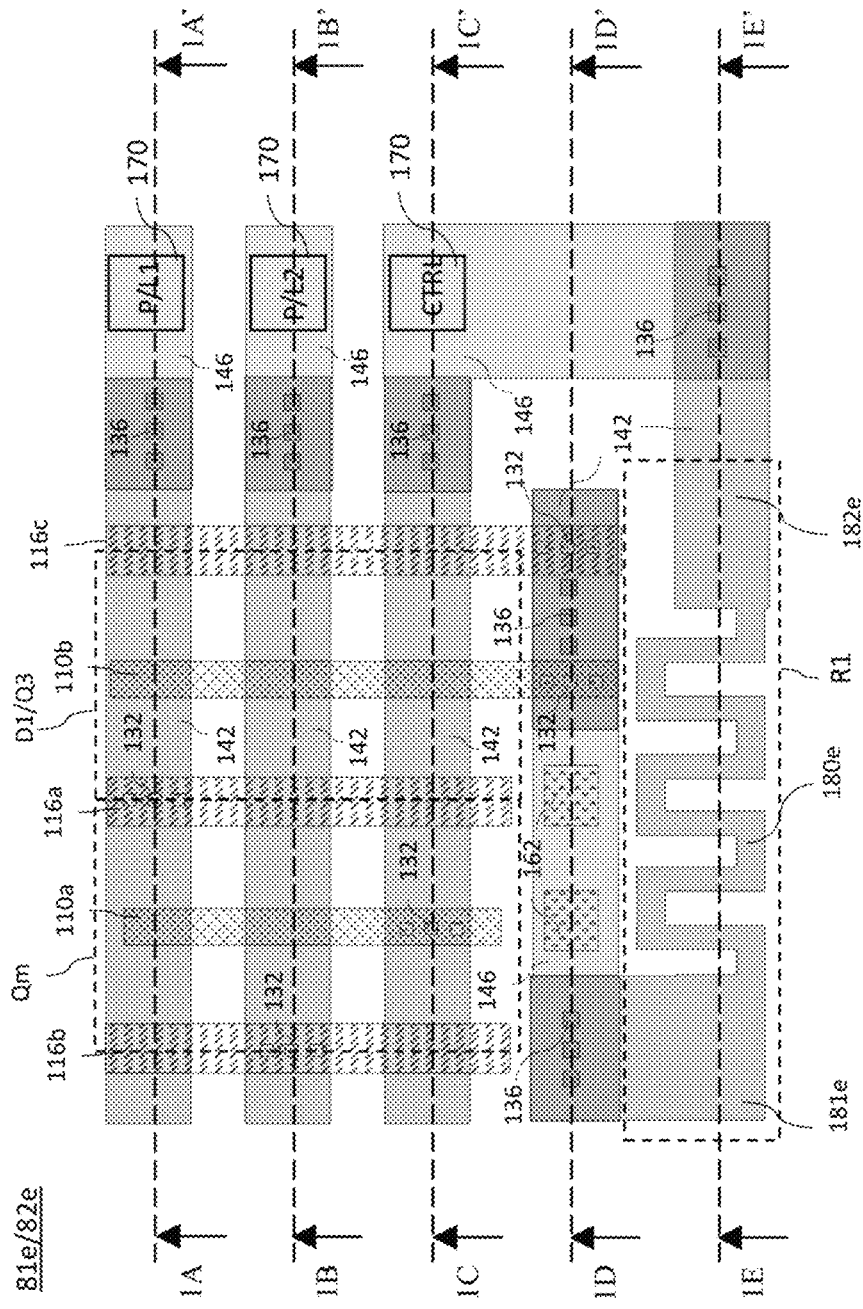
FIG. 15 and FIG. 16 illustrate structure of a bidirectional switching device according to another embodiment based on the circuit diagram of FIG. 5A/5B.
Figure 16:
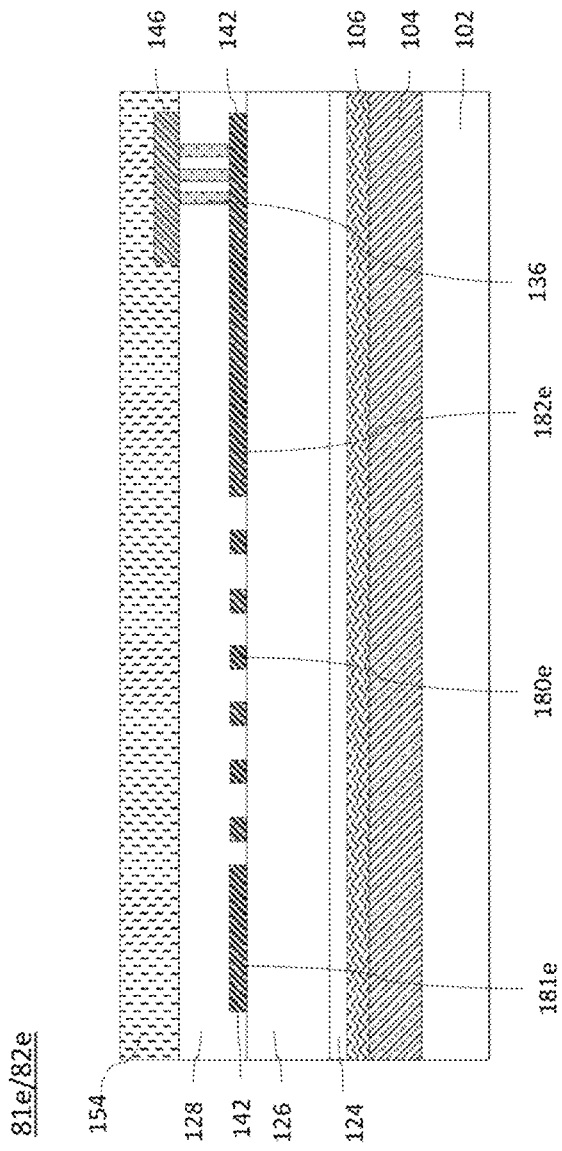

FIG. 15 and FIG. 16 illustrate structure of a bidirectional switching device 81e/82e according to another embodiment based on the circuit diagram of FIG. 5A/5B. FIG. 119 is a partial layout of the bidirectional switching device 81e/82e showing a relationship among some elements that can constitute parts of transistors and the resistor in the bidirectional switching device 81e/82e. The cross-section views taken along lines A-A', B-B', C-C' and D-D' in FIG. 15 are the same as those taken along lines A-A', B-B' and C-C' and D-D' in FIG. 111, thus can be referred to FIGS. 8A-8D. The cross-section view taken along line E-E' in FIG. 15 is illustrated in FIG. 16. For conciseness, identical structural elements in FIGS. 7, 8A-8E, and FIGS. 119, 120 are given the same reference numerals and symbols and will not be further described in details.

Referring to FIG. 15 and FIG. 16. The bidirectional switching device 81e/82e comprises a resistive element 180e. The resistive element 180e comprises a first end 181e electrically connected to the substrate 102 to act as the first terminal of the resistor R1; and a second end 182e electrically connected to the control pad to act as the second terminal of the resistor R1.

The bidirectional switching device 81e/82e is similar to the bidirectional switching device 81a/82a except for that the resistive element 180e is disposed on the second passivation layer 126 and made of the same materials as the conductive traces 142. The first end 181e may be electrically coupled to the substrate 102 through at least one second conductive via 136, at least one second conductive trace 146 and at least one TGV 162. The second end 182e may be electrically connected to the control pad through at least one second conductive via 136 and at least one second conductive trace 146.

The manufacturing method for the bidirectional switching device 81e/82e may include stages illustrated in FIGS. 3A-3K except for that at the stage illustrated in FIG. 3G, the blanket conductive layer 141 is patterned to form the conductive traces 142 and the resistive element 180e simultaneously.

Figure 17:
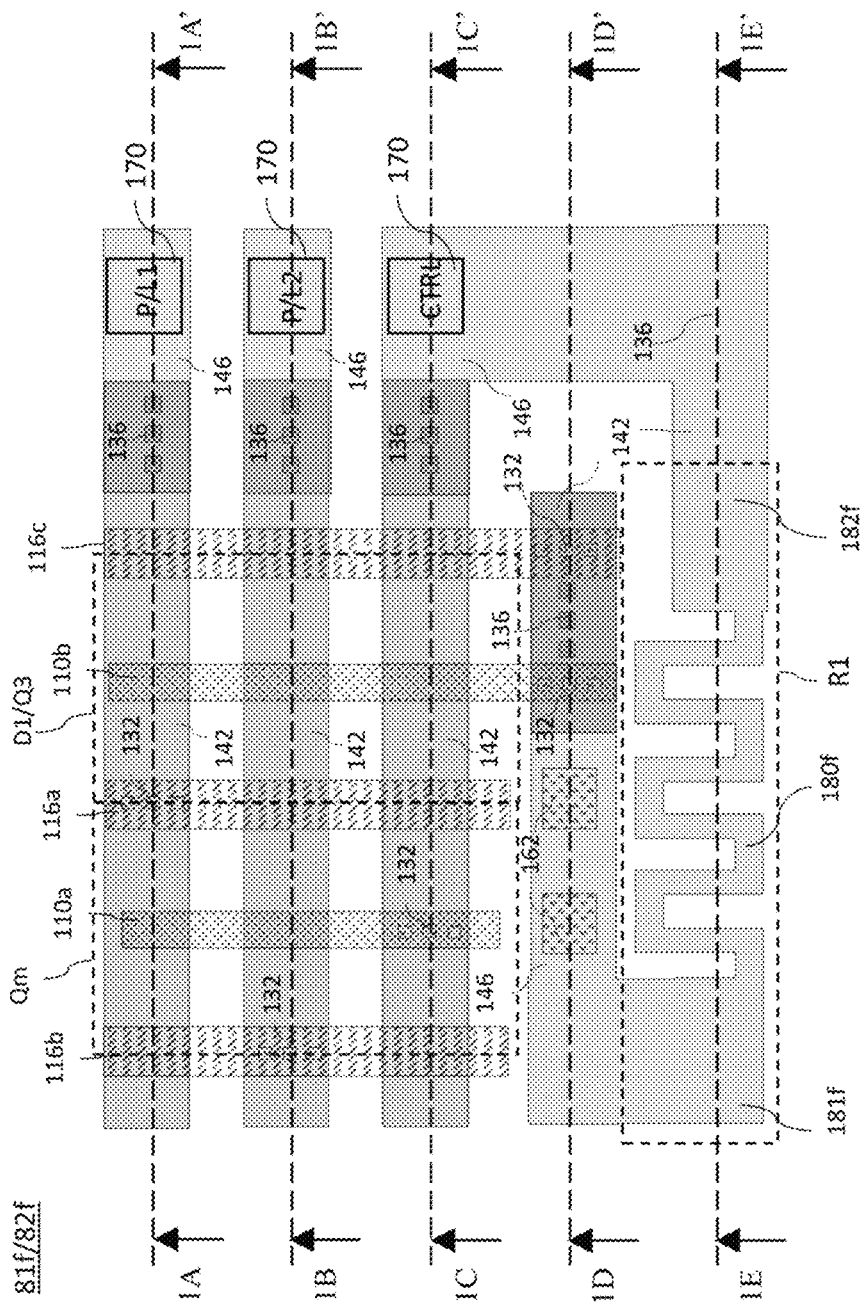
FIG. 17 and FIG. 18 illustrate structure of a bidirectional switching device according to another embodiment based on the circuit diagram of FIG. 5A/5B.
Figure 18:
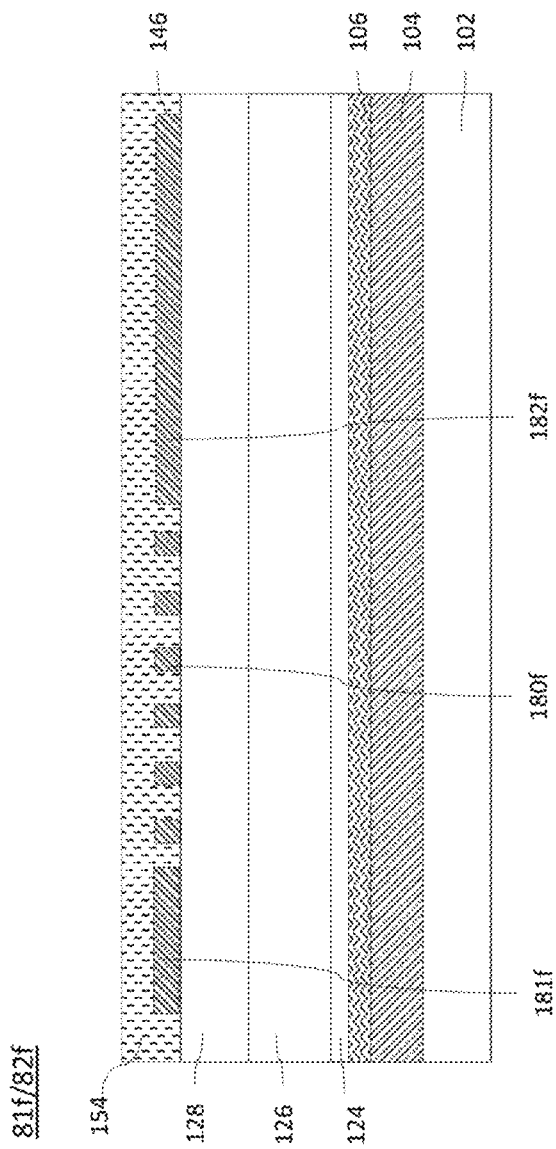

FIG. 17 and FIG. 18 illustrate structure of a bidirectional switching device 81f/82f according to another embodiment based on the circuit diagram of FIG. 5A/5B. FIG. 17 is a partial layout of the bidirectional switching device 81f/82f showing a relationship among some elements that can constitute parts of transistors and the resistor in the bidirectional switching device 81f/82f. The cross-section views taken along lines A-A', B-B', C-C' and D-D' in FIG. 17 are the same as those taken along lines A-A', B-B' and C-C' and D-D' in FIG. 7, thus can be referred to FIGS. 8A-8D. The cross-section view taken along line E-E' in FIG. 17 is illustrated in FIG. 18. For conciseness, identical structural elements in FIGS. 7, 8A-8E, and FIGS. 121, 18 are given the same reference numerals and symbols and will not be further described in details.

Referring to FIG. 17 and FIG. 18. The bidirectional switching device 81f/82f comprises a resistive element 180e. The resistive element 180e comprises a first end 181e electrically connected to the substrate 102 to act as the first terminal of the resistor R1; and a second end 182e electrically connected to the control pad to act as the second terminal of the resistor R1.

The bidirectional switching device 81f/82f is similar to the bidirectional switching device 81a/82a except for that the resistive element 180f may be disposed on the third passivation layer 128 and made of the same materials as the conductive traces 146. The first end 181f may be electrically coupled to the substrate 102 through at least one TGV 162. The second end 182f may be electrically connected to the control pad.

The manufacturing method for the bidirectional switching device 81f/82f may include stages illustrated in FIGS. 6A-6K except for that at the stage illustrated in FIG. 6J, the blanket conductive layer 145 is patterned to form the conductive traces 146 and the resistive element 180f simultaneously.

Figure 19B:
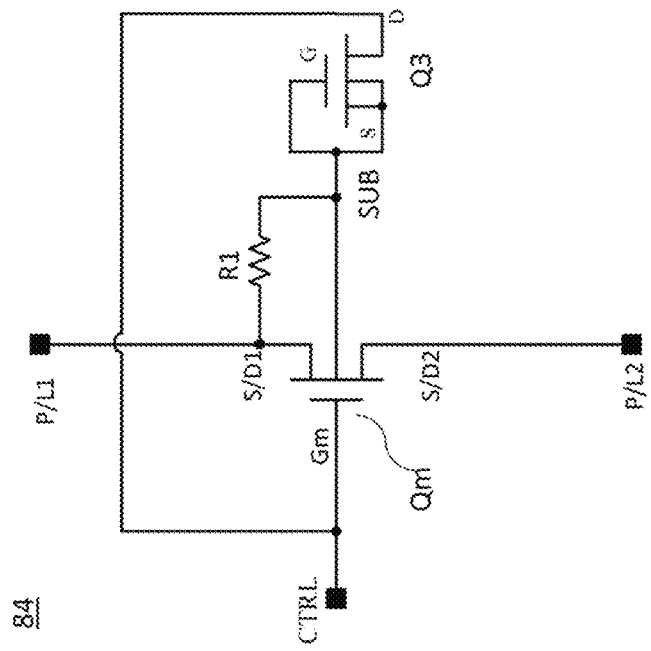
FIGS. 19A and 19B depict circuit diagrams of another bidirectional switching device according to some embodiments.
Figure 19A:
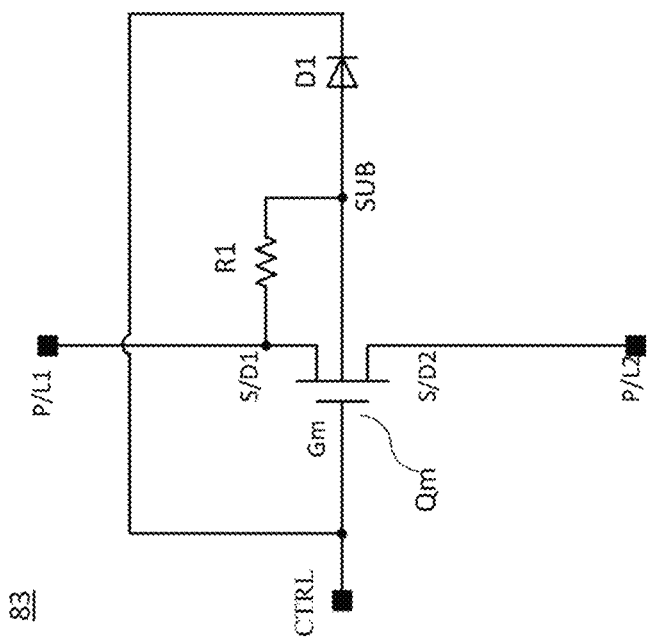

FIG. 19A depicts a circuit diagram of a bidirectional switching devices 83 according to some embodiments based on the circuit block diagram of FIG. 108.

Referring to FIG. 19A. The first potential stabilizing element F1 may comprise a non-rectifying element, such as a resistor R1, having a first terminal electrically connected to the first power/load node and a second terminal electrically connected to the main substrate.

The second potential stabilizing element F2 may be a rectifying element, such as a diode D1, having a positive terminal connected to the main substrate and a negative terminal connected to the control node.

Referring to FIG. 19B. The diode D1 may be replaced with a rectifying transistor Q3 to form a bidirectional switching device 84. The rectifying transistor Q3 may have a gate terminal G3 and a source terminal S3 both connected to the main substrate and a drain terminal D3 connected to control node.

The rectifying transistor Q3 may be constructed with various types of transistors, including but not limited to, GaN HEMT, Si MOSFET, insulated gate bipolar transistor (IGBT), junction gate field-effect transistor (JFET) and static induction transistor (SIT).

Figure 20A:
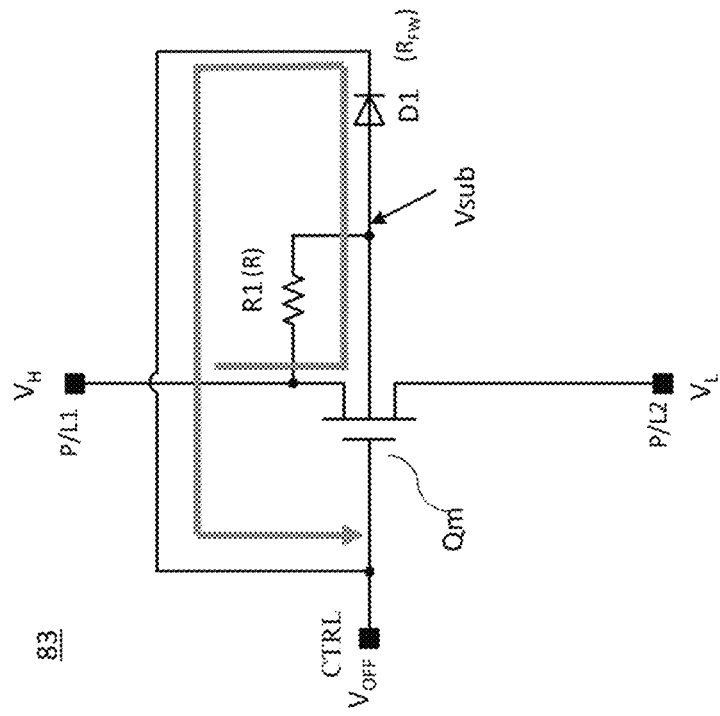
FIGS. 20A-20D depict operation mechanism of the bidirectional switching device in FIG. 19A/19B.
Figure 20B:
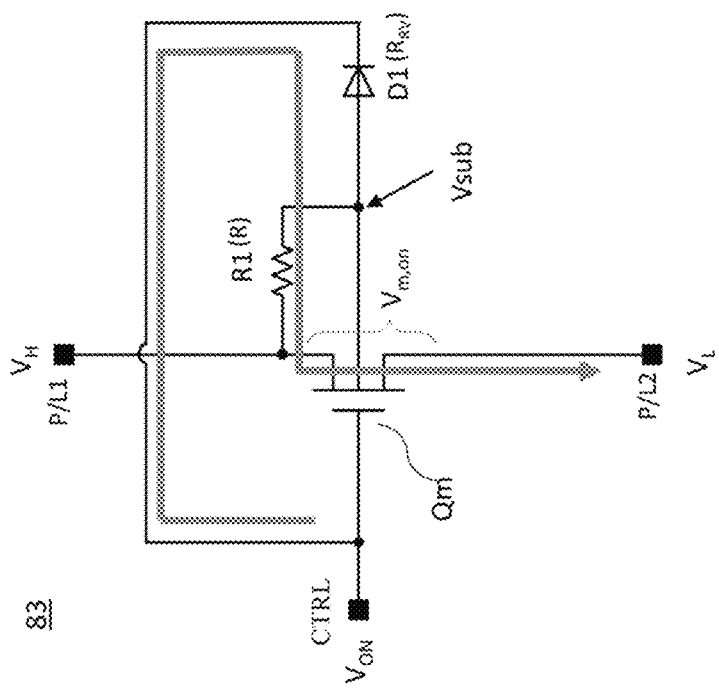

FIGS. 20A-20B depict the operation mechanism of the bidirectional switching device 83 under a first operation mode in which the first power/load node is biased at a voltage $V_H$ higher than a voltage $V_L$ applied to the second power/load node.

Referring to FIG. 20A. When a high-level voltage $V_{ON}$ is applied to the control node such that the bilateral transistor Qm is turned on, the diode D1 is reverse biased as a current flows through the diode D1 from the control node to the second power/load node, the potential of the substrate Vsub is then given by $Vsub=V_L+Vm,on+(V_{ON}-V_L-Vm,on)*R/(R+R_{RV})$, where $R_{RV}$ is the reverse resistance of the diode D1, Vm,on is a drain-source voltage of the bilateral transistor Qm when it is turned on; and R is the resistance of resistor R1. As Vm,on is very small and R is smaller than $R_{RV}$, the potential of the substrate Vsub is substantially equal to the voltage $V_L$ applied to the second power/load node.

Referring to FIG. 20B. When a low-level voltage $V_{OFF}$ is applied to the control node such that the bilateral transistor Qm is turned off, the diode D1 is forward biased as a current flows through the diode D1 from the first power/load node to the control node, the potential of the substrate Vsub is given by $Vsub=V_{OFF}+(V_H-V_{OFF})*R_{FW}/(R_{FW}+R)$. As R is much larger than $R_{FW}$, the potential of the substrate Vsub is substantially equal to the low-level voltage $V_{OFF}$ applied to the control node.

Figure 20D:
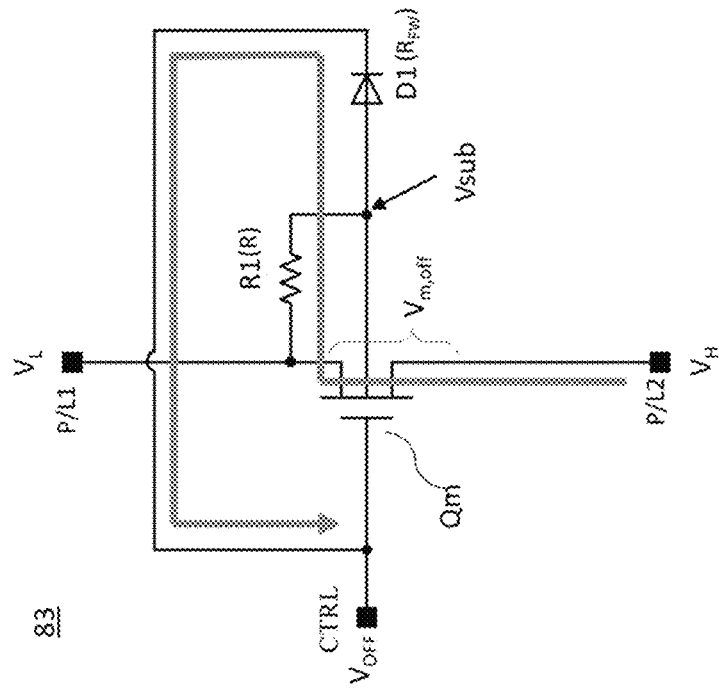
Figure 20C:
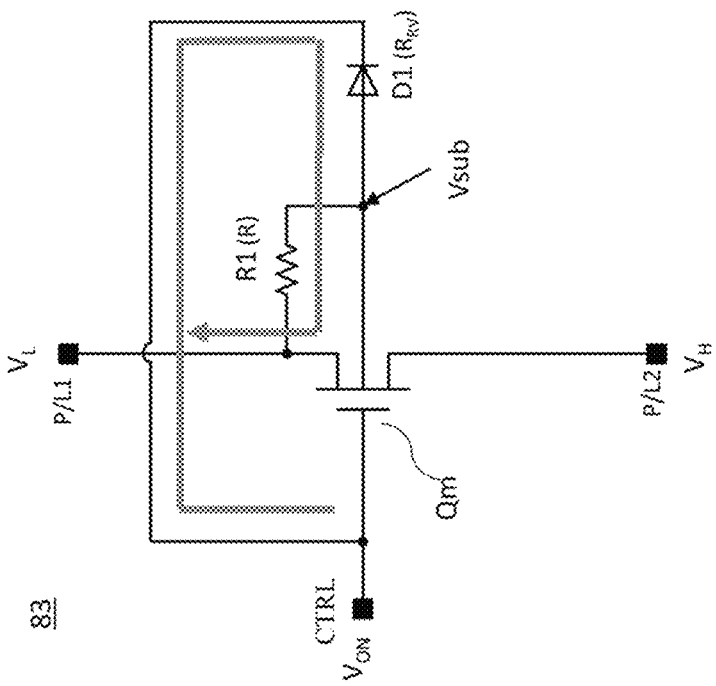

FIGS. 20C and 20D depict the operation mechanism of the bidirectional switching device 83 under a second operation mode in which the second power/load node is biased at a voltage $V_H$ higher than a voltage $V_L$ applied to the first power/load node.

Referring to FIG. 20C. When a high-level voltage $V_{ON}$ is applied to the control node such that the bilateral transistor Qm is turned on, the diode D1 is reverse biased as a current flows through the diode D1 from the control node to the first power/load node, the potential of the substrate Vsub is then given by $Vsub=V_L+(V_{ON}-V_L)*R/(R+R_{RV})$. As R is much smaller than $R_{RV}$, the potential of the substrate Vsub is substantially equal to the voltage $V_L$ applied to the first power/load node.

Referring to FIG. 20D. When a low-level voltage $V_{OFF}$ is applied to the control node such that the bilateral transistor Qm is turned off, the diode D1 is forward biased as a current flows through the diode D1 from the second power/load node to the control node, the potential of the substrate Vsub is given by $Vsub=V_{OFF}+(V_H-Vm,off-V_{OFF})*R_{FW}/(R_{FW}+R)$. As R is much larger than $R_{FW}$, the potential of the substrate Vsub is substantially equal to the low-level voltage $V_{OFF}$ applied to the control node.

The bidirectional switching device 83/84 may be formed by integrating the nitride-based bilateral transistor Qm, the resistor R1 and the diode D1/rectifying transistor Q3 in an IC chip.

Figure 21:
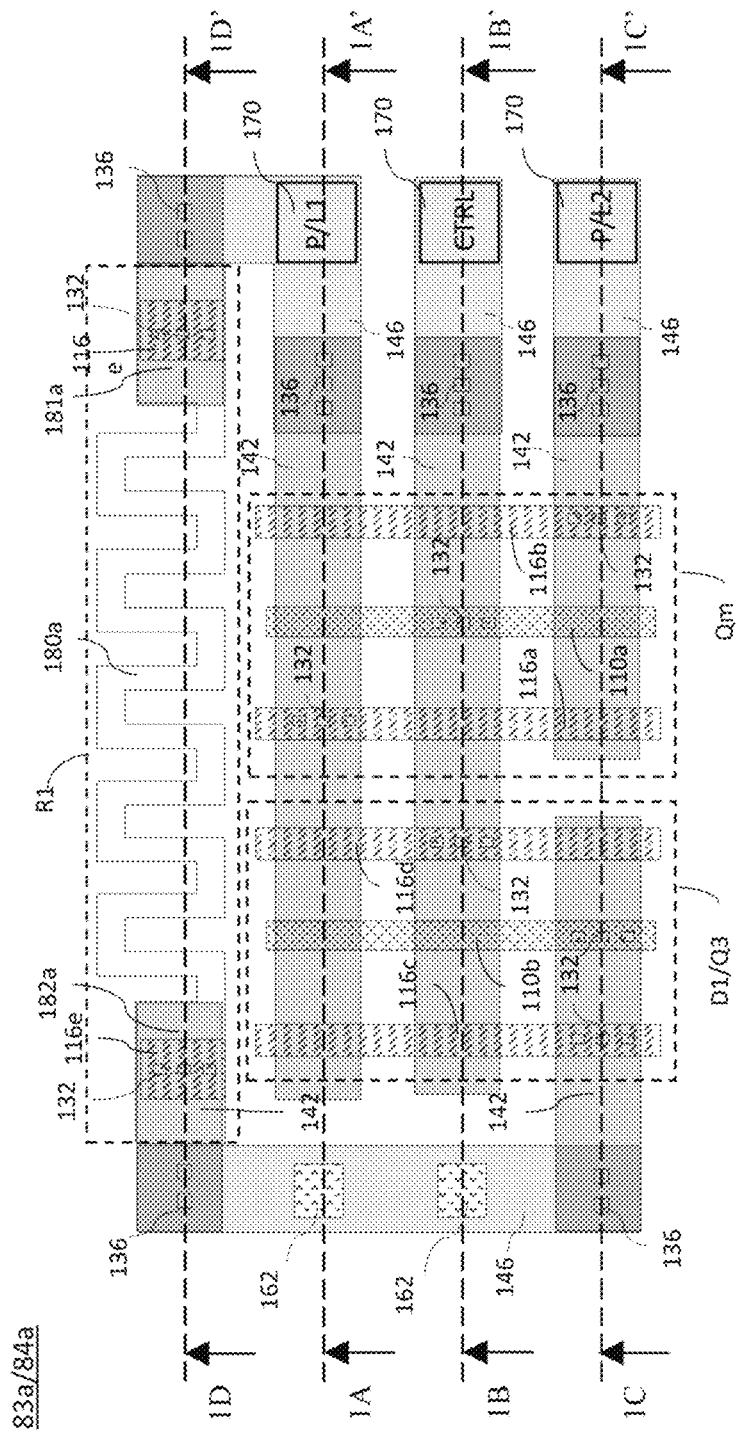
FIG. 21 and FIGS. 22A-22D illustrate structure of a bidirectional switching device based on the circuit diagram in FIG. 19A/19B.

FIGS. 21 and 22A-22D illustrate a structure of a bidirectional switching device 83a/84a based on the circuit diagram of FIG. 19A/19B. FIG. 21 is a partial layout of the bidirectional switching device 83a/84a showing a relationship among some elements that can constitute parts of transistors and resistors in the bidirectional switching device 83a/84a. FIGS. 22A-22D are cross-sectional views taken along lines A-A', B-B', C-C' and D-D' in FIG. 21 respectively. The bidirectional switching device 83a/84a has a layered structure similar to that of the bidirectional switching device 11. For conciseness, identical structural elements are given the same reference numerals and symbols and will not be further described in details.

Referring to FIGS. 21 and 22A-22D, the bidirectional switching device 83a/84a may include a substrate 102, a first nitride-based semiconductor layer 104, a second nitride-based semiconductor layer 106, gate structures 110, S/D electrodes 116, a first passivation layer 124, a passivation layer 126, a third passivation layer 128, one or more first conductive vias 132, one or more second conductive vias 136, one or more first conductive traces 142, one or more second conductive traces 146, a protection layer 154 and one or more through gallium vias (TGV) 162 and conductive pads 170.

The conductive pads 170 may include a control pad CTRL configured to act as the control node, a first power/load pad P/L1 configured to act as the first power/load node and a second power/load pad P/L2 configured to act as the second power/load node.

Conductive traces 142 or 146, conductive vias 132 or 136, and TGVs 162 can be configured to electrically connect different layers/elements to form the nitride-based bilateral transistor Qm, the resistor R1 and the diode D1/rectifying transistor Q3.

Figure 22A:
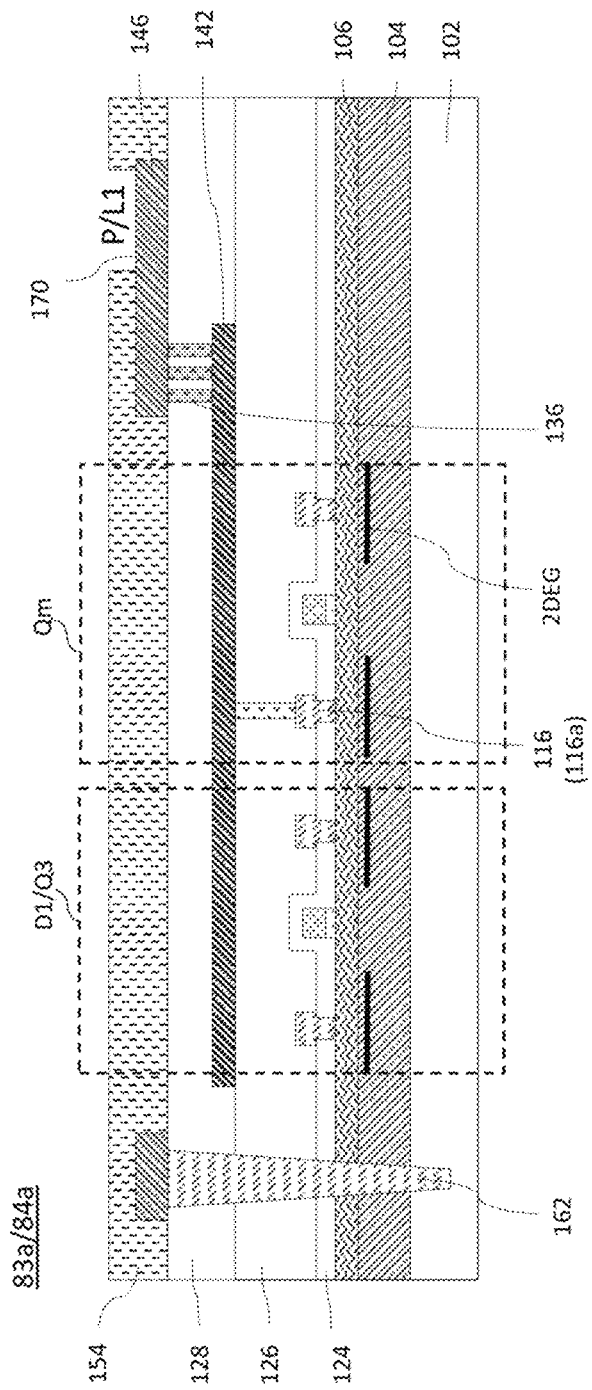

Referring to FIGS. 22A. The S/D electrodes 116 may include at least one first S/D electrode 116a electrically connected to the first power/load pad and configured to act as the first source/drain terminal of the nitride-based bilateral transistor Qm. The first S/D electrode 116a may be connected to the first power/load pad through at least one conductive via 132, at least one conductive trace 142, at least one conductive via 136 and at least one conductive trace 146.

Figure 22B:
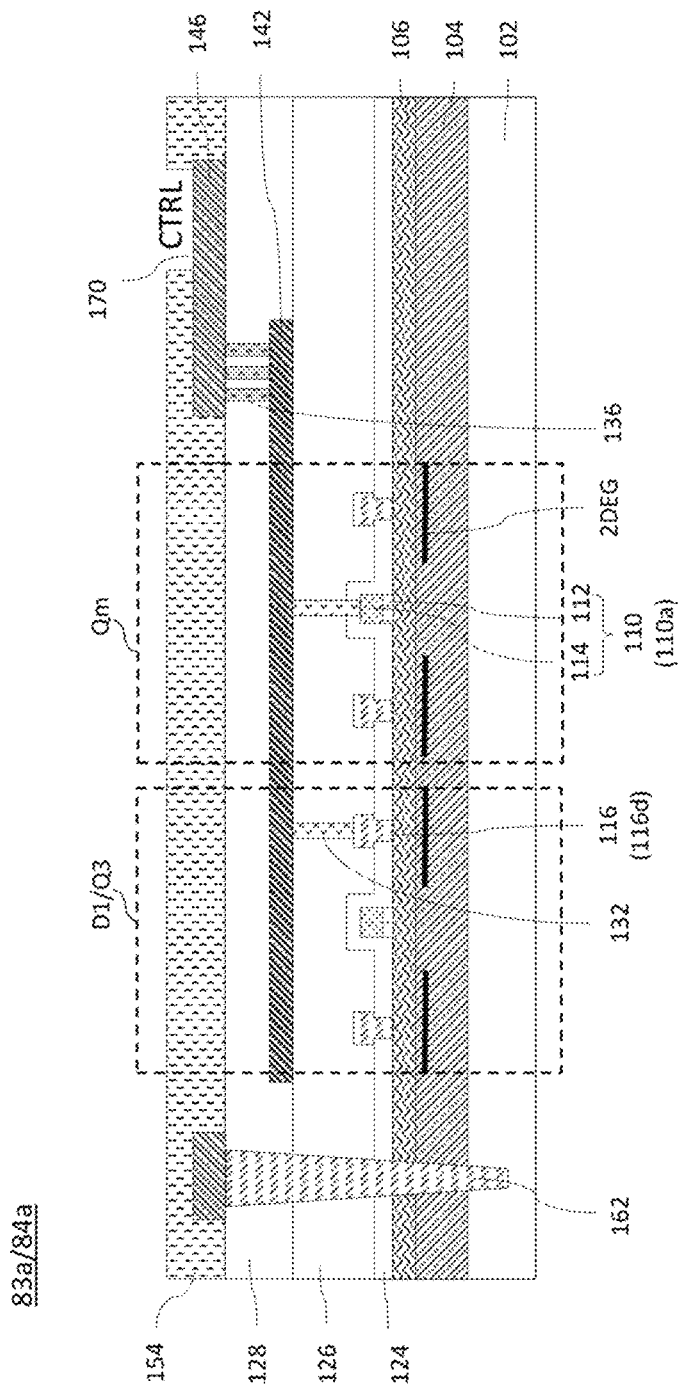

Referring to FIG. 22B. The gate structures 110 may include at least one first gate structure 110a electrically connected to the control pad and configured to act as the main gate terminal of the nitride-based bilateral transistor Qm. The first gate structure 110a may be connected to the control pad through at least one conductive via 132, at least one conductive trace 142, at least one conductive via 136 and at least one conductive trace 146.

The S/D electrodes 116 may include at least one fourth S/D electrode 116d electrically connected to the control pad and configured to act as the drain terminal of rectifying transistor Q3 (or the negative terminal of diode D1). The fourth S/D electrode 116d may be connected to the control pad through at least one conductive via 132, at least one conductive trace 142, at least one conductive via 136 and at least one conductive trace 146.

Figure 22C:
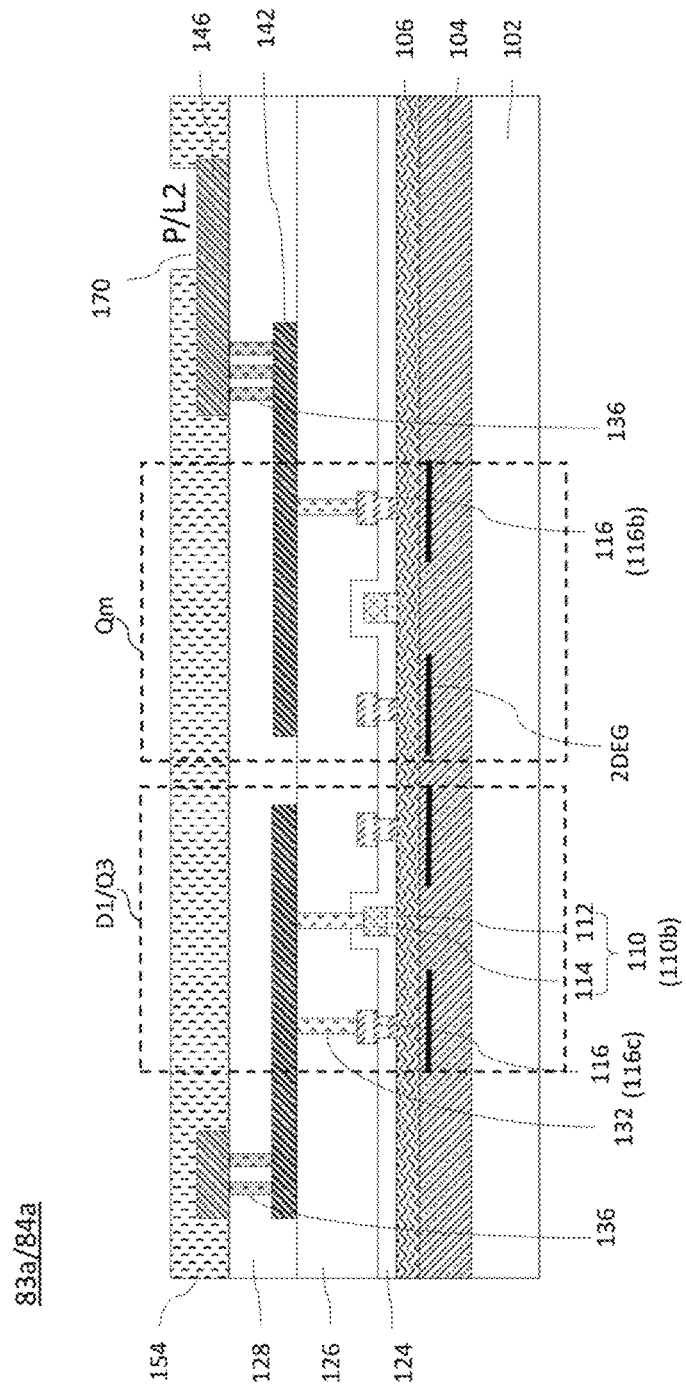

Referring to FIG. 22C. The S/D electrodes 116 may include at least one second S/D electrode 116b electrically connected to the second power/load pad and configured to act as the second source/drain terminal of the nitride-based bilateral transistor Qm. The second S/D electrode 116b may be connected to the second power/load pad through at least one conductive via 132, at least one conductive trace 142, at least one conductive via 136 and at least one conductive trace 146.

The gate structures 110 may further include at least one second gate structure 110b electrically connected to the substrate 102 and configured to act as the gate terminal of rectifying transistor Q3. The S/D electrodes 116 may include at least one third S/D electrode 116c electrically connected to the substrate 102 and configured to act as the source terminal of rectifying transistor Q3. In other words, the second gate structure 110b and the third S/D electrode 116c may be electrically shorted to form the positive terminal of diode D1.

The second gate structure 110b may be connected to the substrate 102 through at least one conductive via 132, at least one conductive trace 142, at least one conductive via 136, at least one conductive trace 146 and at least one TGV 162.

The third S/D electrode 116c may be electrically connected to the substrate 102 through at least one conductive via 132, at least one conductive trace 142, at least one conductive via 136, at least one conductive trace 146 and at least one TGV 162.

Preferably, the second S/D electrode 116b is adjacent to the first S/D electrode 116a and the first gate structure 110a is between the first S/D electrode 116a and the second S/D electrode 116b.

Preferably, the third S/D electrode 116c is adjacent to the fourth S/D electrode 116d; and the second gate structure 110b is between the fourth S/D electrode 116d and the third S/D electrode 116c.

Figure 22D:
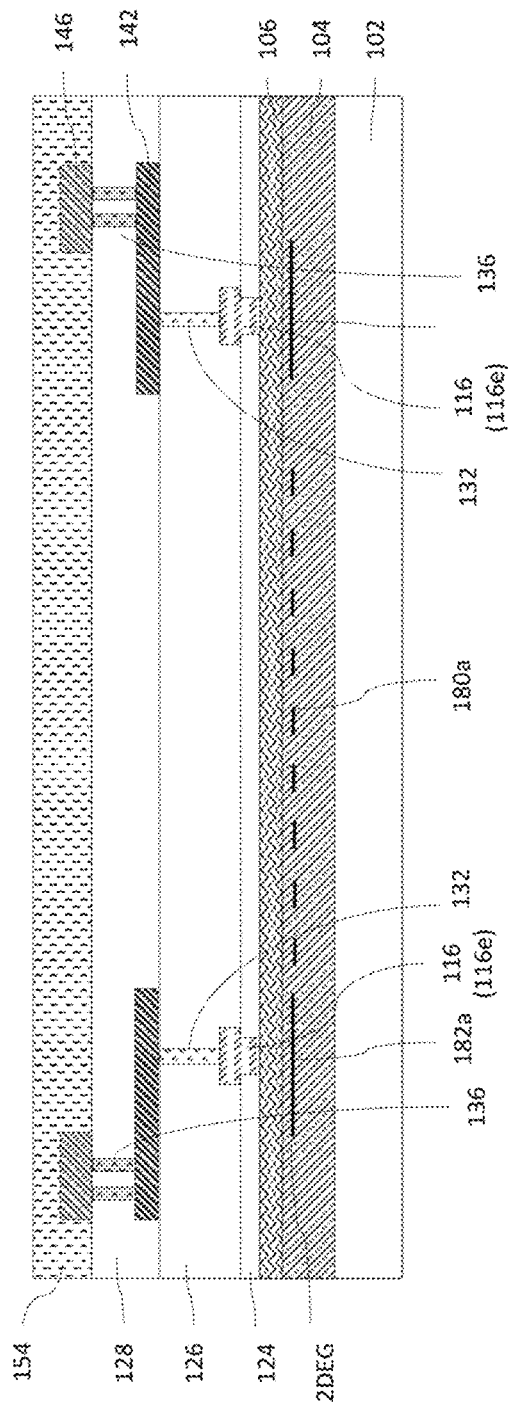

Referring to FIG. 21 and FIG. 22D. The bidirectional switching device 83a/84a may further comprise resistive element 180a. The resistive element 180a comprises a first end 181a electrically connected to the first power/load pad to act as the first terminal of the resistor R1; and a second end 182a electrically connected to the substrate 102 to act as the second terminal of the resistor R1.

The resistive element 180a may be disposed at the same layer of the 2DEG region adjacent to the heterojunction interface between the first nitride-based semiconductor layer 104 and the second nitride-based semiconductor layer 106. Each first end 181a may be electrically coupled to the first power/load pad through at least one ohmic contact 116e, at least one first conductive via 132, at least one first conductive trace 142, at least one conductive via 136 and at least one conductive trace 146. The second end 182a may be electrically connected to the substrate 102 through at least one ohmic contact 116e, at least one first conductive via 132, at least one first conductive trace 142, at least one second conductive via 136, at least one second conductive trace 146 and at least one TGV 162.

The manufacturing method for the bidirectional switching device 83a/84a may include stages illustrated in FIGS. 3A-3K except for that between the stages illustrated in FIG. 3A and FIG. 3B, the 2DEG region adjacent to the heterojunction interface between the first nitride-based semiconductor layer 104 and the second nitride-based semiconductor layer 106 is patterned by ion-implantation to form the resistive element 180a.

Figure 23:
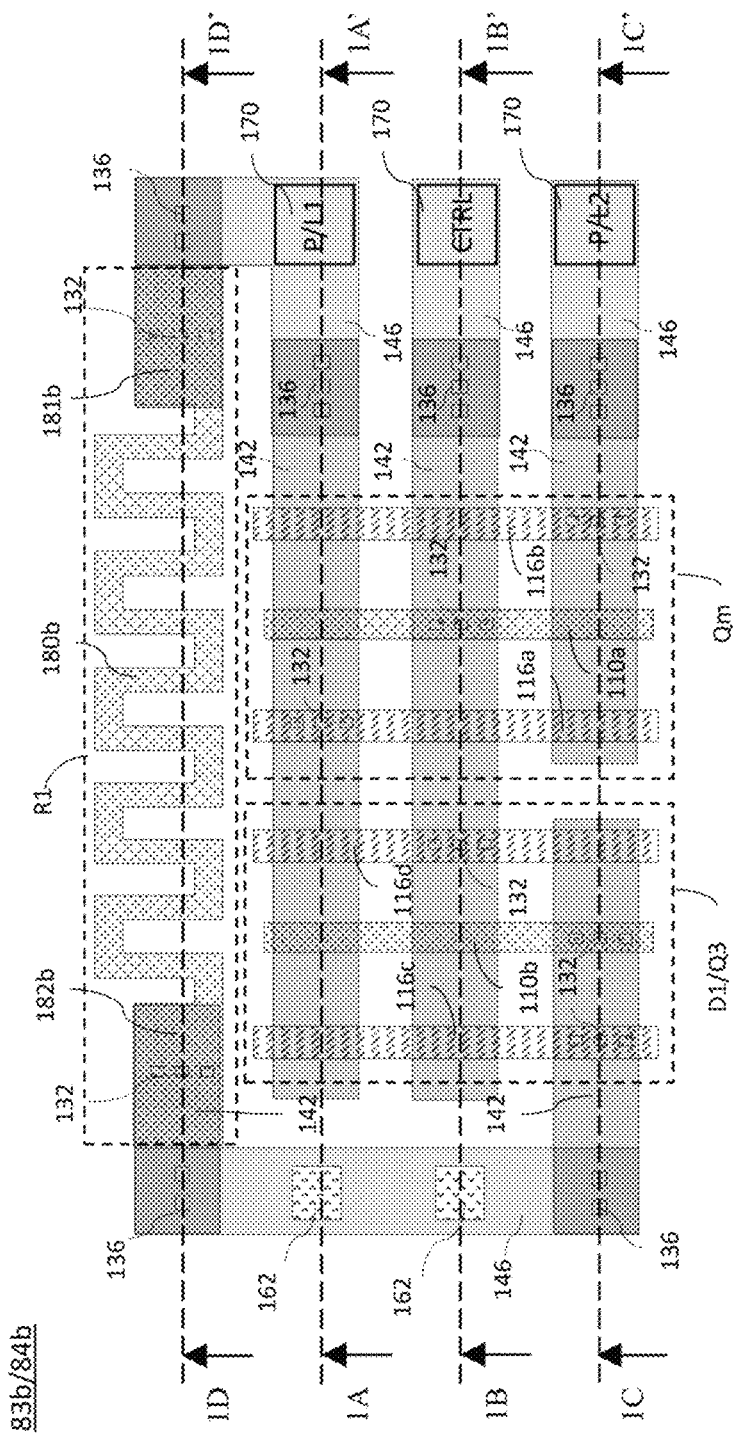
FIG. 23 and FIG. 24 illustrate structure of a bidirectional switching device according to another embodiment.
Figure 24:
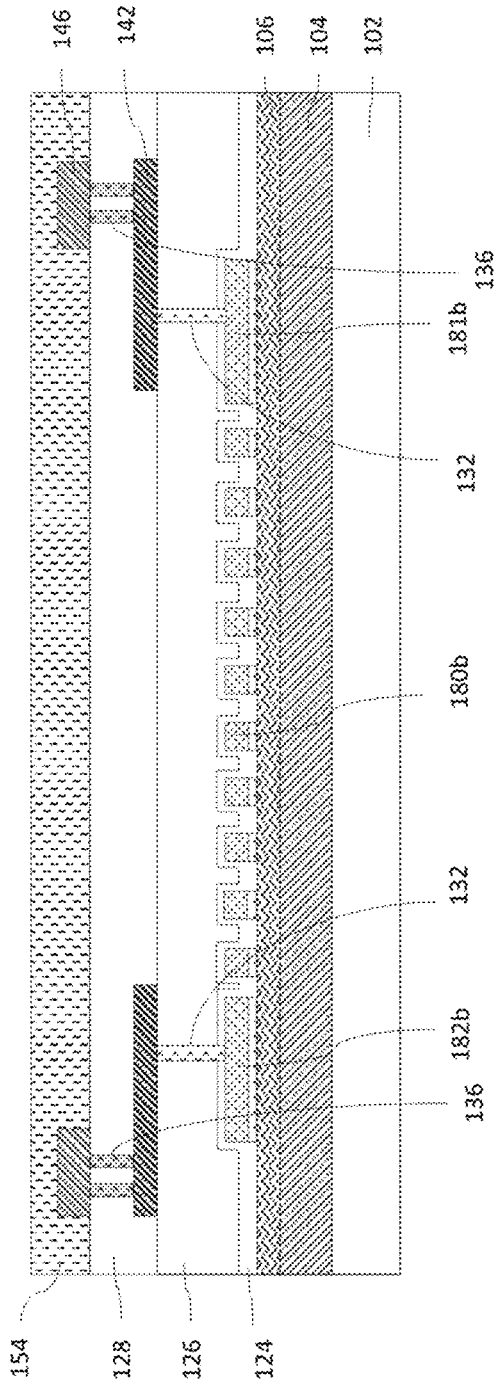

FIG. 23 and FIG. 24 illustrate structure of a bidirectional switching device 83b/84b according to another embodiment based on the circuit diagram of FIG. 19A/19B. FIG. 23 is a partial layout of the bidirectional switching device 83b/84b showing a relationship among some elements that can constitute parts of transistors and the resistor in the bidirectional switching device 83b/84b. The cross-section views taken along lines A-A', B-B' and C-C' in FIG. 23 are the same as those taken along lines A-A', B-B' and C-C' in FIG. 21, thus can be referred to FIGS. 22A-22C. The cross-section views taken along lines D-D' in FIG. 127 is illustrated in FIG. 128. For conciseness, identical structural elements in FIGS. 21, 22A-22D, and FIGS. 23, 128 are given the same reference numerals and symbols and will not be further described in details.

Referring to FIG. 127 and FIG. 128. The bidirectional switching device 83b/84b comprises resistive element 180b. The resistive element 180b comprises a first end 181b electrically connected to the first power/load pad to act as the first terminal of the resistor R1; and a second end 182b electrically connected to the substrate 102 to act as the second terminal of the resistor R1.

The bidirectional switching device 83b/84b is similar to the bidirectional switching device 83a/84a except for that the resistive element 180b is disposed on the second nitride-based semiconductor layer 106 and made of the same materials as the gate structures 110. The first end 181b may be electrically coupled to the first power/load pad through at least one first conductive via 132, at least one first conductive trace 142, at least one conductive via 136 and at least one conductive trace 146. The second end 182b may be electrically connected to the substrate 102 through at least one first conductive via 132, at least one first conductive trace 142, at least one second conductive via 136, at least one second conductive trace 146 and at least one TGV 162.

The manufacturing method for the bidirectional switching device 83b/84b may include stages illustrated in FIGS. 3A-3K except for that at the stage illustrated in FIG. 3C, the blanket semiconductor layer 111 and the blanket gate electrode layer 113 are patterned to form the gate structures 110 and the resistive elements 180b simultaneously.

Figure 25:
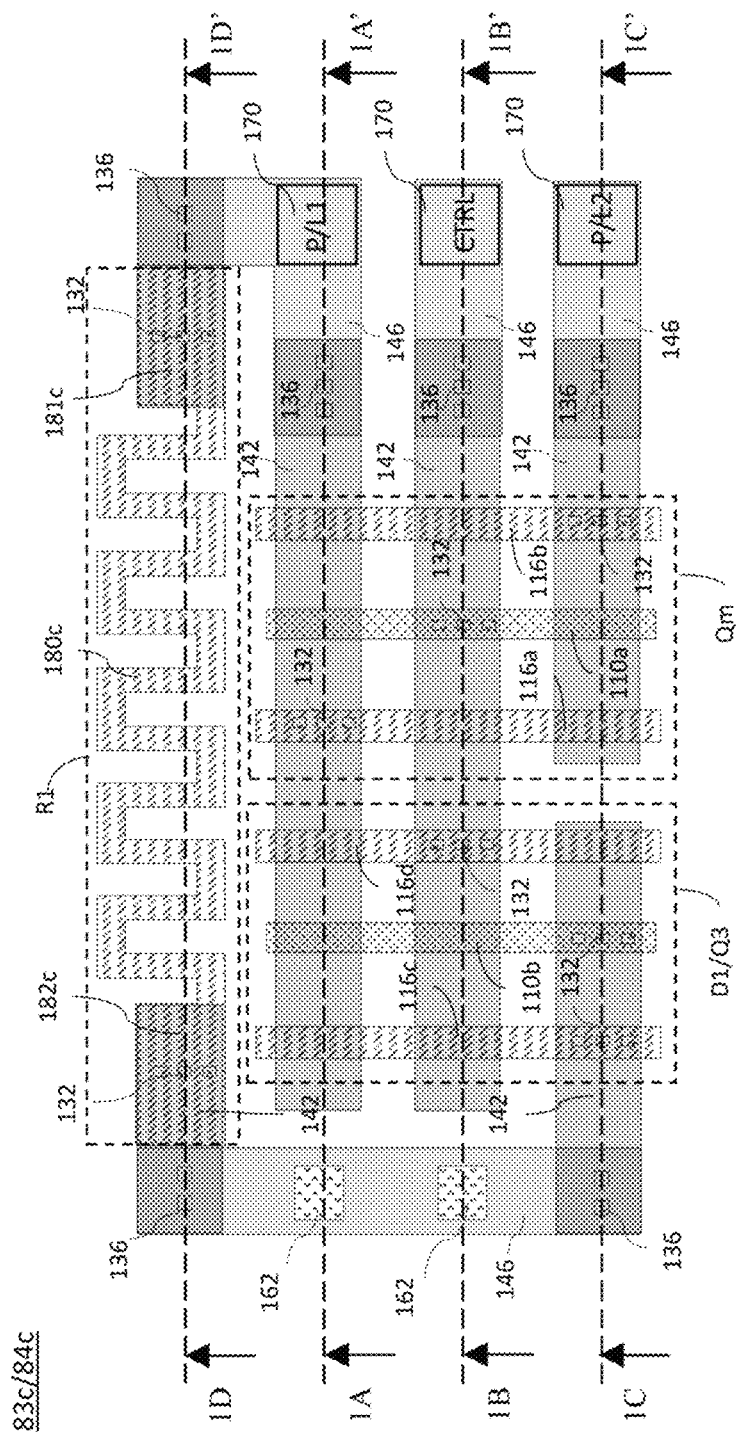
FIG. 25 and FIG. 26 illustrate structure of a bidirectional switching device according to another embodiment based on the circuit diagram of FIG. 80A/80B.
Figure 26:
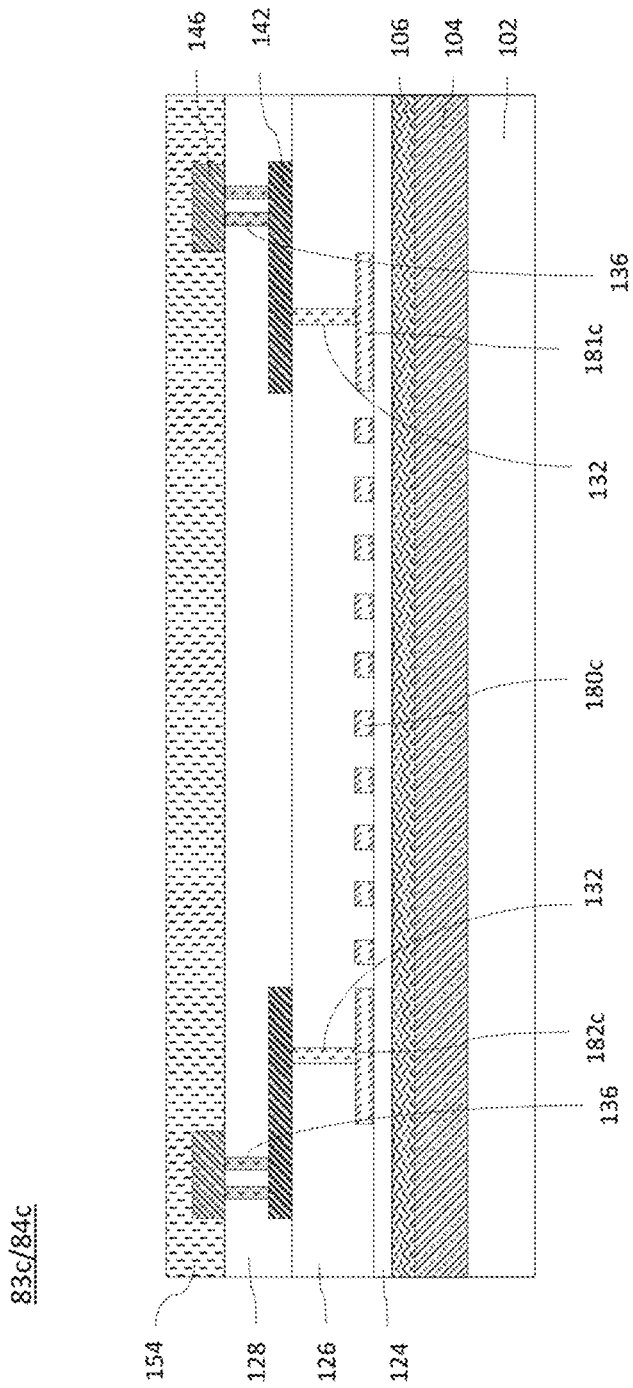

FIG. 25 and FIG. 26 illustrate structure of a bidirectional switching device 83c/84c according to another embodiment based on the circuit diagram of FIG. 19A/19B. FIG. 25 is a partial layout of the bidirectional switching device 83c/84c showing a relationship among some elements that can constitute parts of transistors and the resistor in the bidirectional switching device 83c/84c. The cross-section views taken along lines A-A', B-B' and C-C' in FIG. 25 are the same as those taken along lines A-A', B-B' and C-C' in FIG. 21, thus can be referred to FIGS. 22A-22C. The cross-section views taken along lines D-D' in FIG. 25 is illustrated in FIG. 26. For conciseness, identical structural elements in FIGS. 21, 22A-22D, and FIGS. 25, 130 are given the same reference numerals and symbols and will not be further described in details.

Referring to FIG. 25 and FIG. 26. The bidirectional switching device 83c/84c comprises resistive element 180c. The resistive element 180c comprises a first end 181c electrically connected to the first power/load pad to act as the first terminal of the resistor R1; and a second end 182c electrically connected to the substrate 102 to act as the second terminal of the resistor R1.

The bidirectional switching device 83c/84c is similar to the bidirectional switching device 83a/84a except for that the resistive element 180c may be disposed on the first passivation layer 124 and made of the same materials as the S/D electrodes 116. The first end 181c may be electrically coupled to the first power/load pad through at least one first conductive via 132, at least one first conductive trace 142, at least one conductive via 136 and at least one conductive trace 146. The second end 182c may be electrically connected to the substrate 102 through at least one first conductive via 132, at least one first conductive trace 142, at least one second conductive via 136, at least one second conductive trace 146 and at least one TGV 162.

The manufacturing method for the bidirectional switching device 83c/84c may include stages illustrated in FIGS. 3A-3K except for that at the stage illustrated in FIG. 3E, the blanket conductive layer 115 is patterned to form the S/D electrodes 116 and the resistive element 180c simultaneously.

Figure 27:
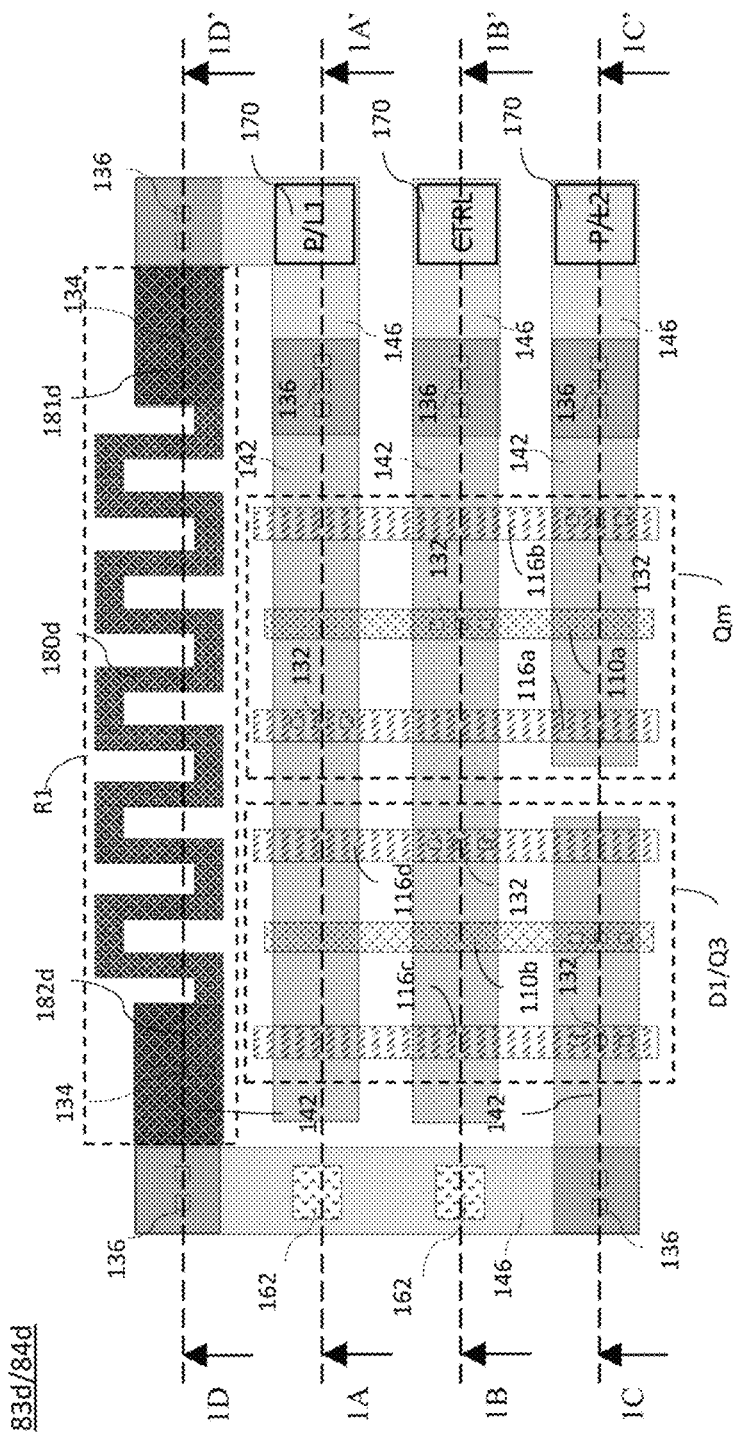
FIG. 27 and FIG. 28 illustrate structure of a bidirectional switching device according to another embodiment.
Figure 28:
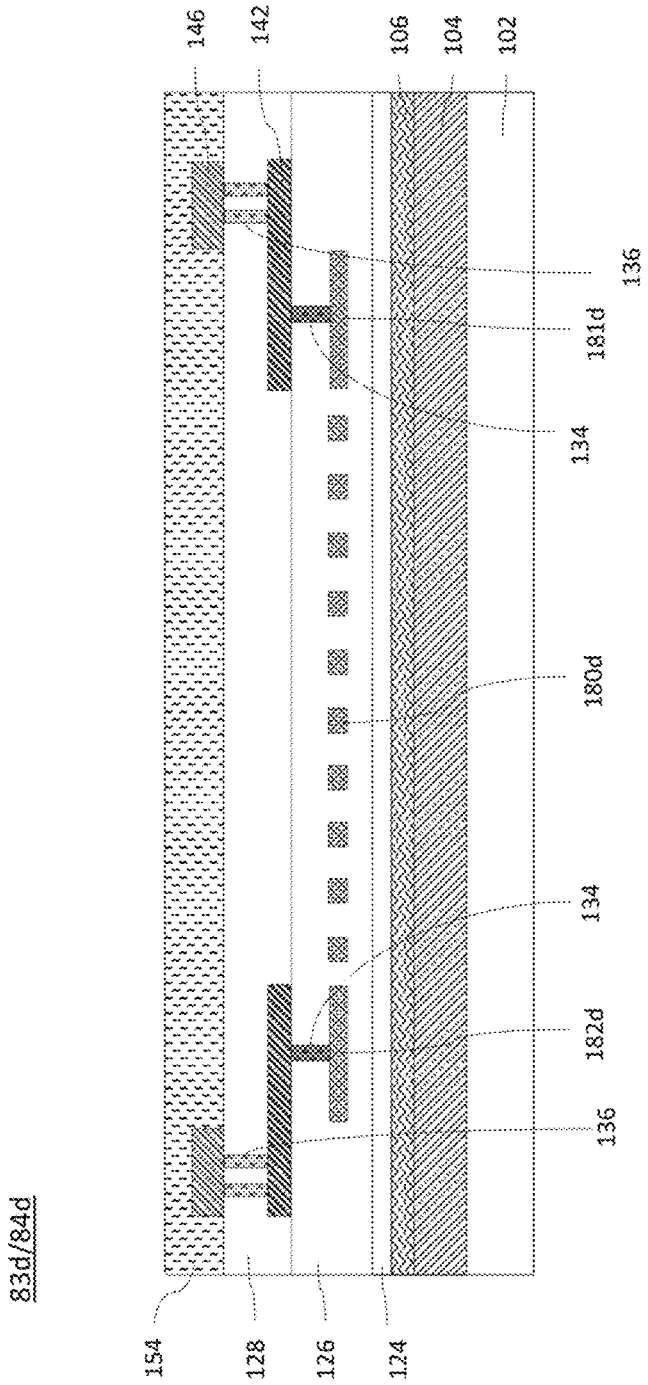

FIG. 27 and FIG. 28 illustrate structure of a bidirectional switching device 83d/84d according to another embodiment based on the circuit diagram of FIG. 19A/19B. FIG. 27 is a partial layout of the bidirectional switching device 83d/84d showing a relationship among some elements that can constitute parts of transistors and the resistor in the bidirectional switching device 83d/84d. The cross-section views taken along lines A-A', B-B' and C-C' in FIG. 131 are the same as those taken along lines A-A', B-B' and C-C' in FIG. 21, thus can be referred to FIGS. 22A-22C. The cross-section views taken along lines D-D' in FIG. 27 is illustrated in FIG. 28. For conciseness, identical structural elements in FIGS. 21, 22A-22D, and FIGS. 131, 132 are given the same reference numerals and symbols and will not be further described in details.

Referring to FIG. 27 and FIG. 28. The bidirectional switching device 83d/84d comprises resistive element 180d. The resistive element 180d comprises a first end 181d electrically connected to the first power/load pad to act as the first terminal of the resistor R1; and a second end 182d electrically connected to the substrate 102 to act as the second terminal of the resistor R1.

The bidirectional switching device 83d/84d is similar to the bidirectional switching device 83a/84a except for that the resistive element 180d is disposed within passivation layer 126. The passivation layer 126 is split into a lower layer 126a below the resistive element 180d and an upper layer 126b above the resistive element 180d. In other words, the resistive element 180d is sandwiched between the first layer 126a and the lower layer 126a and the upper layer 126b. The first end 181d may be electrically coupled to first power/load pad through at least one third conductive via 134, at least one first conductive trace 142, at least one conductive via 136 and at least one conductive trace 146. The second end 182d may be electrically connected to the substrate 102 through at least one third conductive via 134, at least one first conductive trace 142, at least one second conductive via 136, at least one second conductive trace 146 and at least one TGV 162.

The manufacturing method for the bidirectional switching device 83d/84d may include stages illustrated in FIGS. 3A-3K except for that a lower passivation layer 126a is deposited on the passivation layer 20; a blanket metal/metal compound layer 143 is deposited on the passivation layer 126a and patterned to form the resistive element 180d; an upper passivation layer 126b is deposited over the lower passivation layer 126a to cover the resistive element 180d; one or more third conductive vias 134 are formed in the upper passivation layer 126b to electrically couple the resistive element 180d.

Figure 29:
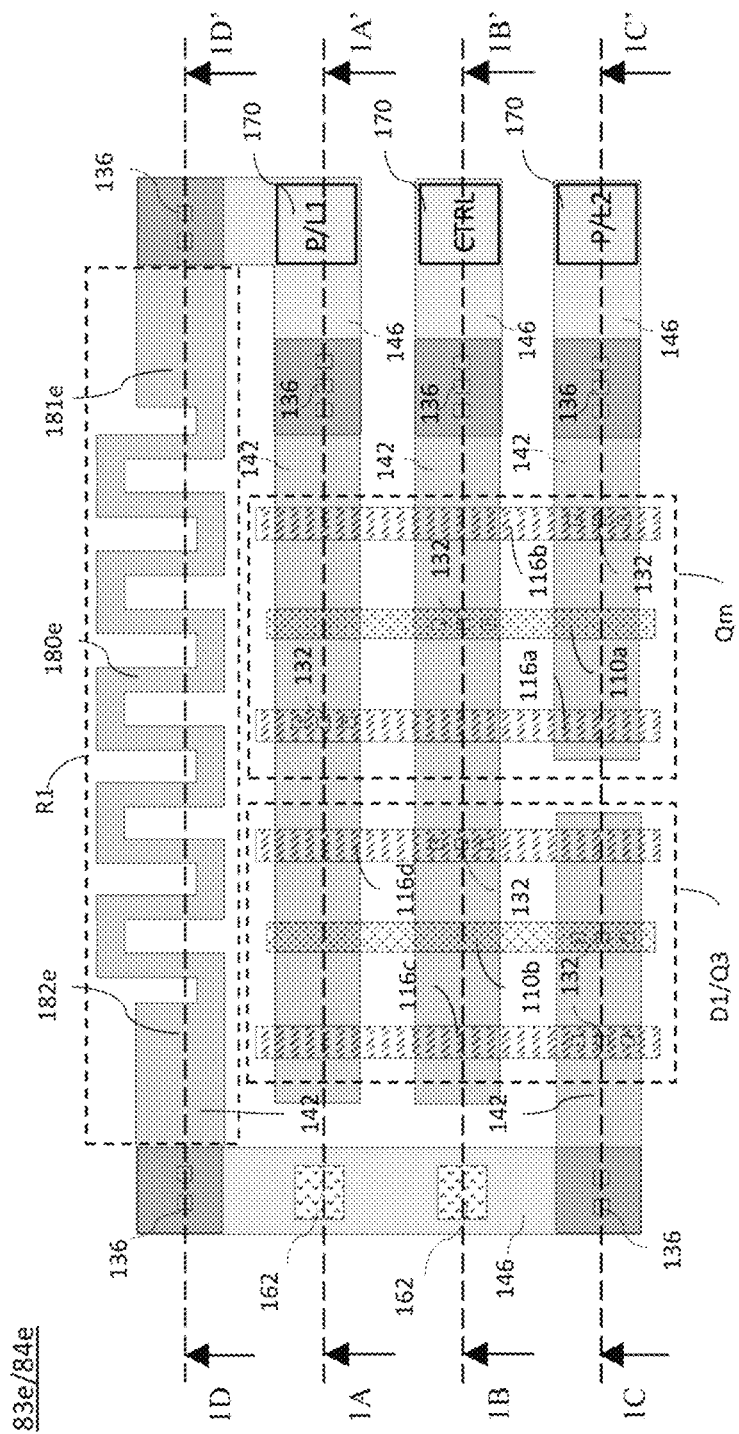
FIG. 29 and FIG. 30 illustrate structure of a bidirectional switching device according to another embodiment.
Figure 30:
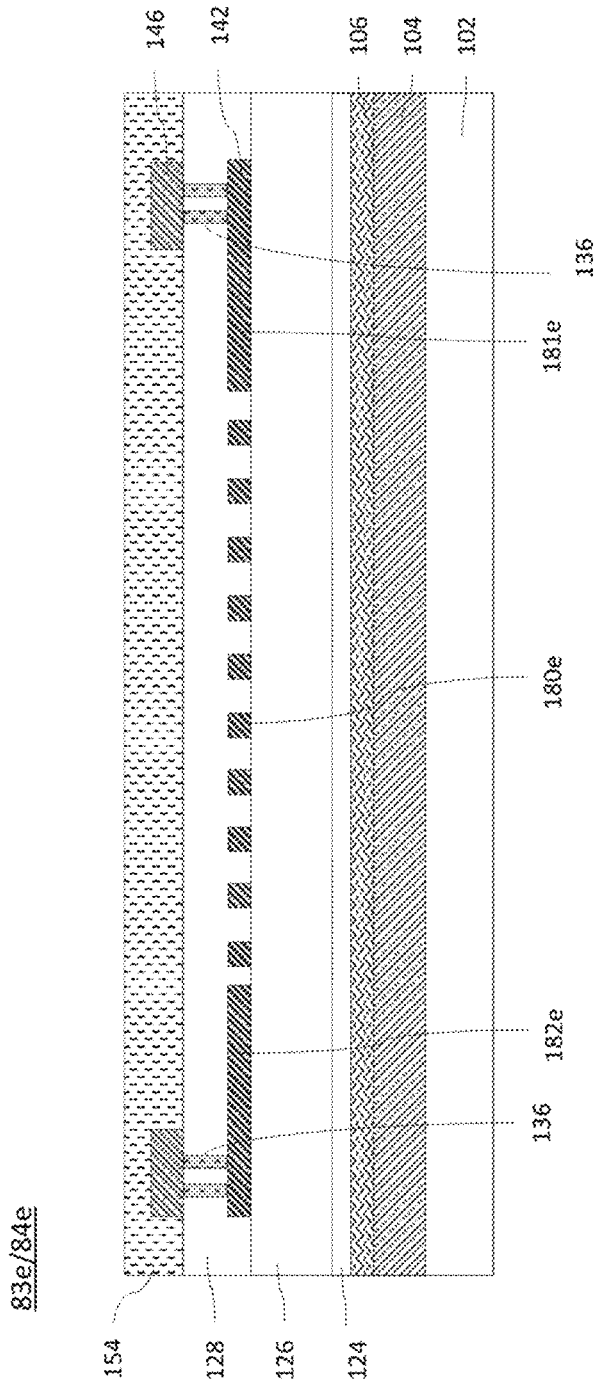

FIG. 29 and FIG. 30 illustrate structure of a bidirectional switching device 83e/84e according to another embodiment based on the circuit diagram of FIG. 19A/19B. FIG. 29 is a partial layout of the bidirectional switching device 83e/84e showing a relationship among some elements that can constitute parts of transistors and the resistor in the bidirectional switching device 83e/84e. The cross-section views taken along lines A-A', B-B' and C-C' in FIG. 29 are the same as those taken along lines A-A', B-B' and C-C' in FIG. 21, thus can be referred to FIGS. 22A-22C. The cross-section views taken along lines D-D' in FIG. 29 is illustrated in FIG. 30. For conciseness, identical structural elements in FIGS. 21, 22A-22D, and FIGS. 133, 134 are given the same reference numerals and symbols and will not be further described in details.

Referring to FIG. 129 and FIG. 30. The bidirectional switching device 83e/84e comprises resistive element 180e. The resistive element 180e comprises a first end 181e electrically connected to the first power/load pad to act as the first terminal of the resistor R1; and a second end 182e electrically connected to the substrate 102 to act as the second terminal of the resistor R1.

The bidirectional switching device 83e/84e is similar to the bidirectional switching device 83a/84a except for that the resistive element 180e is disposed on the second passivation layer 126 and made of the same materials as the conductive traces 142. The first end 181e may be electrically coupled to the first power/load pad through at least one second conductive via 136 and at least one second conductive trace 146. The second end 182e may be electrically connected to the substrate 102 through at least one second conductive via 136, at least one second conductive trace 146 and at least one TGV 162.

The manufacturing method for the bidirectional switching device 83e/84e may include stages illustrated in FIGS. 3A-3K except for that at the stage illustrated in FIG. 3G, the blanket conductive layer 141 is patterned to form the conductive traces 142 and the resistive element 180e simultaneously.

Figure 31:
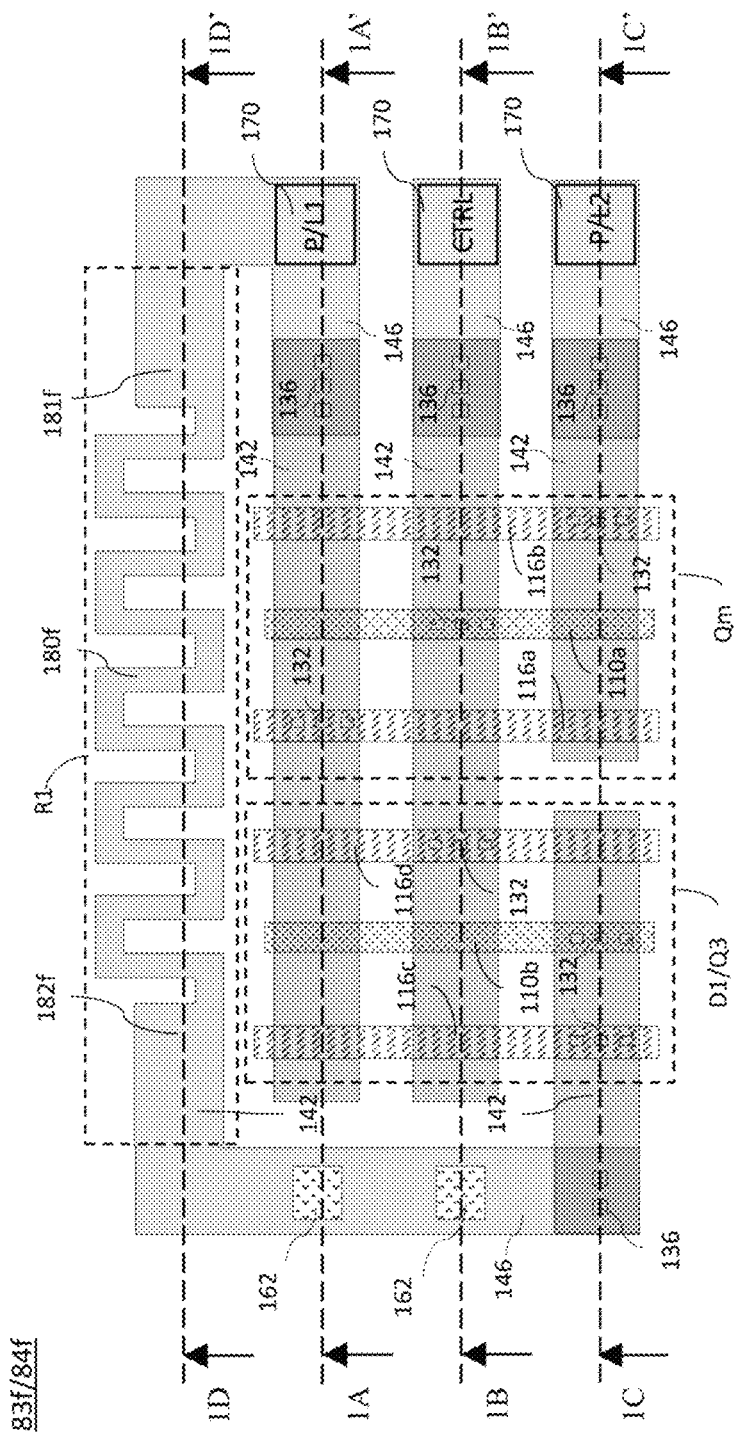
FIG. 31 and FIG. 32 illustrate structure of a bidirectional switching device according to another embodiment.
Figure 32:
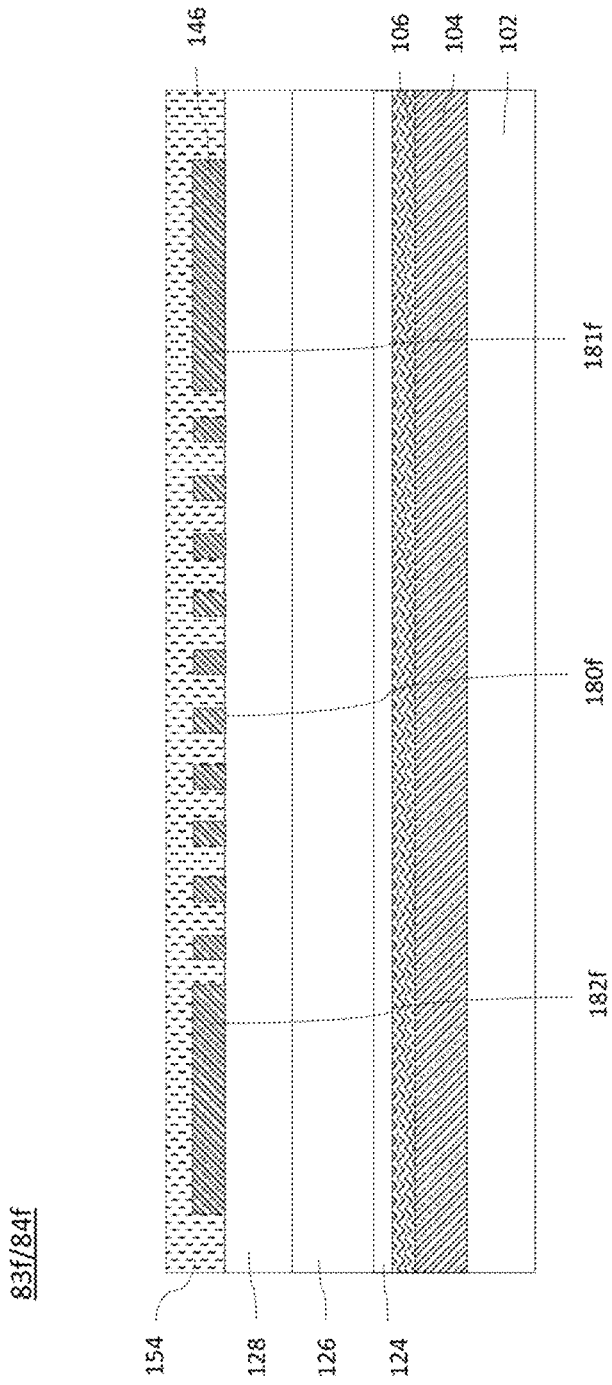

FIG. 31 and FIG. 32 illustrate structure of a bidirectional switching device 83f/84f according to another embodiment based on the circuit diagram of FIG. 19A/19B. FIG. 31 is a partial layout of the bidirectional switching device 83f/84f showing a relationship among some elements that can constitute parts of transistors and the resistor in the bidirectional switching device 83f/84f. The cross-section views taken along lines A-A', B-B' and C-C' in FIG. 31 are the same as those taken along lines A-A', B-B' and C-C' in FIG. 125, thus can be referred to FIGS. 22A-22C. The cross-section views taken along lines D-D' in FIG. 31 is illustrated in FIG. 32. For conciseness, identical structural elements in FIGS. 21, 22A-22D, and FIGS. 135, 136 are given the same reference numerals and symbols and will not be further described in details.

Referring to FIG. 31 and FIG. 32. The bidirectional switching device 83f/84f comprises resistive element 180e. The resistive element 180e comprises a first end 181e electrically connected to the first power/load pad to act as the first terminal of the resistor R1; and a second end 182e electrically connected to the substrate 102 to act as the second terminal of the resistor R1.

The bidirectional switching device 83f/84f is similar to the bidirectional switching device 83a/84a except for that the resistive element 180f may be disposed on the third passivation layer 128 and made of the same materials as the conductive traces 146. The first end 181f may be electrically coupled to the first power/load pad. The second end 182f may be electrically connected to the substrate 102 through at least one TGV 162.

The manufacturing method for the bidirectional switching device 83f/84f may include stages illustrated in FIGS. 3A-3K except for that at the stage illustrated in FIG. 3J, the blanket conductive layer 145 is patterned to form the conductive traces 146 and the resistive element 180f simultaneously.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the figures and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto.

While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based bidirectional switching device with substrate potential management capability, having a control node, a first power/load node, a second power/load node and a main substrate, and comprising:
   a nitride-based bilateral transistor having a first gate terminal connected to the control node, a first source/drain terminal connected to the first power/load node, a second source/drain terminal connected to the second power/load node; and a main substrate terminal connected to the main substrate; and
   a substrate potential management circuit configured for managing a potential of the main substrate, comprising:
      a first potential stabilizing element having a first conduction terminal electrically connected to the first power/load node and a second conduction terminal electrically connected to the main substrate; and
      a second potential stabilizing element having a first conduction terminal connected to the main substrate and a second conduction terminal connected to the control node; and
   wherein when a high-level voltage is applied to the control node, the first potential stabilizing element has a first resistance lower than a second resistance of the second potential stabilizing element such that a potential of the main substrate is substantially equal to a lower one of potentials of the first and second power/load nodes; and
   wherein when a low-level voltage is applied to the control node, the first resistance is higher than the second resistance such that the potential of the main substrate is substantially equal to the low-level voltage.

2. The nitride-based bidirectional switching device according to claim 1, wherein
   the first potential stabilizing element is a diode formed with a rectifying transistor having a gate terminal and a source terminal both connected to the main substrate and a drain terminal connected to the first power/load node; and
   the second potential stabilizing is a resistor having a first terminal connected to the main substrate and a second terminal connected to the control node.

3. The nitride-based bidirectional switching device according to claim 2, wherein the nitride-based bilateral transistor, the rectifying transistor and the resistor are integrated in an integrated circuit (IC) chip comprising:
   a substrate;
   a first nitride-based semiconductor layer disposed above the substrate;
   a second nitride-based semiconductor layer disposed on the first nitride-based semiconductor layer and having a bandgap greater than a bandgap of the first nitride-based semiconductor layer;
   one or more gate structures disposed above the second nitride-based semiconductor layer, each include a gate semiconductor layer and a gate electrode layer disposed on the gate semiconductor layer;

a first passivation layer disposed on the second nitride-based semiconductor layer and covering the gate metal layer;
one or more source/drain (S/D) electrodes disposed on the second nitride-based semiconductor layer and penetrating through the first passivation layer;
a second passivation layer disposed on the first passivation layer and covering the S/D electrodes;
one or more first conductive vias disposed within the second passivation layer;
a first conductive layer disposed on the second passivation layer and patterned to form one or more first conductive traces;
a third passivation layer disposed on the first conductive layer and covering the one or more conductive traces;
one or more second conductive vias disposed within the third passivation layer;
at least one through gallium via (TGV) extending longitudinally from the second conductive layer and penetrating into the substrate;
a second conductive layer disposed on the third passivation layer and patterned to form one or more second conductive traces; and
a protection layer disposed above the second conductive layer and having one or more openings to expose one or more conductive pads including: a control pad configured to act as the control node; a first power/load pad configured to act as the first power/load node; and a second power/load pad configured to act as the second power/load node;
a resistive element comprising a first end electrically connected to the substrate to act as the first terminal of the resistor and a second end electrically connected to the control pad to act as the second terminal of the resistor;
wherein the one or more S/D electrodes include:
at least one first S/D electrode electrically connected to the first power/load pad to act as the first source/drain terminal of the nitride-based bilateral transistor and the drain terminal of the rectifying transistor;
at least one second S/D electrode electrically connected to the second power/load pad to act as the second source/drain terminal of the nitride-based bilateral transistor;
at least one third S/D electrode electrically connected to the substrate to act as the source terminal of the rectifying transistor; and
wherein the one or more gate structures include:
at least one first gate structure electrically connected to the control pad to act as the main gate terminal of the nitride-based bilateral transistor; and
at least one second gate structure electrically connected to the substrate to act as the gate terminal of the rectifying transistor.

4. The nitride-based bidirectional switching device according to claim 3, wherein the resistive element is disposed at a heterojunction interface between the first nitride-based semiconductor layer and the second nitride-based semiconductor layer.

5. The nitride-based bidirectional switching device according to claim 3, wherein the resistive element is disposed on the second nitride-based semiconductor layer and made of the same materials as the gate structures.

6. The nitride-based bidirectional switching device according to claim 3, wherein the resistive element is disposed on the first passivation layer and made of the same materials as the S/D electrodes.

7. The nitride-based bidirectional switching device according to claim 3, further comprising a third conductive layer disposed within the second passivation layer and patterned to form the resistive element.

8. The nitride-based bidirectional switching device according to claim 3, wherein the resistive element is disposed on the second passivation layer and made of the same materials as the first conductive traces.

9. The nitride-based bidirectional switching device according to claim 3, wherein the resistive element is disposed on the third passivation layer and made of the same materials as the second conductive traces.

10. The nitride-based bidirectional switching device according to claim 1, wherein:
the first potential stabilizing element is a resistor having a first terminal connected to the first power/load node and a second terminal connected to the main substrate; and
the second potential stabilizing element is a diode formed with a rectifying transistor having a gate terminal and a source terminal both connected to the main substrate and a drain terminal connected to the control node.

11. The nitride-based bidirectional switching device according to claim 10, wherein the nitride-based bilateral transistor, the resistor and the rectifying transistor are integrated in an integrated circuit (IC) chip comprising:
a substrate;
a first nitride-based semiconductor layer disposed above the substrate;
a second nitride-based semiconductor layer disposed on the first nitride-based semiconductor layer and having a bandgap greater than a bandgap of the first nitride-based semiconductor layer;
one or more gate structures disposed above the second nitride-based semiconductor layer, each include a gate semiconductor layer and a gate electrode layer disposed on the gate semiconductor layer;
a first passivation layer disposed on the second nitride-based semiconductor layer and covering the gate metal layer;
one or more source/drain (S/D) electrodes disposed on the second nitride-based semiconductor layer and penetrating through the first passivation layer;
a second passivation layer disposed on the first passivation layer and covering the S/D electrodes;
one or more first conductive vias disposed within the second passivation layer;
a first conductive layer disposed on the second passivation layer and patterned to form one or more first conductive traces;
a third passivation layer disposed on the first conductive layer and covering the one or more conductive traces;
one or more second conductive vias disposed within the third passivation layer;
at least one through gallium via (TGV) extending longitudinally from the second conductive layer and penetrating into the substrate;
a second conductive layer disposed on the third passivation layer and patterned to form one or more second conductive traces; and
a protection layer disposed above the second conductive layer and having one or more openings to expose one or more conductive pads including: a control pad configured to act as the control node; a first power/load pad configured to act as the first power/load node; and a second power/load pad configured to act as the second power/load node;

a resistive element comprising a first end electrically connected to the first power/load pad to act as the first terminal of the resistor and a second end electrically connected to the substrate to act as the second terminal of the resistor;

wherein the one or more S/D electrodes include:
at least one first S/D electrode electrically connected to the first power/load pad to act as the first source/drain terminal of the nitride-based bilateral transistor;
at least one second S/D electrode electrically connected to the second power/load pad to act as the second source/drain terminal of the nitride-based bilateral transistor;
at least one third S/D electrode electrically connected to the substrate to act as the source terminal of the rectifying transistor; and
at least one fourth S/D electrode electrically connected to the control pad to act as the drain terminal of the rectifying transistor; and wherein the one or more gate structures include:
at least one first gate structure electrically connected to the control pad to act as the main gate terminal of the nitride-based bilateral transistor; and
at least one second gate structure electrically connected to the substrate to act as the gate terminal of the rectifying transistor.

12. The nitride-based bidirectional switching device according to claim 11, wherein the resistive element is disposed at a heterojunction interface between the first nitride-based semiconductor layer and the second nitride-based semiconductor layer.

13. The nitride-based bidirectional switching device according to claim 11, wherein the resistive element is disposed on the second nitride-based semiconductor layer and made of the same materials as the gate structures.

14. The nitride-based bidirectional switching device according to claim 11, wherein the resistive element is disposed on the first passivation layer and made of the same materials as the S/D electrodes.

15. The nitride-based bidirectional switching device according to claim 11, further comprising a third conductive layer disposed within the second passivation layer and patterned to form the resistive element.

16. The nitride-based bidirectional switching device according to claim 11, wherein the resistive element is disposed on the second passivation layer and made of the same materials as the first conductive traces.

17. The nitride-based bidirectional switching device according to claim 11, wherein the resistive element is disposed on the third passivation layer and made of the same materials as the second conductive traces.

18. A method for manufacturing a nitride-based switching device, comprising:
forming a first nitride-based semiconductor layer over a substrate;
forming a second nitride-based semiconductor layer on the first nitride-based semiconductor layer;
disposing a gate semiconductor layer on the second nitride-based semiconductor layer and a gate electrode layer on the gate semiconductor layer, and patterning the gate semiconductor layer and the gate electrode layer to form one or more gate structures;
forming a first passivation layer on the second nitride-based semiconductor layer to cover the gate structures;
forming one or more openings in the first passivation layer to expose some regions of the second nitride-based semiconductor layer, disposing a S/D electrode layer to cover the first passivation layer and exposed regions of the second nitride-based semiconductor layer, and patterning the S/D electrode layer to form one or more S/D electrodes penetrating through the first passivation layer and in contact with the second nitride-based semiconductor layer;
forming a second passivation layer on the first passivation layer to cover the S/D electrodes;
forming one or more first conductive vias within the second passivation layer;
forming a first conductive layer on the second passivation layer and patterning the first conductive layer to form one or more first patterned conductive traces;
forming a third passivation layer on the first conductive layer to cover the one or more conductive traces;
forming one or more second conductive vias within the third passivation layer;
forming at least one through gallium vias (TGV) that extends longitudinally from the second conductive layer and penetrates into the substrate;
forming a second conductive layer on the third passivation layer and patterning the second conductive layer to form one or more second patterned conductive traces;
forming a protection layer above the second conductive layer and patterning the protection layer to form one or more openings to expose one or more conductive pads including a control pad, a first power/load pad and a second power/load pad;
forming one or more resistive elements by: patterning a heterojunction interface between the first nitride-based semiconductor layer; patterning the S/D electrode layer; patterning the gate electrode layer; patterning the first conductive layer; patterning the second conductive layer; or patterning a third conductive layer formed within the first passivation layer.

19. The method according to claim 18, further comprising constructing a nitride-based bilateral transistor, a rectifying transistor and a resistor by:
electrically connecting at least one first S/D electrode to the first power/load pad to form a first S/D terminal of the nitride-based bilateral transistor and a drain terminal of the rectifying transistor;
electrically connecting at least one second S/D electrode to the second power/load pad to form a second S/D terminal of the nitride-based bilateral transistor;
electrically connecting at least one third S/D electrode to the substrate to form a source terminal of the rectifying transistor;
electrically connecting at least one first gate structure to the control pad to form a main gate terminal of the nitride-based bilateral transistor;
electrically connecting at least one second gate structure to the substrate to form a gate terminal of the rectifying transistor;
electrically connecting a first end of a resistive element to the substrate to form a first terminal of the resistor; and
electrically connecting a second end of the resistive element to the control pad to form a second terminal of the resistor.

20. The method according to claim 18, further comprising constructing a nitride-based bilateral transistor, a rectifying transistor, a resistor by:
electrically connecting at least one first S/D electrode to the first power/load pad to form a first S/D terminal of the nitride-based bilateral transistor;

electrically connecting at least one second S/D electrode to the second power/load pad to form a second S/D terminal of the nitride-based bilateral transistor;

electrically connecting at least one third S/D electrode to the substrate to form a source terminal of the rectifying transistor;

electrically connecting at least one fourth S/D electrode to the control pad to form a drain terminal of the rectifying transistor;

electrically connecting at least one first gate structure to the control pad to form a main gate terminal of the nitride-based bilateral transistor;

electrically connecting at least one second gate structure to the substrate to form a gate terminal of the first rectifying transistor;

electrically connecting a first end of the resistive element to the first power/load pad to form a first terminal of the resistor; and electrically connecting a second end of the resistive element to the substrate to form a second terminal of the resistor.

\* \* \* \* \*